(12) United States Patent
Nishihara

(10) Patent No.: US 6,888,735 B2
(45) Date of Patent: May 3, 2005

(54) FERROELECTRIC-TYPE NONVOLATILE SEMICONDUCTOR MEMORY

(75) Inventor: Toshiyuki Nishihara, Kanagawa (JP)

(73) Assignee: Sony Corporation, Tokyo (JP)

( * ) Notice: Subject to any disclaimer, the term of this patent is extended or adjusted under 35 U.S.C. 154(b) by 144 days.

(21) Appl. No.: 10/217,374

(22) Filed: Aug. 13, 2002

(65) Prior Publication Data

US 2003/0058683 A1 Mar. 27, 2003

(30) Foreign Application Priority Data

Aug. 16, 2001 (JP) .................................... 2001-247255

(51) Int. Cl.$^7$ ................................................ G11C 7/00
(52) U.S. Cl. ..................... 365/145; 365/65; 365/117; 365/210; 365/63
(58) Field of Search ........................... 365/145, 65, 117, 365/63, 210

(56) References Cited

U.S. PATENT DOCUMENTS

| | | | | |
|---|---|---|---|---|
| 5,619,066 A | * | 4/1997 | Curry et al. ................. 257/679 |
| 5,973,960 A | * | 10/1999 | Shibata et al. ......... 365/185.08 |
| 6,185,472 B1 | * | 2/2001 | Onga et al. .................. 700/121 |
| 6,217,213 B1 | * | 4/2001 | Curry et al. ................. 374/178 |
| 6,303,478 B1 | * | 10/2001 | Nakamura et al. .......... 438/570 |
| 6,335,876 B1 | * | 1/2002 | Shuto ......................... 365/145 |
| 6,754,095 B2 | * | 6/2004 | Tanaka et al. .............. 365/145 |
| 6,787,825 B1 | * | 9/2004 | Gudesen et al. ............. 257/278 |
| 2001/0029070 A1 | * | 10/2001 | Yamazaki et al. .......... 438/149 |
| 2002/0022277 A1 | * | 2/2002 | Park et al. ...................... 438/3 |
| 2003/0058683 A1 | * | 3/2003 | Nishihara ................... 365/145 |
| 2004/0170045 A1 | * | 9/2004 | Nishihara ..................... 365/65 |

* cited by examiner

Primary Examiner—Viet Q. Nguyen
(74) Attorney, Agent, or Firm—Robert J. Depke; Holland & Knight LLP

(57) ABSTRACT

A ferroelectric-type nonvolatile semiconductor memory comprising a plurality of bit lines and a plurality of memory cells, a plurality of the memory cells belonging to one of two or more thermal history groups having different thermal histories with regard to their production processes, and a reference potential of the same level is provided to the bit lines connected to the memory cells belonging to the same thermal history group, and reference potentials of different levels are provided to the bit lines connected to the memory cells belonging to the different thermal history groups.

5 Claims, 28 Drawing Sheets

FERROELECTRIC-TYPE NONVOLATILE SEMICONDUCTOR MEMORY

This application claims priority to Japanese Patent Application Number JP2001-247255 filed Aug. 16, 2001 which is incorporated herein by reference.

BACKGROUND OF THE INVENTION AND RELATED ART STATEMENT

The present invention relates to a ferroelectric-type nonvolatile semiconductor memory (so-called FERAM).

In recent years, studies are actively made with regard to a mass-storage ferroelectric-type nonvolatile semiconductor memory. A ferroelectric-type nonvolatile semiconductor memory (to be sometimes abbreviated as "nonvolatile memory" hereinafter) permits fast access and is nonvolatile, and it is small in size and consumes low-level electric power. Further, the nonvolatile memory has high impact-resistant, and it is expected to be used as a main memory in various electronic devices having file storage and resume functions, such as a portable computer, a cellular phone and a game machine, or to be used as a recording medium for recording voices and video images.

The above nonvolatile memory is a fast rewritable nonvolatile memory according to a method in which fast polarization inversion of a ferroelectric thin film and residual polarization thereof are used, and a change in an accumulated charge amount in a memory cell (capacitor member) having a ferroelectric layer is detected. In principle, it comprises the memory cell (capacitor member) and a transistor for selection (transistor for switching). The memory cell (capacitor member) comprises, for example, a lower electrode, an upper electrode and a ferroelectric layer interposed between them. Reading-out and writing of data in the above nonvolatile memory is carried out by application of a P-E hysteresis loop of a ferroelectric material shown in FIG. 26. That is, when an external electric field is applied to the ferroelectric layer and then removed, the ferroelectric layer exhibits residual polarization. The residual polarization of the ferroelectric layer comes to be $+P_r$ when an external electric field in the plus direction is applied, and it comes to be $-P_r$ when an external electric field in the minus direction is applied. In this case, a case where the residual polarization is in a $+P_r$ state (see "D" in FIG. 26) is taken as "0", and a case where the residual polarization is in a $-P_r$ state (see "A" in FIG. 26) is taken as "1".

For discriminating states of "1" and "0", an external electric field, for example, in the plus direction is applied to the ferroelectric layer, whereby the polarization of the ferroelectric layer comes to be in a "C" state in FIG. 26. When the data is "0", the polarization state of the ferroelectric layer changes from "D" to "C". When the data is "1", the polarization state of the ferroelectric layer changes from "A" to "C" through "B". When the data is "0", no polarization inversion takes place in the ferroelectric layer. When the data is "1", polarization inversion takes place in the ferroelectric layer. As a result, there is caused a difference in the accumulated charge amount in the memory cell. The transistor for selection in a selected nonvolatile memory is turned on, whereby the accumulated charge is detected as a signal current. When the external electric field is changed to 0 after the data is read out, the polarization state of the ferroelectric layer comes into a "D" state in FIG. 26 both when the data is "0" and when the data is "1". That is, when the data is read out, the data "1" is once destroyed. When the data is "1", therefore, an external electric field in the minus direction is applied, so that the polarization state is brought into "A" state through "D" and "E" to re-write data "1".

The structure and the operation of a currently mainstream nonvolatile memory are proposed by S. Sheffiled et al in U.S. Pat. No. 4,873,664. This nonvolatile memory comprises, for example, transistors for selection $TR_{11}$ and $TR_{12}$ and memory cells (capacitor member) $FC_{11}$ and $FC_{12}$ as FIG. 27 shows its circuit diagram. In FIG. 27, each nonvolatile memory is surrounded by a dotted line.

Concerning two-digit or three-digit subscripts, for example, a subscript "11" is a subscript that should be shown as "1,1", and for example, a subscript "111" is a subscript that should be shown as "1,1,1". For simplified showing, the subscripts are shown as two-digit or three-digit subscripts. Further, a subscript "M" is used to show, for example, all of a plurality of memory cells or plate lines, and a subscript "m" is used to show, for example, individuals of a plurality of memory cells or plate lines. A subscript "N" is used to show, for example, all of transistors for selection or sub-memory units, and a subscript "n" is used to show, for example, individuals of the transistors for selection or sub-memory units.

Complement data is written into each memory cell, and the memory cells store 1 bit. In FIG. 27, symbol "WL" stands for a word line, symbol "BL" stands for a bit line, and symbol "PL" stands for a plate line. When one nonvolatile memory is taken, a word line $WL_1$ is connected to a word line decoder/driver WD. Bit lines $BL_1$ and $BL_2$ are connected to a differential sense amplifier SA. A plate line $PL_1$ is connected to a plate line decoder/driver PD.

When stored data is read out from the thus-structured nonvolatile memory, the word line $WL_1$ is selected and the plate line $PL_1$ is driven. In this case, complement data appears in a pair of the bit lines $BL_1$ and $BL_2$ as voltages (bit line voltages) from a pair of the memory cells $FC_{11}$ and $FC_{12}$ through the transistors for selection $TR_{11}$ and $TR_{12}$. The voltages (bit line voltages) in a pair of the bit lines $BL_1$ and $BL_2$ are detected with the sense amplifier SA.

One nonvolatile memory occupies a region surrounded by the word line $WL_1$ and a pair of the bit lines $BL_1$ and $BL_2$. If word lines and bit lines are arranged at a smallest pitch, therefore, the smallest area that one nonvolatile memory can have is $8F^2$ when the minimum processable dimension is F. The thus-structured nonvolatile memory therefore has the smallest area of $8F^2$. However, two transistors for selection and two memory cells are required for constituting one nonvolatile memory. Further, it is required to arrange the plate lines at the same pitch as that at which the word lines are arranged. It is therefore almost impossible to arrange the nonvolatile memories at the minimum pitch, and in reality, the area that one nonvolatile memory occupies comes to be much greater than $8F^2$.

Moreover, it is also required to arrange the word line decoder/drivers WD and the plate line decoder/drivers PD at a pitch equal to a pitch at which the nonvolatile memories are arranged. In other words, two decoder/drivers are required for selecting one row-address. It is therefore difficult to layout peripheral circuits, and the area that the peripheral circuits occupy comes to be large.

One of means for decreasing the area of the nonvolatile memory is disclosed in JP-A-9-121032. As shown in an equivalent circuit of FIG. 28, the nonvolatile memory disclosed in the above laid-open Patent Publication comprises a plurality of memory cells $MC_{1M}$ (for example, M=4) and a plurality of memory cells $MC_{2M}$. The memory cells $MC_{1M}$ and the memory cells $MC_{2M}$ form pairs. Ends of the memory cells $MC_{1M}$ are connected to one end of the transistor for selection $TR_1$ in parallel, and ends of the memory cells $MC_{2M}$ are connected to one end of the transistor for selection $TR_2$ in parallel. The other ends of the transistors for selection $TR_1$ and $TR_2$ are connected to bit lines $BL_1$ and $BL_2$, respectively. The bit lines $BL_1$ and $BL_2$ forming a pair are connected to a differential sense amplifier SA. The other ends of the memory cells $MC_{1m}$ and $MC_{2m}$ (m=1, 2 . . . M) are connected to a plate line $PL_m$, and the plate line $PL_m$ is connected to a plate line decoder/driver PD. A word line WL is connected to a word line decoder/driver WD.

Complement data is stored in a pair of the memory cells $MC_{1m}$ and $MC_{2m}$ (m=1, 2 . . . M). For reading-out of data stored, for example, in the memory cells $MC_{1m}$ and $MC_{2m}$ (wherein m is one of 1, 2, 3 and 4), the word line WL is selected, and in a state where a voltage of $(1/2) V_{cc}$ is applied to the plate line $PL_j$ (m≠j), the plate line $PL_m$ is driven. The above $V_{cc}$ is, for example, a power source voltage. By the above operation, the complement data appears in a pair of the bit lines $BL_1$ and $BL_2$ as voltages (bit line voltages) from a pair of the memory cells $MC_{1m}$ and $MC_{2m}$ through the transistors for selection $TR_1$ and $TR_2$. And, the differential sense amplifier SA detects the voltages (bit line voltages) in a pair of the bit lines $BL_1$ and $BL_2$.

A pair of the transistors for selection $TR_1$ and $TR_2$ in the nonvolatile memory occupy a region surrounded by the word lines WL and a pair of the bit lines $BL_1$ and $BL_2$. If the word lines and the bit lines are arranged at the smallest pitch, therefore, a pair of the transistors for selection $TR_1$ and $TR_2$ in the nonvolatile memory have a minimum area of $8F^2$. Since, however, a pair of the transistors for selection $TR_1$ and $TR_2$ are shared by M sets of pairs of the memory cells $MC_{1m}$ and $MC_{2m}$ (m=1, 2 . . . M), the number of the transistors for selection $TR_1$ and $TR_2$ per bit can be decreased, and the layout of the word lines WL is moderate, so that the nonvolatile memory can be easily decreased in size. Further, with regard to peripheral circuits, M bits can be selected with one word line decoder/driver WD and the plate line decoder/drivers PD that are M in number. When the above constitution is employed, therefore, a layout in which the cell area is close to $8F^2$ can be attained, and a chip size almost equal to a DRAM can be attained.

For increasing the capacity of the nonvolatile memory, it is essential to make finer memory cells, and it is also inevitably required to decrease the area of the ferroelectric layer. However, with a decrease in the area of the ferroelectric layer, naturally, the amount of an accumulated charge decreases.

As measures to take to solve the problem that the amount of an accumulated charge decreases, it is conceivable to stack the memory cells $FC_{11}$ and $FC_{12}$ or the memory cells $MC_{1M}$ and $MC_{2M}$ through an insulating layer in the nonvolatile memory shown in FIG. 27 or 28.

When the memory cells are stacked through the insulating layer as described above, the thermal history of the ferroelectric layer constituting the memory cell $FC_{11}$ or the memory cell $MC_{1M}$ comes to differ from the thermal history of the ferroelectric layer constituting the memory cell $FC_{12}$ or the memory cell $MC_{2M}$. That is, for forming the ferroelectric layer, it is required to heat-treat a ferroelectric thin film for crystallization thereof after the formation of the ferroelectric thin film. Therefore, a ferroelectric layer constituting a memory cell positioned in a lower layer (stage) is crystallized to a greater extent than a ferroelectric layer constituting a memory cell positioned in an upper layer (stage), which causes a difference in polarization properties between the memory cell positioned in a lower layer and the memory cell positioned in an upper layer. Even if the memory cell positioned in a lower layer and the memory cell positioned in an upper layer store the same data, therefore, there is caused a difference between potentials that appear in the bit lines. The above phenomenon causes an operation margin to decrease, and in a worst case, an error is made in reading-out of data, and the nonvolatile memory is degraded in reliability.

OBJECT AND SUMMARY OF THE INVENTION

It is therefore an object of the present invention to provide a ferroelectric-type nonvolatile semiconductor memory having a constitution in which a difference between potentials that appear in bit lines is suppressed even if memory cell groups having different thermal histories with regard to their production processes are included.

In the ferroelectric-type nonvolatile semiconductor memory according to any one of first to fourth aspects of the present invention to be explained hereinafter, data of 1 bit is stored in one memory cell. In the ferroelectric-type nonvolatile semiconductor memory according to any one of fifth to seventh aspects of the present invention to be explained hereinafter, data (complement data) of 1 bit is stored in a pair of memory cells.

That is, the ferroelectric-type nonvolatile semiconductor memory according to the first aspect of the present invention for achieving the above object comprises a plurality of bit lines and a plurality of memory cells, each memory cell comprising a first electrode, a ferroelectric layer formed at least on said first electrode and a second electrode formed on said ferroelectric layer,
  a plurality of the memory cells belonging to one of two or more thermal history groups having different thermal histories with regard to their production processes,
  data of 1 bit being to be stored in one of memory cells forming a pair, another data of 1 bit being to be stored in the other of said memory cells, a pair of said memory cells being connected to a pair of the bit lines,
  a pair of the bit lines being connected to a differential sense amplifier,
  wherein, when data stored in one of said memory cells forming a pair is read out, a reference potential is provided to the bit line connected to the other of said memory cells,
  when another data stored in the other of said memory cells is read out, a reference potential is provided to the bit line connected to the one of said memory cells, and
  a reference potential of the same level is provided to the bit lines connected to the memory cells belonging to the same thermal history group, and reference potentials of different levels are provided to the bit lines connected to the memory cells belonging to the different thermal history groups.

The ferroelectric-type nonvolatile semiconductor memory according to the first aspect of the present invention may have a constitution in which the memory cells have a structure in which the memory cells are stacked through an insulating layer,
  the memory cells formed on one insulating layer belong to the thermal history group different from the thermal history group to which the memory cells formed on other insulating layer belong, and
  the memory cells formed on the same insulating layer belong to the same thermal history group.

The ferroelectric-type nonvolatile semiconductor memory according to the first aspect of the present invention may have a constitution in which reference capacitors are further provided as many as the thermal history groups and output potentials of the reference capacitors differ one from another.

The ferroelectric-type nonvolatile semiconductor memory according to the second aspect of the present invention for achieving the above object comprises a first memory unit and a second memory unit;

said first memory unit having;
(A-1) a first bit line,
(B-1) a first transistor for selection,
(C-1) first sub-memory units which are N in number ($N \geq 2$) and each of which is composed of memory cells which are M in number ($M \geq 2$), and
(D-1) plate lines which are M×N in number, and said second memory unit having;
(A-2) a second bit line,
(B-2) a second transistor for selection,
(C-2) second sub-memory units which are N in number and each of which is composed of memory cells which are M in number, and
(D-2) the plate lines which are M×N in number and are shared with the plate limes which are M×N in number and constitute said first memory unit, wherein the first sub-memory unit of an n-th layer (n=1, 2 . . . , N) and the second sub-memory unit of the n-th layer are formed on the same insulating layer, the first sub-memory unit of an n'-th layer (n'=2 . . . N) and the second sub-memory unit of the n'-th layer are stacked on the first sub-memory unit of the (n'−1)-th layer and the second sub-memory unit of the (n'−1)-th layer through the insulating layer, each memory cell comprises a first electrode, a ferroelectric layer and a second electrode, in the first memory unit, the first electrodes of the memory cells constituting the first sub-memory unit of the n-th layer are in common with the first sub-memory unit of the n-th layer, said common first electrode is connected to the first bit line through the first transistor for selection, and the second electrode of the memory cell in an m-th-place (m=1, 2 . . . M) is connected to the common plate line in the [(n−1)M+m]-th-place, in the second memory unit, the first electrodes of the memory cells constituting the second sub-memory unit of the n-th layer are in common with the second sub-memory unit of the n-th layer, said common first electrode is connected to the second bit line through the second transistor for selection, and the second electrode of the memory cell in the m-th-place is connected to the common plate line in the [(n−1)M+m]-th-place, the memory cells constituting the first sub-memory unit of the n-th layer and the memory cells constituting the second sub-memory unit of the n-th layer have the same thermal history with regard to their production processes, the memory cells constituting the first sub-memory unit of the n-th layer and the memory cells constituting the second sub-memory unit of the n-th layer have the thermal history different from the thermal history of the memory cells constituting the first sub-memory unit of a k-th layer (k≠n) and the memory cells constituting the second sub-memory unit of the k-th layer, the memory cell in the m-th-place constituting the first sub-memory unit of the n-th layer in the first memory unit and the memory cell in the m-th-place constituting the second sub-memory unit of the n-th layer in the second memory unit form a pair to store data of 1 bit each, a reference potential having an n-th potential is provided to the second bit line when data stored in the memory cell constituting the first sub-memory unit of the n-th layer in the first memory unit is read out, a reference potential having an n-th potential is provided to the first bit line when data stored in the memory cell constituting the second sub-memory unit of the n-th layer in the second memory unit is read out, and the n-th potential differs from the k-th potential (k≠n).

The ferroelectric-type nonvolatile semiconductor memory according to the third aspect of the present invention for achieving the above object comprises a first memory unit and a second memory unit;

said first memory unit having;
(A-1) a first bit line,
(B-1) first transistors for selection which are N in number ($N \geq 2$),
(C-1) first sub-memory units which are N in number and each of which is composed of memory cells which are M in number ($M \geq 2$), and
(D-1) plate lines which are M in number and each of which is shared with each memory cell constituting each of the first sub-memory units which are N in number, between or among the first sub-memory units which are N in number, and said second memory unit having;
(A-2) a second bit line,
(B-2) second transistors for selection which are N in number,
(C-2) second sub-memory units which are N in number and each of which is composed of memory cells which are M in number, and
(D-2) the plate lines which are M in number, each of which is shared with each memory cell constituting each of the second sub-memory units which are N in number, between or among the second sub-memory units which are N in number, and which are shared with the plate lines which constitute said first memory unit and are M in number, wherein the first sub-memory unit of an n-th layer (n=1, 2 . . . N) and the second sub-memory unit of the n-th layer are formed on the same insulating layer, the first sub-memory unit of an n'-th layer (n'=2 . . . N) and the second sub-memory unit of the n'-th layer are stacked on the first sub-memory unit of the (n'−1)-th layer and the second sub-memory unit of the (n'−1)-th layer through the insulating layer, each memory cell comprises a first electrode, a ferroelectric layer and a second electrode, in the first memory unit, the first electrodes of the memory cells constituting the first sub-memory unit of the n-th layer are in common with the first sub-memory unit of the n-th layer, said common first electrode is connected to the first bit line through the n-th-place first transistor for selection, and the second electrode of the memory cell in an m-th-place (m=1, 2 . . . M) is connected to the common plate line in the m-th-place, in the second memory unit, the first electrodes of the memory cells constituting the second sub-memory unit of the n-th layer are in common with the second sub-memory unit of the n-th layer, said common first electrode is connected to the second bit line through the n-th-place second transistor for selection, and the second electrode of the memory cell in the m-th-place is connected to the common plate line in the m-th-place, the memory cells constituting the first sub-memory unit of the n-th layer and the memory cells constituting the second sub-memory unit of the n-th layer have the same thermal history with regard to their production processes, the memory cells constituting the first sub-memory unit of the n-th layer and the memory cells constituting the second sub-memory unit of the n-th layer have the thermal history different from the thermal history of the memory cells constituting the first sub-memory unit of a k-th layer (k≠n) and the memory cells constituting the second sub-memory unit of the k-th layer, the memory cell in the m-th-place constituting the first sub-memory unit of the n-th layer in the first memory unit and the memory cell in the m-th-place constituting the second sub-memory unit of the n-th layer in the second memory unit form a pair to store data of 1 bit each, a reference potential having an n-th potential is provided to the second bit line when data stored in the memory cell constituting the first sub-memory unit of the n-th layer in the first memory unit is read out, a reference potential having an n-th potential is provided to the first bit line when data stored in the memory cell constituting the second sub-memory unit of the n-th layer in the second memory unit is read out, and the n-th potential differs from the k-th potential (k≠n).

The ferroelectric-type nonvolatile semiconductor memory according to the third aspect of the present invention may have a constitution in which the first bit lines which are N in number and the second bit lines which are N in number are provided, the common first electrode in the first sub-memory unit of the n-th layer is connected to the n-th-place first bit line through the n-th-place first transistor for selection in the first memory unit, the common first electrode in the second sub-memory unit of the n-th layer is connected to the n-th-place second bit line through the n-th-place second transistor for selection in the second memory unit, the reference potential having the n-th potential is provided to the n-th-place second bit line when data stored in the memory cell constituting the first sub-memory unit of the n-th layer in the first memory unit is read out, and the reference potential having the n-th potential is provided to the n-th-place first bit line when data stored in the memory cell constituting the second sub-memory unit of the n-th layer in the second memory unit is read out.

The ferroelectric-type nonvolatile semiconductor memory according to the fourth aspect of the present invention for achieving the above object is a so-called gain-cell type ferroelectric-type nonvolatile semiconductor memory and comprises a first memory unit and a second memory unit;

said first memory unit having;
(A-1) a first bit line,
(B-1) first transistors for selection which are N in number (N≧2),
(C-1) first sub-memory units which are N in number and each of which is composed of memory cells which are M in number (M≧2),
(D-1) plate lines which are M in number and each of which is shared with each memory cell constituting each of the first sub-memory units which are N in number, between or among the first sub-memory units which are N in number,
(E-1) a first transistor for writing-in,
(F-1) a first transistor for detection, and
(G-1) a first transistor for read-out, and said second memory unit having;
(A-2) a second bit line,
(B-2) second transistors for selection which are N in number,
(C-2) second sub-memory units which are N in number and each of which is composed of memory cells which are M in number,
(D-2) the plate lines which are M in number, each of which is shared with each memory cell constituting each of the second sub-memory units which are N in number, between or among the second sub-memory units which are N in number, and which are shared with the plate lines which constitute said first memory unit and are M in number,
(E-2) a second transistor for writing-in,
(F-2) a second transistor for detection, and
(G-2) a second transistor for read-out, wherein the first sub-memory unit of an n-th layer (n=1, 2 ... N) and the second sub-memory unit of the n-th layer are formed on the same insulating layer, the first sub-memory unit of an n'-th layer (n'=2 ... N) and the second sub-memory unit of the n'-th layer are stacked on the first sub-memory unit of the (n'−1)-th layer and the second sub-memory unit of the (n'−1)-th layer through the insulating layer, each memory cell comprises a first electrode, a ferroelectric layer and a second electrode, in the first memory unit, the first electrodes of the memory cells constituting the first sub-memory unit of the n-th layer are in common with the first sub-memory unit of the n-th layer, said common first electrode is connected to the first bit line through the n-th-place first transistor for selection and the first transistor for writing-in, and the second electrode of the memory cell in an m-th-place (m=1, 2 ... M) is connected to the common plate line in the m-th-place, in the second memory unit, the first electrodes of the memory cells constituting the second sub-memory unit of the n-th layer are in common with the second sub-memory unit of the n-th layer, said common first electrode is connected to the second bit line through the n-th-place second transistor for selection and the second transistor for writing-in, and the second electrode of the memory cell in the m-th-place is connected to the common plate line in the m-th-place, the memory cells constituting the first sub-memory unit of the n-th layer and the memory cells constituting the second sub-memory unit of the n-th layer have the thermal history with regard to their production processes, the memory cells constituting the first sub-memory unit of the n-th layer and the memory cells constituting the second sub-memory unit of the n-th layer have the thermal history different from the thermal history of the memory cells constituting the first sub-memory unit of a k-th layer (k≠n) and the memory cells constituting the second sub-memory unit of the k-th layer, the memory cell in the m-th-place constituting the first sub-memory unit of the n-th layer in the first memory unit and the memory cell in the m-th-place constituting the second sub-memory unit of the n-th layer in the second memory unit form a pair to store data of 1 bit each, one end of the first transistor for detection is connected to a first wiring having a predetermined potential, and the other end thereof is connected to the first bit line through the first transistor for read-out, one end of the second transistor for detection is connected to a second wiring having a predetermined potential, and the other end thereof is connected to the second bit line through the second transistor for read-out, the n-th-place first transistor for selection and the first transistor for read-out are brought into a conducting state when data stored in the memory cell constituting the first sub-memory unit of the n-th layer in the first memory unit is read out, the operation of the first transistor for detection is controlled with a potential that occurs in the common first electrode on the basis of data stored in said memory cell, and a reference potential having an n-th potential is provided to the second bit line, the n-th-place second transistor for selection and the second transistor for read-out are brought into a conducting state when data stored in the memory cell constituting the second sub-memory unit of the n-th layer in the second memory unit is read out, the operation of the second transistor for detection is controlled with a potential that occurs in the common first electrode on the basis of data stored in said memory cell, and a reference potential having an n-th potential is provided to the first bit line, and the n-th potential differs from the k-th potential (k≠n).

As a specific constitution of the ferroelectric-type nonvolatile semiconductor memory according to the fourth aspect of the present invention, when various transistors are formed from FETs, there may be employed a constitution in which one source/drain region of the transistor for writing-in is connected to the bit line, the other source/drain region thereof is connected to one source/drain region of each of the transistors for selection which are N in number, the other source/drain region of the n-th-place transistor for selection is connected to the common first electrode constituting the memory unit of the n-th layer, one source/drain region of the transistor for detection is connected to a wiring having a predetermined potential, the other source/drain region thereof is connected to one source/drain region of the transistor for read-out, the other source/drain region of the transistor for read-out is connected to the bit line, and one source/drain region of the transistor for selection or the other source/drain region of the transistor for writing-in is connected to the gate electrode of the transistor for detection. The constitution in which the other source/drain region of the transistor for detection is connected to one source/drain region of the transistor for read-out includes a constitution in which the other source/drain region of the transistor for detection and one source/drain region of the transistor for read-out occupy one source/drain region.

In the ferroelectric-type nonvolatile semiconductor memory according to any one of the first to fourth aspects of the present invention, preferably, the reference potential is a potential having an intermediate value between the potential that appears in the bit line when data "1" is read out and the potential that appears in the bit line when data "0" is read out, or a value around the above intermediate value.

In the ferroelectric-type nonvolatile semiconductor memory according to any one of the second to fourth aspects of the present invention, the n-th potential differs from the k-th potential (k≠n). However, there may be employed a constitution in which sub-memory units of N layers are divided into groups which are less than N in number, and different reference potentials are provided to the groups. Specifically, when N=4, there may be employed a constitution in which the first potential and the second potential are at one level, and the third potential and the fourth potential are at other one level, namely, the first and second potentials differ from the third and fourth potentials.

In the ferroelectric-type nonvolatile semiconductor memory according to any one of the second to fourth aspects of the present invention, there may be employed a constitution in which reference capacitors which are N in number are further provided and the reference capacitor in an n-th-place provides a reference potential having an n-th potential. In this case, preferably, the reference capacitor in the n-th-place has a thermal history that is the same as the thermal history of the memory cells constituting the first sub-memory unit of the n-th layer and the memory cells constituting the second sub-memory unit of the n-th layer. Further, preferably, the first sub-memory unit of the n-th layer, the second sub-memory unit of the n-th layer and the reference capacitor in the n-th-place are formed on the same insulating layer. The above-constituted reference capacitor includes a ferroelectric capacitor having a structure in which a ferroelectric material is sandwiched between two electrodes. When the reference capacitor is constituted of a ferroelectric capacitor, the reference capacitor in the n-th-place has a thermal history that is the same as the thermal history of the memory cells constituting the first sub-memory unit of the n-th layer and the memory cells constituting the second sub-memory unit of the n-th layer, and further, the first sub-memory unit of the n-th layer, the second sub-memory unit of the n-th layer and the reference capacitor in the n-th-place are formed on the same insulating layer, so that there can be obtained a stabilized output potential, i.e., reference potential of the reference capacitor. In this case, the reference potential from the reference capacitor can be optimized, for example, by changing the area of capacitor member of the reference capacitor, or by constituting the reference capacitor from a plurality of reference capacitor members connected in parallel and fuse portions, measuring an outputted reference potential and breaking the fuse portion(s) by fusing to eliminate unnecessary reference capacitor members from the other reference capacitor members. Generally, a ferroelectric material has negative temperature characteristics. That is, with an increase in the temperature of a ferroelectric layer, the values of residual polarization $P_r$ and coercive field (coercive force) decrease. When the reference capacitor is constituted of a ferroelectric capacitor, the potential outputted from the reference capacitor has negative temperature characteristics, and the potential outputted from the reference capacitor follows a temperature-dependent change in the characteristic of the memory cells, which is preferred. Further, the reference capacitor made of a ferroelectric capacitor can be produced concurrently with the production of the memory cells, so that no additional step is required in the production of the ferroelectric-type nonvolatile semiconductor memory.

Alternatively, in the ferroelectric-type nonvolatile semiconductor memory according to any one of the first to fourth aspects of the present invention, the reference capacitor includes, for example, a MOS capacitor. In this case, the reference potential outputted from the reference capacitor can be optimized, for example, by changing the area of capacitor member of the reference capacitor or by constituting the reference capacitor from a plurality of reference capacitor members connected in parallel and fuse portions, measuring an outputted reference potential and breaking the fuse portion(s) by fusing to eliminate unnecessary reference capacitor members from the other reference capacitor members. Alternatively, the reference potential may be outputted from a known voltage down converter or a structure in which a plurality of PMOS FETs are connected in series. In the latter case, when the threshold voltage of each PMOS FET is $V_{th}$, the reference potential outputted come to be (number of stages of PMOS FETS)$\times V_{th}$.

The ferroelectric-type nonvolatile semiconductor memory according to the fifth aspect of the present invention for achieving the above object comprises a plurality of memory cells each of which comprises a first electrode, a ferroelectric layer formed at least on said first electrode and a second electrode formed on said ferroelectric layer, a plurality of the memory cells belonging to one of two or more thermal history groups having different thermal histories with regard to their production processes, wherein complementary 1 bit data is stored in a pair of the memory cells, and said pair of the memory cells belong to the same thermal history group.

The ferroelectric-type nonvolatile semiconductor memory according to the fifth aspect of the present invention may have a constitution in which the memory cells have a structure in which the memory cells are stacked through an insulating layer, the memory cells formed on one insulating layer belong to the thermal history group different from the thermal history group to which the memory cells formed on other insulating layer belong, and the memory cells formed on the same insulating layer belong to the same thermal history group.

The ferroelectric-type nonvolatile semiconductor memory according to the sixth aspect of the present invention for achieving the above object comprises a first memory unit and a second memory unit;

said first memory unit having;
(A-1) a first bit line,
(B-1) a first transistor for selection,
(C-1) first sub-memory units which are N in number (N≧2) and each of which is composed of memory cells which are M in number (M≧2), and
(D-1) plate lines which are M×N in number, and said second memory unit having;
(A-2) a second bit line,
(B-2) a second transistor for selection,
(C-2) second sub-memory units which are N in number and each of which is composed of memory cells which are M in number, and
(D-2) the plate lines which are M×N in number and are shared with the plate lines which are M×N in number and constitute said first memory unit, wherein the first sub-memory unit of an n-th layer (n=1, 2 . . . N) and the second sub-memory unit of the n-th layer are formed on the same insulating layer, the first sub-memory unit of an n'-th layer (n'=2 . . . N) and the second sub-memory unit of the n'-th layer are stacked on the first sub-memory unit of the (n'−1)-th layer and the second sub-memory unit of the (n'−1)-th layer through the insulating layer, each memory cell comprises a first electrode, a ferroelectric layer and a second electrode, in the first memory unit, the first electrodes of the memory cells constituting first sub-memory unit of the n-th layer are in common with the first sub-memory unit of the n-th layer, said common first electrode is connected to the first bit line through the first transistor for selection, and the second electrode of the memory cell in an m-th-place (m=1, 2 . . . M) is connected to the common plate line in the [(n−1)M+m]-th-place, in the second memory unit, the first electrodes of the memory cells constituting the second sub-memory unit of the n-th layer are in common with the second sub-memory unit of the n-th layer, said common first electrode is connected to the second bit line through the second transistor for selection, and the second electrode of the memory cell in the m-th-place is connected to the common plate line in the [(n−1)M+m]-th-place, the memory cells constituting the first sub-memory unit of the n-th layer and the memory cells constituting the second sub-memory unit of the n-th layer have the same thermal history with regard to their production processes, the memory cells constituting the first sub-memory unit of the n-th layer and the memory cells constituting the second sub-memory unit of the n-th layer have the thermal history different from the thermal history of the memory cells constituting the first sub-memory unit of a k-th layer (k≠n) and the memory cells constituting the second sub-memory unit of the k-th layer, and the memory cell in the m-th-place constituting the first sub-memory unit of the n-th layer in the first memory unit and the memory cell in the m-th-place constituting the second sub-memory unit of the n-th layer in the second memory unit form a pair to store complement data.

The ferroelectric-type nonvolatile semiconductor memory according to the seventh aspect of the present invention for achieving the above object comprises a first memory unit and a second memory unit;

said first memory unit having;
(A-1) a first bit line,
(B-1) first transistors for selection which are N in number (N≧2),
(C-1) first sub-memory units which are N in number and each of which is composed of memory cells which are M in number (M≧2), and
(D-1) plate lines which are M in number and each of which is shared with each memory cell constituting each of the first sub-memory units which are N in number, between or among the first sub-memory units which are N in number, and said second memory unit having;
(A-2) a second bit line,
(B-2) second transistors for selection which are N in number,
(C-2) second sub-memory units which are N in number and each of which is composed of memory cells which are M in number, and
(D-2) the plate lines which are M in number, each of which is shared with each memory cell constituting each of the second sub-memory unit which are N in number, between or among the second sub-memory units which are N in number, and which are shared with the plate lines which are M in number and constitute said first memory unit, wherein the first sub-memory unit of an n-th layer (n=1, 2 . . . N) and the second sub-memory unit of the n-th layer are formed on the same insulating layer, the first sub-memory unit of an n'-th layer (n'=2 ... N) and the second sub-memory unit of the n'-th layer are stacked on the first sub-memory unit of the (n'−1)-th layer and the second sub-memory unit of the (n'−1)-th layer through the insulating layer, and each memory cell comprises a first electrode, a ferroelectric layer and a second electrode, in the first memory unit, the first electrodes of the memory cells constituting the first sub-memory unit of the n-th layer are in common with the first sub-memory unit of the n-th layer, said common first electrode is connected to the first bit line through the n-th-place first transistor for selection, and the second electrode of the memory cell in an m-th-place (m=1, 2 ... M) is connected to the common plate line in the m-th-place, in the second memory unit, the first electrodes of the memory cells constituting the second sub-memory unit of the n-th layer are in common with the second sub-memory unit of the n-th layer, said common first electrode is connected to the second bit line through the n-th-place second transistor for selection, and the second electrode of the memory cell in the m-th-place is connected to the common plate line in the m-th-place, the memory cells constituting the first sub-memory unit of the n-th layer and the memory cells constituting the second sub-memory unit of the n-th layer have the same thermal history with regard to their production processes, the memory cells constituting the first sub-memory unit of the n-th layer and the memory cells constituting the second sub-memory unit of the n-th layer have the thermal history different from the thermal history of the memory cells constituting the first sub-memory unit of a k-th layer (k≠n) and the memory cells constituting the second sub-memory unit of the k-th layer, and the memory cell in the m-th-place constituting the first sub-memory unit of the n-th layer in the first memory unit and the memory cell in the m-th-place constituting the second sub-memory unit of the n-th layer in the second memory unit form a pair to store complement data.

In the ferroelectric-type nonvolatile semiconductor memory according to the seventh aspect of the present invention, there may be employed a constitution in which the first bit lines which are N in number and the second bit lines which are N in number are provided, the common first electrode in the first sub-memory unit of the n-th layer is connected to the n-th-place first bit line through the n-th-place first transistor for selection in the first memory unit, and the common first electrode in the second sub-memory unit of the n-th layer is connected to the n-th-place second bit line through the n-th-place second transistor for selection in the second memory unit.

In the ferroelectric-type nonvolatile semiconductor memory according to any one of the second to fourth aspects of the present invention, the transistor for selection constituting the first memory unit and the transistor for selection constituting the second memory unit are connected to different word lines. In the ferroelectric-type nonvolatile semiconductor memory according to any one of the sixth and seventh aspects of the present invention, preferably, the transistor for selection constituting the first memory unit and the transistor for selection constituting the second memory unit are connected to the same word line. However, they may be connected to different word lines so long as they can be driven concurrently.

In the ferroelectric-type nonvolatile semiconductor memory according to any one of the second to fourth, sixth and seventh aspects of the present invention, the value of M can be any value so long as it satisfies M≧2, and examples of actual value of M include exponents of 2 (2, 4, 8 . . .). Further, the value of N can be any value so long as it satisfies N≧2, and examples of actual value of N include exponents of 2 (2, 4, 8 . . .). In the ferroelectric-type nonvolatile semiconductor memory according to the fourth aspect of the present invention, desirably, the value of M satisfies 2≦M≦128, preferably 4≦M≦32.

In the ferroelectric-type nonvolatile semiconductor memory according to any one of the second to fourth, sixth and seventh aspects of the present invention, a plurality of the memory cells share one transistor for selection. And, the sub-memory units are constituted in a stacked structure, whereby the limitation imposed by the number of transistors that occupy the surface of the semiconductor substrate is no longer any limitation, the storage capacity can be remarkably increased as compared with any conventional ferroelectric-type nonvolatile semiconductor memory, and the effective occupation area per bit storage unit can be remarkably decreased.

In the ferroelectric-type nonvolatile semiconductor memory according to any one of the second to fourth, sixth and seventh aspects of the present invention, an address selection in the row direction is carried out in a two-dimensional matrix constituted of the transistor for selection and the plate lines. For example, when a selection unit of row addresses is constituted of the sub-memory units of N layers, eight transistors for selection and eight plate lines, memory cells of 64×N bits or 32×N bits can be selected with 16 decoder/driver circuits. Even when the integration degree of a ferroelectric-type nonvolatile semiconductor memory is equal to a conventional one, therefore, the storage capacity can be increased to a multiple of 4N or 2N. Further, the number of peripheral circuits or driving wirings for address selection can be decreased.

In the ferroelectric-type nonvolatile semiconductor memory according to any one of the second to fourth, sixth and seventh aspects of the present invention, there may be employed a constitution in which the crystallization temperature of the ferroelectric layer constituting the memory cells of the sub-memory unit positioned above is lower than the crystallization temperature of the ferroelectric layer constituting the memory cells of the sub-memory unit positioned below. The crystallization temperature can be investigated with an X-ray diffraction apparatus or a surface scanning electron microscope. Specifically, the crystallization temperature of the ferroelectric layer can be determined as follows. For example, a ferroelectric material layer is formed and then heat-treated at various heat treatment temperatures for crystallization of the ferroelectric material layer, and the heat-treated ferroelectric material layer is subjected to X-ray diffraction analysis, to evaluate the layer for a diffraction pattern strength (height of diffraction peak) characteristic of the ferroelectric material.

Meanwhile, when a ferroelectric-type nonvolatile semiconductor memory having a constitution of stacked sub-memory units is produced, it is required to carry out heat treatments (to be referred to as "crystallization heat treatment" hereinafter) for crystallization of a ferroelectric thin film constituting the ferroelectric layer as many times as the number of stages of the stacked sub-memory units. As a result, a sub-memory unit positioned in a lower stage undergoes the crystallization heat treatment for a longer period of time, and a sub-memory unit positioned in an upper stage undergoes the crystallization heat treatment for a shorter period of time. That is, they differ in their thermal histories. Therefore, when an optimum crystallization heat treatment is carried out on the sub-memory unit positioned in an upper stage, the sub-memory unit positioned in a lower stage may suffer an excess heat load and may deteriorate in properties. It is conceivable to employ a method in which multi-staged sub-memory units are formed and then subjected to the crystallization heat treatment once. However, the ferroelectric layers are caused to have a great change in volume, or the ferroelectric layers highly possibly cause degassing, during crystallization, and there is liable to be a problem that the ferroelectric layers undergo cracking or peeling.

It is therefore arranged that the crystallization temperature of the ferroelectric layer constituting the sub-memory unit positioned in an upper stage is lower than the crystallization temperature of the ferroelectric layer constituting the sub-memory unit positioned in a lower stage. In this case, even if the crystallization heat treatments are carried out as many times as the number of stages of the sub-memory units stacked, there is hardly caused such a problem that the memory cells constituting the sub-memory units in a lower stage deteriorate in properties. Further, with regard to the memory cells constituting the sub-memory units in each stage, the crystallization heat treatment can be carried out under optimum conditions, and a ferroelectric-type nonvolatile semiconductor memory excellent in properties can be obtained. The following Table 1 below shows crystallization temperatures of typical materials for constituting the ferroelectric layer, while the material for constituting the ferroelectric layer shall not be limited thereto.

TABLE 1

| Material | Crystallization temperature |
|---|---|
| $Bi_2SrTa_2O_9$ | 700–800° C. |
| $Bi_2Sr(Ta_{1.5},Nb_{0.5})O_9$ | 650–750° C. |
| $Bi_4Ti_3O_{12}$ | 600–700° C. |
| $Pb(Zr_{0.48},Ti_{0.52})O_3$ | 550–650° C. |
| $PbTiO_3$ | 500–600° C. |

In the ferroelectric-type nonvolatile semiconductor memory according to the first to seventh aspects of the present invention (these will be sometimes generally and simply referred to as "ferroelectric-type nonvolatile semiconductor memory of the present invention" hereinafter), for example, various transistors are formed in a silicon semiconductor substrate, an insulating layer is formed on these various transistors, and the memory cells or sub-memory units are formed on the insulating layer, which is preferred in view of decreasing the cell area.

The material for the ferroelectric layer constituting ferroelectric-type nonvolatile semiconductor memory of the present invention includes bismuth layer compounds, more specifically, a Bi-containing layer-structured perovskite-type ferroelectric material. The Bi-containing layer-structured perovskite-type ferroelectric material comes under so-called non-stoichiometric compounds, and shows tolerance of compositional deviations in both sites of a metal element and anions (O, etc.). Further, it is not a rare case that the above material having a composition deviated from its stoichiometric composition to some extent exhibits optimum electric characteristics. The Bi-containing layer-structured perovskite-type ferroelectric material can be expressed, for example, by the general formula, $$(Bi_2O_2)^{2+}(A_{m-1}B_mO_{3m+1})^{2-}$$

wherein "A" is one metal selected from the group consisting of metals such as Bi, Pb, Ba, Sr, Ca, Na, K, Cd, etc., and "B" is one metal selected from the group consisting of Ti, Nb, Ta, W, Mo, Fe, Co and Cr or a combination of a plurality of these metals combined in any amount ratio, and m is an integer of 1 or more.

Alternatively, the material for constituting the ferroelectric layer preferably contains, as a main crystal phase, a crystal phase represented by the formula (1), $$(Bi_X, Sr_{1-X})_2(Sr_Y, Bi_{1-Y})(Ta_Z, Nb_{1-Z})_2O_d \quad (1)$$

wherein $0.9 \leq X \leq 1.0$, $0.7 \leq Y \leq 1.0$, $0 \leq Z \leq 1.0$, and $8.7 \leq d \leq 9.3$.

Otherwise, the material for constituting the ferroelectric layer preferably contains, as a main crystal phase, a crystal phase represented by the formula (2), $$Bi_X Sr_Y Ta_2 O_d \quad (2)$$

wherein X+Y=3, $0.7 \leq Y \leq 1.3$ and $8.7 \leq d \leq 9.3$.

In the above case, more preferably, the material for constituting the ferroelectric layer preferably contains, as a main crystal phase, at least 85% of a crystal phase represented by the formula (1) or (2). In the above formula (1), $(Bi_X, Sr_{1-X})$ means that Sr occupies the site that Bi should have occupied in a crystal structure and that the Bi:Sr amount ratio is X:(1−X). Further, $(Sr_Y, Bi_{1-Y})$ means that Bi occupies the site that Sr should have occupied in a crystal structure and that the Sr:Bi amount ratio is Y:(1−Y). The material for constituting the ferroelectric layer and containing, as a main crystal phase, the crystal phase of the above formula (1) or (2), may contain an oxide of Bi, oxides of Ta and Nb and composite oxides of Bi, Ta and Nb to some extent.

Alternatively, the material for constituting the ferroelectric layer may contain a crystal phase represented by the formula (3), $$Bi_X(Sr, Ca, Ba)_Y(Ta_Z, Nb_{1-Z})_2O_d \quad (3)$$

wherein $1.7 \leq X \leq 2.5$, $0.6 \leq Y \leq 1.2$, $0 \leq Z \leq 1.0$ and $8.0 \leq d \leq 10.0$. (Sr, Ca, Ba) stands for one element selected from the group consisting of Sr, Ca and Ba. When the above material for the ferroelectric layer, having the above formulae, is expressed by a stoichiometric composition, the composition includes $Bi_2SrTa_2O_9$, $Bi_2SrNb_2O_9$, $Bi_2BaTa_2O_9$ and $Bi_2SrTaNbO_9$. Otherwise, the material for constituting the ferroelectric layer also includes $Bi_4SrTi_4O_{15}$, $Bi_4Ti_3O_{12}$ and $Bi_2PbTa_2O_9$. In these cases, the amount ratio of the metal elements may be varied to such an extent that the crystal structure does not change. That is, the above material may have a composition deviated from its stoichiometric composition in both sites of metal elements and oxygen element.

Alternatively, the material for constituting the ferroelectric layer includes $PbTiO_3$, lead titanate zirconate [PZT, $Pb(Zr_{1-y}, Ti_y)O_3$ wherein $0<y<1$] which is a solid solution of $PbZrO_3$ and $PbTiO_3$ having a perovskite structure, and PZT-containing compounds such as PLZT which is a metal oxide prepared by adding La to PZT and PNZT which is a metal oxide prepared by adding Nb to PZT.

In the above-explained materials for constituting the ferroelectric layer, the crystallization temperature thereof can be changed by deviating their compositions from their stoichiometric compositions.

In the ferroelectric-type nonvolatile semiconductor memory of the present invention, there may be employed a constitution in which the first electrode is formed below the ferroelectric layer and the second electrode is formed on the ferroelectric layer (that is, the first electrode corresponds to the lower electrode and the second electrode corresponds to the upper electrode), or there may be employed a constitution in which the first electrode is formed on the ferroelectric layer and the second electrode is formed below the ferroelectric layer (that is, the first electrode corresponds to the upper electrode and the second electrode corresponds to the lower electrode). There may be employed a constitution in which the plate line extends from the second electrode, or the plate line is formed separately from the second electrode and is connected to the second electrode. In the latter case, the wiring material for constituting the plate line includes, for example, aluminum and an aluminum-containing alloy. The structure in which the first electrodes are in common specifically includes a structure in which the first electrode in the form of stripes is formed and the ferroelectric layer is formed on the entire surface of the striped first electrode. In the above structure, an overlapping region of the first electrode, the ferroelectric layer and the second electrode corresponds to the memory cell. The structure in which the first electrodes are in common includes a structure in which the ferroelectric layers are formed on predetermined regions of the first electrode and the second electrodes are formed on the ferroelectric layers, and a structure in which the first electrodes are formed in predetermined surface regions of a wiring layer, the ferroelectric layers are formed on the first electrodes and the second electrodes are formed on the ferroelectric layers, although the above structure shall not be limited thereto.

For forming the ferroelectric layer, a ferroelectric thin film is formed, and in a step to come thereafter, the ferroelectric thin film is patterned. In some cases, it is not required to pattern the ferroelectric thin film. The ferroelectric thin film can be formed by a method suitable for a material that is used to constitute the ferroelectric thin film, such as an MOCVD method, a pulse laser abrasion method, a sputtering method, a sol-gel method, an MOD (metal organic decomposition) method using a bismuth organic metal compound (bismuth alkoxide compound) having a bismuth-oxygen bond as a raw material, and an LSMCD (liquid source mist chemical deposition) method. The ferroelectric thin film can be patterned, for example, by an anisotropic ion etching (RIE) method.

In the present invention, the material for constituting the first electrode and second electrode includes, for example, Ir, $IrO_{2-X}$, $Ir/IrO_{2-X}$, $SrIrO_3$, Ru, $RuO_{2-X}$, $SrRuO_3$, Pt, $Pt/IrO_{2-X}$, $Pt/RuO_{2-X}$, Pd, a Pt/Ti stacked structure, a Pt/Ta stacked structure, a Pt/Ti/Ta stacked structure, $La_{0.5}Sr_{0.5}CoO_3$(LSCO), a Pt/LSCO stacked structure and $YBa_2Cu_3O_7$. The value of the above X is in the range of $0 \leq X < 2$. In the above stacked structures, a material described before "/" constitutes the upper layer, and a material described after "/" constitutes the lower layer. The first electrode and the second electrode may be constituted of one material, materials of the same kind or materials of different kinds. For forming the first electrode or the second electrode, a first electrode material layer or a second electrode material layer is formed, and in a step to come thereafter, the first electrode material layer or the second electrode material layer is patterned. The first electrode material layer or the second electrode material layer can be formed by a method properly suitable for the materials for constituting the first electrode material layer or the second electrode material layer, such as a sputtering method, a reactive sputtering method, an electron beam deposition method, an MOCVD method and a pulse laser abrasion method. The first electrode material layer or the second electrode material layer can be patterned, for example, by an ion milling method or an RIE method.

In the ferroelectric-type nonvolatile semiconductor memory of the present invention, the material for constituting the insulating layer includes silicon oxide ($SiO_2$), silicon nitride (SiN), SiON, SOG, NSG, BPSG, PSG, BSG and LTO.

The transistor for selection (transistor for switching) and various transistors can be constituted, for example, of a known MIS type FET or a MOS type FET. The material for constituting the bit line includes an impurity-doped polysilicon and a refractory metal material. The common first electrode and the transistor for selection can be electrically connected through a contact hole made in the insulating layer formed between the common first electrode and the transistor for selection or through a contact hole made in the insulating layer and a wiring layer formed on the insulating layer. The differential sense amplifier can be constituted of a known latch circuit.

In the ferroelectric-type nonvolatile semiconductor memory according to any one of the first to fourth aspects of the present invention, a reference potential having one potential is provided to the memory cells belonging to the same thermal history group, and a reference potential having other potential is provided to the memory cells belonging to other thermal history group. Otherwise, a reference potential having one potential is provided to the memory cells constituting the first and second sub-memory units of an n-th layer, and a reference potential having other potential is provided to the memory cells constituting the first and second sub-memory units of a k-th layer (k≠n), so that optimum reference potentials can be provided to the bit line and that almost no difference appears in the bit line potential that appears in the bit line, even if memory cell groups having different thermal histories with regard to their production processes are included. When the present specification simply expresses "thermal history", it also means a thermal history with regard to a production process, more specifically, crystallization heat treatment that is carried out for crystallization of a ferroelectric thin film for forming a ferroelectric layer after the formation of the ferroelectric thin film.

In the ferroelectric-type nonvolatile semiconductor memory according to any one of the fifth to seventh aspects of the present invention, complement data of 1 bit is stored in a pair of the memory cells. It is ensured that such pairs of the memory cells belong to the same thermal history group with regard to their production processes, so that almost no change is caused in the bit line potential that appears in the bit line.

BRIEF DESCRIPTION OF THE DRAWINGS

The present invention will be explained on the basis of preferred embodiments with reference to drawings hereinafter.

DESCRIPTION OF THE PREFERRED EMBODIMENTS

EXAMPLE 1

Figure 1:
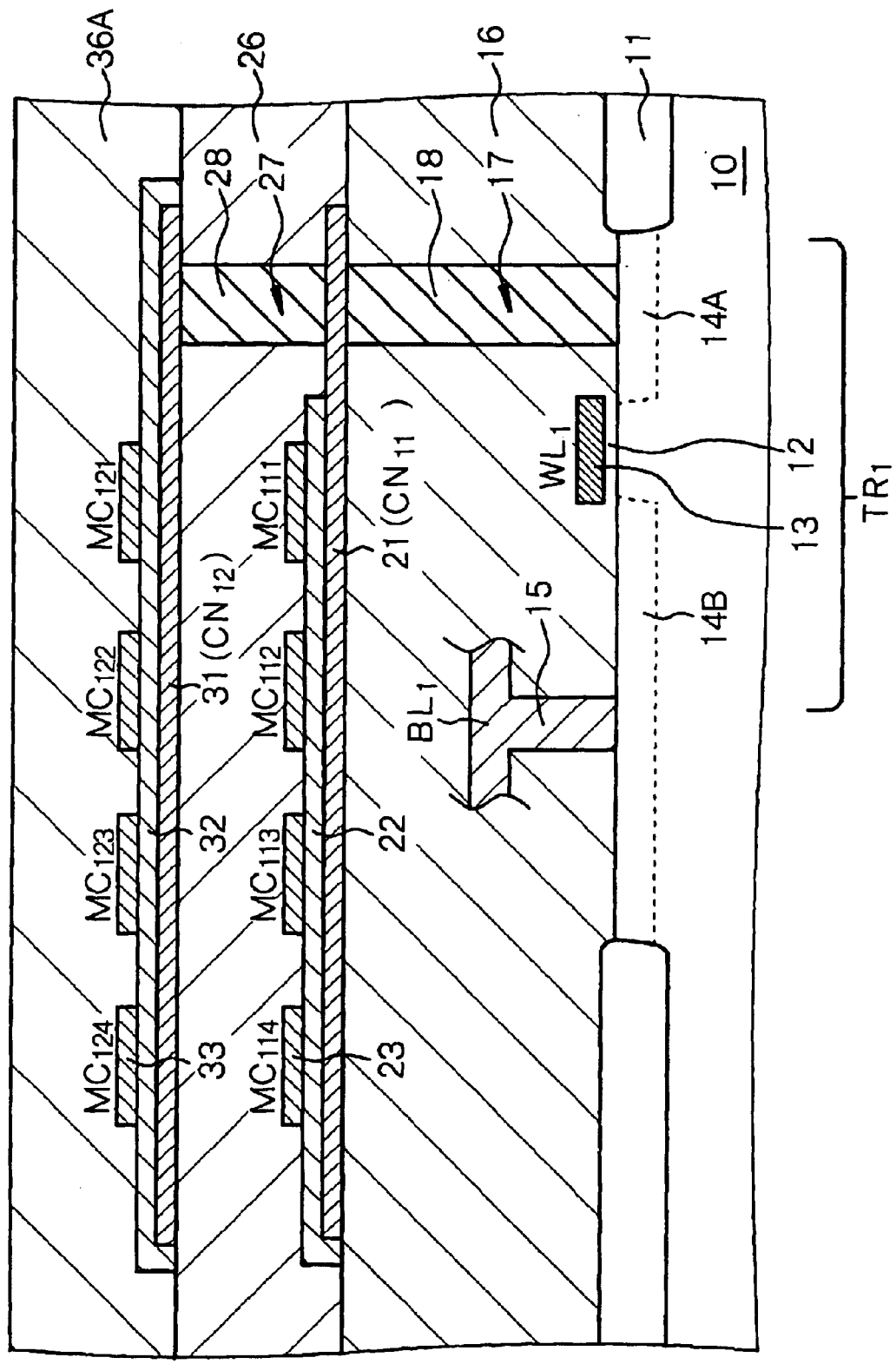
FIG. 1 is a schematic partial cross-sectional view of one memory unit obtained when a ferroelectric-type nonvolatile semiconductor memory in Example 1 is cut through an imaginary vertical plane that is in parallel with the extending direction of a bit line.
Figure 2:
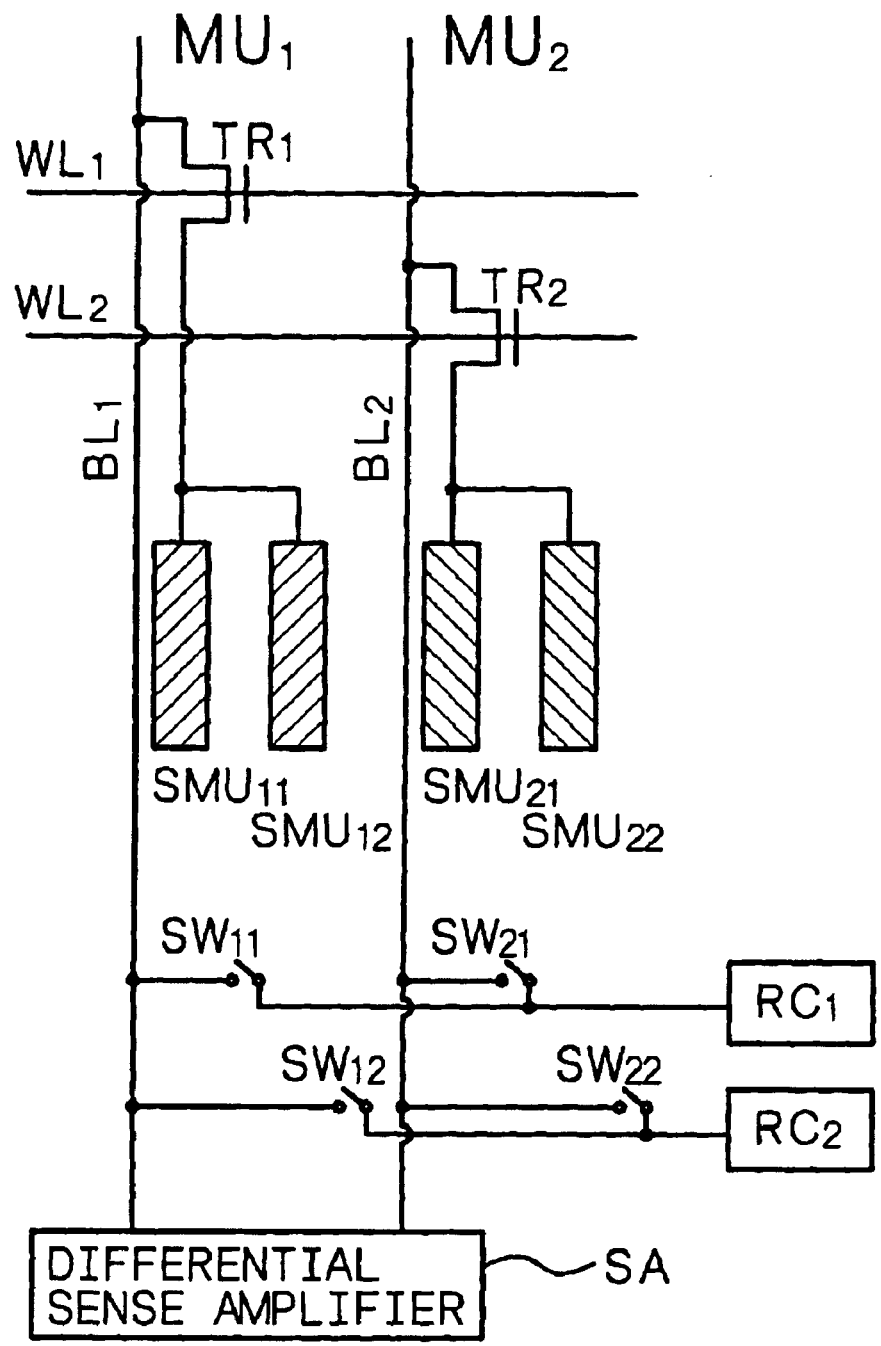
FIG. 2 is a conceptual circuit diagram of a ferroelectric-type nonvolatile semiconductor memory according to the second aspect of the present invention and in Example 1.
Figure 3:
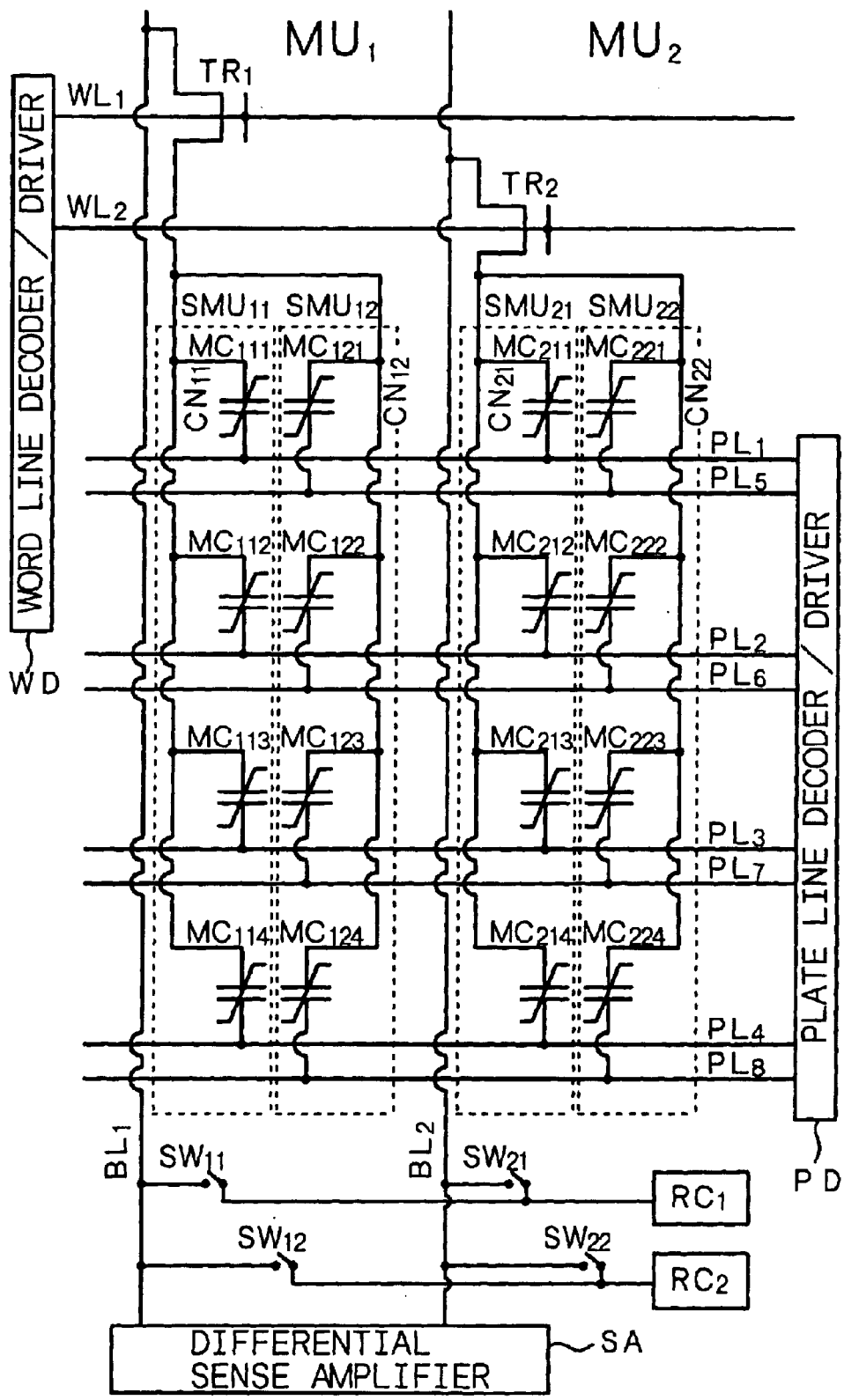
FIG. 3 is a more specific circuit diagram of the conceptual circuit diagram shown in FIG. 2.

Example 1 is concerned with a ferroelectric-type nonvolatile semiconductor memory (to be abbreviated as "nonvolatile memory" hereinafter) according to the first and second aspects of the present invention. FIG. 1 shows a schematic partial cross-sectional view obtained when part of the nonvolatile memory of Example 1 is cut through an imaginary vertical plane that is in parallel with the extending direction of a bit line. FIG. 2 shows a conceptual circuit diagram of the nonvolatile memory according to the second aspect of the present invention, and FIG. 3 shows a more specific circuit diagram of the conceptual circuit diagram of FIG. 2. While FIG. 1 shows a first sub-memory unit, a second sub-memory unit also has a similar structure, and the second sub-memory unit is formed side by side with the first sub-memory unit in the direction perpendicular to the paper surface of FIG. 1. In explanations to be described hereinafter, the first sub-memory unit alone will be explained in some cases.

The nonvolatile memory in Example 1 has a plurality of bit lines BLn (n=1, 2 in Example 1), a plurality of memory cells $MC_{1nm}$ and $MC_{2nm}$ (m=1, 2, 3, 4). Each memory cell comprises a first electrode 21 or 31, a ferroelectric layer 22 or 32 formed at least on the first electrode 21 or 31, and a second electrode 23 or 33 formed on the ferroelectric layer 22 or 32. A plurality of the memory cells $MC_{11m}$, $MC_{12m}$, $MC_{21m}$ and $MC_{22m}$ belong to one of two or more thermal history groups having thermal histories from different production processes. Specifically, the memory cell $MC_{11m}$ and the memory cell $MC_{21m}$ belong to a first thermal history group, and the memory cell $MC_{12m}$ and the memory cell $MC_{22m}$ belong to a second thermal history group. Data of 1 bit is stored in each of a pair of the memory cells ($MC_{11m}$ and $MC_{21m}$) or a pair of the memory cells ($MC_{12m}$ and $MC_{22m}$) connected to a pair of the bit lines $BL_n$, and the pair of the bit lines $BL_n$ are connected to a differential sense amplifier SA. The differential sense amplifier SA can be constituted of a known latch circuit.

In a pair of the memory cells (for example, $MC_{11m}$ and $MC_{21m}$), when data stored in one memory cell (for example, $MC_{11m}$) is read out, a reference potential is provided to the bit line $BL_2$ to which the other memory cell ($MC_{21m}$) is connected, and when data stored in the other memory cell ($MC_{21m}$) is read out, a reference potential is provided to the bit line $BL_1$ to which the former memory cell ($MC_{11m}$) is connected. And, a reference potential having the same potential is provided to a bit line connected to the memory cells belonging to the same thermal history group, and a reference potential having a different potential is provided to a bit line connected to the memory cells belonging to a different thermal history group. That is, when data stored in the memory cells $MC_{11m}$ and $MC_{21m}$, the same reference potential $V_{REF-1}$ is provided to the bit lines $BL_2$ and $BL_1$. When data stored in the memory cell $MC_{12m}$ and $MC_{22m}$ is read out, the same reference potential $V_{REF-2}$ is provided to the bit lines $BL_2$ and $BL_1$.

The above nonvolatile memory has a structure in which the memory cells are stacked through an insulating layer 26, and the memory cells formed on one insulating layer belong to a thermal history group different from a thermal history group of the memory cells formed on other insulating layer. That is, the memory cells $MC_{11m}$ and $MC_{21m}$ formed on an insulating layer 16 belong to the thermal history group different from the thermal history group of the memory cells $MC_{12m}$ and $MC_{22m}$ formed on other insulating layer 26. Further, the memory cells formed on the same insulating layer belong to the same thermal history group. That is, the memory cells $MC_{11m}$ and $MC_{21m}$ formed on the insulating layer 16 belong to one and the same thermal history group, and the memory cells $MC_{12m}$ and $MC_{22m}$ formed on the other insulating layer 26 belong to the other and same thermal history group.

The nonvolatile memory in Example 1 comprises a first memory unit $MU_1$ and a second memory unit $MU_2$.

The first memory unit $MU_1$ has;

(A-1) a first bit line $BL_1$, (B-1) a first transistor for selection $TR_1$, (C-1) first sub-memory units $SMU_{11}$ and $SMU_{12}$ which are N in number (N≧2; 2 in Example 1) and each of which is composed of memory cells $MC_{11M}$ and $MC_{12M}$ which are M in number (M≧2; M=4 in Example 1), and (D-1) plate lines which are M×N in number.

The second memory unit $MU_2$ has;

(A-2) a second bit line $BL_2$, (B-2) a second transistor for selection $TR_2$, (C-2) second sub-memory units $SMU_{21}$ and $SMU_{22}$ which are N in number and each of which is composes of memory cells $MC_{21M}$ and $MC_{22M}$ which are M in number, and (D-2) the plate lines which are M×N in number and are shared with the plate lines which are M×N in number and constitute said first memory unit $MU_1$.

The first sub-memory unit of an n-th layer (n=1, 2 . . . N; n=1, 2 in Example 1) $SMU_{1n}$ and the second sub-memory unit of the n-th layer $SMU_{2n}$ are formed on the same insulating layer 16 or 26, and the first sub-memory unit of an n' layer (n'=2 . . . N; n'=2 in Example 1) $SMU_{1n'}$ and the second sub-memory unit of the n'-th layer $SMU_{2n'}$ are stacked on the first sub-memory unit of the (n'−1)-th layer $SMU_{1(n'-1)}$ and the second sub-memory unit of the (n'−1)-th layer $SMU_{2(n'-1)}$ through the insulating layer 26.

Each of the memory cells $MC_{11m}$, $MC_{C21m}$ and $MC_{12m}$, $MC_{22m}$ comprises a first electrode 21 or 31, a ferroelectric layer 22 or 32 and a second electrode 23 or 33.

In the first memory unit $MU_1$, the first electrodes of the memory cells constituting the first sub-memory unit of the n-th layer are in common with the first sub-memory unit of the n-th layer, the common first electrode is connected to the first bit line $BL_1$ through the first transistor for selection $TR_1$, and the second electrode of the memory cell in an m-th-place (m=1, 2 . . . M) is connected to the common plate line in the [(n−1)M+N]-th-place. Specifically, the first electrodes 21 (which will be sometimes referred to as "common node $CN_{11}$") of the memory cells $MC_{11m}$ constituting the first sub-memory unit of the first layer $SMU_{11}$ are in common with the first sub-memory unit of the first layer $SMU_{11}$, the common first electrode 21 (common node $CN_{11}$) is connected to the first bit line $BL_1$ through the first transistor for selection $TR_1$, and the second electrode 23 of the memory cell $MC_{11m}$ in the m-th-place is connected to the common plate line in the [(n−1)M+n]-th-place. The first electrodes 31 (which will be sometimes referred to as "common node $CN_{12}$") of the memory cells $MC_{12m}$ constituting the first sub-memory unit of the second layer $SMU_{12}$ are in common with the first sub-memory unit of the second layer $SMU_{12}$, the common first electrode 31 (common node $CN_{12}$) is connected to the first bit line $BL_1$ through the first transistor for selection $TR_1$, and the second electrode 33 of the memory cell $MC_{12m}$ in the m-th-place is connected to the common plate line in the [(n−1)M+m]-th-place. The plate line $PL_{(n-1)M+m}$ is also connected to the second electrodes 23 and 33 of the memory cells constituting the memory unit $MU_2$. In Example 1, more specifically, the plate lines extend from the second electrodes 23 and 33.

In the second memory unit $MU_2$, the first electrodes of the memory cells constituting the second sub-memory unit of the n-th layer are in common with the second sub-memory unit of the n-th layer, the common first electrode is connected to the second transistor for selection through the second bit line, and the second electrode of the memory cell in the m-th-place is connected to the common plate line in the [(n−1)M+m]-th-place. Specifically, the first electrodes 21 (which will be sometimes referred to as "common node $CN_{21}$") of the memory cells $MC_{21m}$ constituting the second sub-memory unit of the first layer $SMU_{21}$ are in common with the second sub-memory unit of the first layer $SMU_{21}$, the common first electrode 21 (common node $CN_{21}$) is connected to the second bit line $BL_2$ through the second transistor for selection $TR_2$, and the second electrode 23 of the memory cell $MC_{21m}$ in the m-th-place is connected to the common plate line in the [(n−1)M+m]-th-place. The first electrodes 31 (which will be sometimes referred to as "common node $CN_{22}$") of the memory cells $MC_{22m}$ constituting the second sub-memory unit of the second layer $SMU_{22}$ are in common with the second sub-memory unit of the second layer $SMU_{22}$, the common first electrode 31 (common node $CN_{22}$) is connected to the second bit line $BL_2$ through the second transistor for selection $TR_2$, and the second electrode 33 of the memory cell $MC_{22m}$ in the m-th-place is connected to the common plate line in the [(n−1)M+m]-th-place.

The memory cells $MC_{1nm}$ constituting the first sub-memory unit of the n-th layer $SMU_{1n}$ and the memory cells $MC_{2nm}$ constituting the second sub-memory unit of the n-th layer $SMU_{2n}$ have the same thermal history with regard to their production processes, and the memory cells $MC_{1nm}$ constituting the first sub-memory unit of the n-th layer $SMU_{1n}$ and the memory cells $MC_{2nm}$ constituting the second sub-memory unit of the n-th layer $SMU_{2n}$ have a thermal history different from a thermal history of the memory cells $MC_{1km}$ constituting the first sub-memory unit of a k-th layer (k≠n) and the memory cells $MC_{2km}$ constituting the second sub-memory unit of the k-th layer $SMU_{2k}$.

The memory cell $MC_{1nm}$ in the m-th-place constituting the first sub-memory unit of the n-th layer $SMU_{1n}$ in the first memory unit $MU_1$ and the memory cell $MC_{2nm}$ in the m-th-place constituting the second sub-memory unit of the n-th layer $SMU_{2n}$ in the second memory unit $MU_2$ form a pair to store data of 1 bit each. When data stored in the memory cell $MC_{1nm}$ constituting the first sub-memory unit of the n-th layer $SMU_{1n}$ in the first memory unit $MU_1$ is read out, a reference potential $V_{REF-n}$ having an n-th potential is provided to the second bit line $BL_2$. When data stored in the memory cell $MC_{2nm}$ constituting the second sub-memory unit of the n-th layer $SMU_{2n}$ in the second memory unit $MU_2$ is read out, the reference potential $V_{REF-n}$ having the n-th potential is provided to the first bit line $BL_1$. The n-th potential differs from the k-th potential ($k \neq n$).

The other source/drain region 14B of the first transistor for selection $TR_1$ is connected to the first bit line $BL_1$ through a contact hole 15, and one source/drain region 14A of the first transistor for selection $TR_1$ is connected to the common first electrode 21 (first common node $CN_{11}$) in the first sub-memory unit of the first layer $SMU_{11}$ through a contact hole 18 (which will be referred to as "contact hole 18 of the first layer") made in the insulating layer 16. One source/drain region 14A of the first transistor for selection $TR_1$ is connected to the common first electrode 31 (second common node $CN_{12}$) in the first sub-memory unit of the second layer $SMU_{12}$ through the contact hole 18 of the first layer made in the insulating layer 16 and a contact hole 28 (which will be referred to as "contact hole of the second layer") made in the insulating layer 26. In the drawings, reference numeral 36A indicates an insulation layer.

The bit lines $BL_1$ and $BL_2$ are connected to the differential sense amplifier SA. The plate line $PL_{(n-1)M+m}$ is connected to a plate line decoder/driver PD. The word lines $WL_1$ and $WL_2$ are connected to a word line decoder/driver WD. The word lines $WL_1$ and $WL_2$ extend in the direction perpendicular to the paper surface of FIG. 1. The second electrode 23 of the memory cell $MC_{11m}$ constituting the first sub-memory unit $SMU_{11}$ is shared with the second electrode of the memory cell $MC_{21m}$ constituting the second sub-memory unit $SMU_{21}$ contiguous in the direction perpendicular to the paper surface of FIG. 1, and further, it also works as a plate line $PL_{(n-1)M+m}$. The second electrode 33 of the memory cell $MC_{12m}$ constituting the first sub-memory unit $SMU_{12}$ is shared with the second electrode of the memory cell $MC_{21m}$ constituting the second sub-memory unit $SMU_{22}$ contiguous in the direction perpendicular to the paper surface of FIG. 1, and further, it also works as a plate line $PL_{(n-1)M+m}$.

The circuit for providing the reference potential $V_{REF-n}$ ($V_{REF-1}$, $V_{REF-2}$) is constituted of first and second reference capacitors $RC_1$ and $RC_2$ (see FIGS. 2 and 3). These reference capacitors $RC_1$ and $RC_2$ are formed, for example, of MOS capacitors. By optimizing the area of the MOS capacitors, the optimum reference potentials $V_{REF-1}$ and $V_{REF-2}$ can be outputted from the MOS capacitors. The first reference capacitor $RC_1$ is connected to the first bit line $BL_1$ and the second bit line $BL_2$ with a switching circuit $SW_{11}$ and a switching circuit $SW_{21}$ (formed, for example, of MOS FETS), and the second reference capacitor $RC_2$ is connected to the first bit line $BL_1$ and the second bit line $BL_2$ with a switching circuit $SW_{12}$ and a switching circuit $SW_{22}$ (formed, for example, of MOS FETs). FIG. 1 omits showing of the first and second reference capacitors $RC_1$ and $RC_2$ and the switching circuits $SW_{11}$ to $SW_{22}$.

The reference potential may be outputted from a known voltage down converter or a structure in which a plurality of PMOS type FETs are connected in series.

The first transistor for selection $TR_1$ constituting the first memory unit $MU_1$ is connected to the word line $WL_1$, and the second transistor for selection $TR_2$ constituting the second memory unit $MU_2$ is connected to the word line $WL_2$. The memory cells $MC_{1nm}$ and $MC_{2nm}$ are independently controlled. In an actual nonvolatile memory, sets of such memory units for storing 2×N×M bits (specifically 16 bits) each are arranged in the form of an array as access units. The value of M is not limited to 4. The value of M can be any value so long as it satisfies M≧2, and examples of the value of M in actual embodiments include exponents of 2 (2, 4, 8, 16 . . . ). Further, the value of N can be any value so long as it satisfies N≧2, and examples of the value of N in actual embodiment include exponents of 2 (2, 4, 8, . . . ).

A pair of the transistors for selection $TR_1$ and $TR_2$ in the nonvolatile memory occupy a region surrounded by the word line WL and a pair of the bit lines $BL_1$ and $BL_2$. If the word lines and the bit lines are arranged at a smallest pitch, therefore, the pair of the transistors for selection $TR_1$ and $TR_2$ in the nonvolatile memory have a minimum area of $8F^2$. However, a pair of the transistors for selection $TR_1$ and $TR_2$ are shared by an M sets of the memory cells $MC_{11m}$, $MC_{12m}$, $MC_{21m}$ and $MC_{22m}$ (m=1, 2 . . . M), so that the number of the transistors for selection $TR_1$ and $TR_2$ per bit can be decreased. Further, since the word lines are arranged moderately, the nonvolatile memory can be easily decreased in size. Moreover, concerning peripheral circuits, 2×M bits can be selected with one word line decoder/driver WD and the plate line decoder/drivers PD which are M in number. By employing the above constitution, a layout in which the cell area is close to $8F^2$ can be materialized, and a chip size equal to the size of DRAM can be realized.

When data stored in a memory cell is read out, a charge is accumulated in the first and second reference capacitors $RC_1$ and $RC_2$ in advance. Alternatively, when data stored in the memory cell constituting the first memory unit $MU_1$ is read out, a charge may be accumulated in the second reference capacitor $RC_2$ in advance, and when data stored in the memory cell constituting the second memory unit $MU_2$ is read out, a charge may be accumulated in the first reference capacitor $RC_1$ in advance. When the reference capacitors formed of a MOS capacitor each are used in Examples 3 to 5 to be described later, the same operation is also carried out.

When data stored in the memory cell $MC_{11p}$ (p is one of 1, 2, 3 and 4) constituting the first sub-memory unit $SMU_{11}$ is read out, the word line $WL_1$ is selected, and in a state where a voltage of $(1/2)V_{cc}$ is applied to the plate lines connected to the memory cells other than the memory cell $MC_{11p}$, the plate line connected to the memory cell $MC_{11p}$ is driven. The above $V_{cc}$ refers, for example, to a power source voltage. By the above operation, a potential corresponding to data of 1 bit stored in the memory cell $MC_{11p}$ appears in the first bit line $BL_1$ as a bit line potential through the first transistor for selection $TR_1$. And, the switching circuit $SW_{21}$ is brought into an ON-state. By the above operation, the reference potential $V_{REF-1}$ appears in the second bit line $BL_2$ as a bit line potential. And, the voltages (bit line potentials) in a pair of the bit lines $BL_1$ and $BL_2$ are detected with the differential sense amplifier SA.

For example, when data stored in the memory cell $MC_{22p}$ constituting the second sub-memory unit $SMU_{22}$ is read out, the word line $WL_2$ is selected, and in a state where a voltage, for example, of $(1/2)V_{cc}$ is applied to the plate lines connected to the memory cells other than the memory cell $MC_{22p}$, the plate line connected to the memory cell $MC_{22p}$ is driven. By this operation, a potential corresponding to data of 1 bit stored in the memory cell $MC_{22p}$ appears in the second bit line $BL_2$ as a bit line voltage through the second transistor for selection $TR_2$. And, the switching circuit $SW_{12}$ is brought into an ON-state. By the above operation, the reference potential $V_{REF-2}$ appears in the first bit line $BL_1$ as a bit line potential. And, voltages (bit line potentials) in a pair of the bit lines $BL_1$ and $BL_2$ are detected with the differential sense amplifier SA.

The outline of the production method of the nonvolatile memory in Example 1 will be explained below.

[Step-100]

First, MOS type transistors that are to work as the transistors for selection and the transistors constituting the switching circuits $SW_{11}$ to $SW_{22}$ in the nonvolatile memory are formed in a semiconductor substrate 10. For this purpose, for example, a device isolation region 11 having a LOCOS structure is formed by a known method. The device isolation region may have a trench structure or may have a combination of a LOCOS structure and a trench structure. Then, the surface of the semiconductor substrate 10 is oxidized, for example, by a pyrogenic method, to form a gate insulating layer 12. Then, a polysilicon layer doped with an impurity is formed on the entire surface by a CVD method, and patterned to form a gate electrode 13. The gate electrode 13 also works as a word line. The gate electrode 13 may be formed of polycide or metal silicide in place of the polysilicon layer. Then, the semiconductor substrate 10 is ion-implanted, to form an LDD structure. Then, an $SiO_2$ layer is formed on the entire surface by a CVD method, and the $SiO_2$ layer is etched back, to form a gate-sidewalls (not shown) on the side walls of the gate electrode 13. Then, the semiconductor substrate 10 is ion-implanted, and then the impurity introduced by the ion-implantation is activated by annealing, to form the source/drain regions 14A and 14B. During the above steps, the reference capacitors $RC_1$ and $RC_2$ (not shown in FIG. 1) made of MOS capacitors are formed. One electrode of each of the reference capacitors $RC_1$ and $RC_2$ is connected to a power source (not shown). One source/drain region of each transistor constituting the switching circuits $SW_{11}$ to $SW_{22}$ correspond to the other electrode of each of the reference capacitors $RC_1$ and $RC_2$.

[Step-110]

Then, an insulating layer is formed on the entire surface. Specifically, a lower insulating layer (thickness 1 μm) having an $SiO_2$ and SiN stacked structure is formed by a CVD method, and the thus-formed lower insulating layer is flattened by a CMP method, to form a 0.6 μm thick lower insulating layer. Then, opening portions are formed through the lower insulating layer above the other source/drain region 14B and the other source/drain region of each of the transistors constituting the switching circuits $SW_{11}$ to $SW_{22}$ by an RIE method. Then, a polysilicon layer doped with an impurity is formed on the lower insulating layer and the insides of the opening portions by a CVD method. The polysilicon layer is annealed at 850° C. for 30 minutes to activate the impurity contained in the polysilicon layer, whereby a contact hole 15 is obtained. Then, the polysilicon layer on the lower insulating layer is patterned to form the bit line $BL_1$ and a wiring (not shown) for connecting the bit line $BL_1$ and the transistors constituting the switching circuits $S_{11}$ to $SW_{22}$. Then, an upper insulating layer made of $SiO_2$ (thickness 0.4 μm) is formed on the entire surface by a CVD method, and the thus-formed upper insulating layer is flattened by a CMP method to form a 0.2 μm thick upper insulating layer. The upper insulating layer and the upper insulating layer will be collectively referred to as an insulating layer 16. The above bit line $BL_1$ is formed so as not to for a short circuit to a contact hole 18 to be formed at a later step.

Then, an opening portion 17 is formed through the insulating layer 16 above one source/drain region 14A by an RIE method, and then the opening portion 17 is filled with polysilicon doped with an impurity, to complete a contact hole 18. The contact hole 18 can be also formed by filling the opening portion 17 made through the insulating layer 16, for example, with a metal wiring material including a refractory metal and metal silicide such as tungsten, Ti, Pt, Pd, Cu, TiW, TiNW, $WSi_2$ and $MoSi_2$. The top surface of the contact hole 18 may be nearly at the same level as the level of the surface of the insulating layer 16, or the top portion of the contact hole 18 may be extending on the surface of the insulating layer 16. Table 2 below shows conditions of forming the contact hole 18 by filling the opening portion 17 with tungsten. Before filing the opening portion 17 with tungsten, preferably, a Ti layer and a TiN layer (not shown) are consecutively formed on the insulating layer 16 and inside the opening portion 17 by magnetron sputtering methods. The reason for forming the Ti layer and the TiN layer is that an ohmic low contact resistance is obtained, that damage that may be caused on the semiconductor substrate 10 by a blanket tungsten CVD method is prevented, and that the adhesion of tungsten is improved.

TABLE 2

| Sputtering condition for Ti layer (thickness: 20 nm) | |
|---|---|
| Process gas | Ar = 35 sccm |
| Pressure | 0.52 Pa |
| RF power | 2 kW |
| Heating of substrate | No |
| Sputtering condition for Ti layer (thickness: 100 nm) | |
| Process gas | $N_2$/Ar = 100/35 sccm |
| Pressure | 1.0 Pa |
| RF power | 6 kW |
| Heating of substrate | No |
| Tungsten CVD formation condition | |
| Source gas | $WF_6$/$H_2$/Ar = 40/400/2250 sccm |
| Pressure | 10.7 Pa |
| Forming temperature | 450° C. |
| Etching conditions of tungsten layer, TiN layer and Ti layer | |
| Etching on first stage: Etching of tungsten layer | |
| Source gas | $SF_6$/Ar/He = 110:90:5 sccm |
| Pressure | 46 Pa |
| RF power | 275 W |
| Etching on second stage: Etching of TiN layer and Ti layer | |
| Source gas | Ar/$Cl_2$ = 75/5 sccm |
| Pressure | 6.5 Pa |
| RF power | 250 W |

[Step-120]

Then, desirably, an adhesion layer (not shown) made of TiN is formed on the insulating layer 16. Then, a first electrode material layer of Ir for forming the first electrode (lower electrode) 21 is formed on the adhesion layer, for example, by a sputtering method, and the first electrode material layer and the adhesion layer are patterned by photolithography and a dry etching method, whereby the first electrode 21 can be obtained. In steps to be described later, desirably, an adhesion layer is formed on an insulating layer before a first electrode material layer is formed.

The first electrode 21 may have a so-called damascene structure. That is, the first electrode 21 may have a structure in which a circumference thereof is filled with an insulating layer. The ferroelectric layer can be therefore formed on a flat substratum, i.e., on the first electrode and the insulating layer, so that the layers can be flattened and that multi-layered memory cells or sub-memory units can be more easily formed. The top surface of the above insulating layer and the top surface of the first electrode 21 may be at the same level. Otherwise, the top surface of the first electrode may be at a level higher or lower than the level of the above insulating layer.

[Step-130]

Then, a ferroelectric thin film made of a Bi-containing layer-structured perovskite type ferroelectric material (specifically, $Bi_2SrTa_2O_9$ having a crystallization temperature of 750° C.) is formed on the entire surface, for example, by an MOCVD method. The ferroelectric thin film is then dried in air at 250° C. and then heat-treated in an oxygen atmosphere at 750° C. for 1 hour, to promote crystallization.

[Step-140]

Then, an $IrO_{2-X}$ layer and a Pt layer are consecutively formed on the entire surface by sputtering methods, and then the Pt layer, the $IrO_{2-X}$ thin film and the $Bi_2SrTa_2O_9$ thin film are consecutively patterned by photolithography and dry etching methods, to form the second electrode 23 and the ferroelectric layer 22. If the etching damages the ferroelectric layer 22, the ferroelectric layer 22 can be heat-treated at a temperature necessary for restoration from the damage.

[Step-150]

The above step is then followed by
the formation of the insulating layer 26 and flattening thereof,
the formation of the opening portion 27 and the formation of the contact hole 28,
the formation of the first electrode 31, the ferroelectric layer 32 made of $Bi_2Sr(Ta_{1.5}Nb_{0.5})O_9$ having a crystallization temperature of 700° C. and the second electrode 33, and
the formation of the insulation layer 36A.

The heat treatment of the ferroelectric layer 32 made of $Bi_2Sr(Ta_{1.5}Nb_{0.5})O_9$ having a crystallization temperature of 700° C. can be carried out in an oxygen gas atmosphere at 700° C. for 1 hour for promoting the crystallization thereof. Alternatively, the ferroelectric layer 32 may be constituted of the same ferroelectric material as that used for constituting the ferroelectric layer 22.

Alternatively, the second electrodes may be those which do not work as plate lines. In this case, after completion of the insulation layer 36A, the second electrode 23 and the second electrode 33 are connected through a contact hole (viahole) and the plate lines connected to the contact hole are formed on the insulation layer 36A.

The memory cells $MC_{11M}$ constituting the first sub-memory unit $SMU_{11}$ formed on the insulating layer 16 and the memory cells $MC_{21M}$ constituting the second sub-memory unit $SMU_{21}$ formed on the insulating layer 16 undergo the same thermal history with regard to their production processes. That is, they undergo crystallization heat treatment for crystallization of the ferroelectric layers 22. The memory cells $MC_{12M}$ constituting the first sub-memory unit $SMU_{12}$ formed on the insulating layer 26 and the memory cells $MC_{22M}$ constituting the second sub-memory unit $SMU_{22}$ formed on the insulating layer 26 undergo the same thermal history with regard to their production processes. That is, they undergo crystallization heat treatment for crystallization of the ferroelectric layers 32. However, the memory cells constituting the first and second sub-memory units of the n-th layer are provided with the reference potential different from the reference potential provided to the memory cells constituting the first and second sub-memory units of the k-th layer (k≠n), so that optimum reference potentials can be provided to the bit lines even if memory cell groups having different thermal histories with regard to their production processes are included, and that there is caused almost no difference in bit line potentials that appear in the bit lines.

The following Table 3 shows a condition of forming a ferroelectric thin film made, for example, of $Bi_2SrTa_2O_9$. In Table 3, "thd" stands for tetramethylheptanedionate. Further, source materials shown in Table 3 are in the form of a solution thereof in a solvent containing tetrahydrofuran (THF) as a main component.

TABLE 3

Formation by MOCVD method

| | |
|---|---|
| Source materials | $Sr(thd)_2$-tetraglyme |
| | $Bi(C_6H_5)_3$ |
| | $Ta(O\text{-}iC_3H_7)_4(thd)$ |
| Forming temperature | 400–700° C. |
| Process gas | $Ar/O_2 = 1000/1000$ cm$^3$ |
| Forming rate | 5–20 nm/minute |

Alternatively, a ferroelectric thin film made of $Bi_2SrTa_2O_9$ can be formed on the entire surface by a pulse laser abrasion method, a sol-gel method or an RF sputtering method as well. Examples of forming conditions in these cases are shown below. When the ferroelectric thin film having a large thickness is formed by a sol-gel method, spin coating and drying can be repeated as required, or spin coating and calcining (or annealing) can be repeated as required.

TABLE 4

Formation by pulse laser abrasion method

| | |
|---|---|
| Target | $Bi_2SrTa_2O_9$ |
| Laser used | KrF Excimer laser (wavelength 248 nm, pulse width 25 nanoseconds, 5 Hz) |
| Forming temperature | 400–800° C. |
| Oxygen concentration | 3 Pa |

TABLE 5

Formation by sol-gel method

| | |
|---|---|
| Source materials | $Bi(CH_3(CH_2)_3CH(C_2H_5)COO)_3$ [Bismuth·2-ethylhexanoic acid, $Bi(OOc)_3$] |
| | $Sr(CH_3(CH_2)_3CH(C_2H_5)COO)_2$ [Strontium.2-ethylhexanoic acid, $Sr(OOc)_2$] |
| | $Ta(OEt)_5$ [Tantalum ethoxide] |
| Spin coating condition | 3000 rpm × 20 seconds |
| Drying | 250° C. × 7 minutes |
| Calcining | 700–800° C. × 1 hour (RTA treatment added as required) |

TABLE 6

Formation by RF sputtering method

| | |
|---|---|
| Target | $Bi_2SrTa_2O_9$ ceramic target |
| RF power | 1.2 W–2.0 W/target 1 cm$^2$ |
| Ambient pressure | 0.2–1.3 Pa |
| Forming temperature | Room temperature–600° C. |
| Process gas | $Ar/O_2$ flow rate = 2/1–9/1 |

The following Table 7 shows a condition of forming PZT or PLZT when a ferroelectric layer is formed of PZT or PLZT by a magnetron sputtering method. Otherwise, PZT or PLZT can be formed by a reactive sputtering method, an electron beam deposition method, a sol-gel method or an MOCVD method.

TABLE 7

| | |
|---|---|
| Target | PZT or PLZT |
| Process gas | Ar/O$_2$ = 90 vol %/10 vol % |
| Pressure | 4 Pa |
| Power | 50 W |
| Forming temperature | 500° C. |

PZT or PLZT can be formed by a pulse laser abrasion method as well. Table 8 shows a forming condition in this case.

TABLE 8

| | |
|---|---|
| Target | PZT or PLZT |
| Laser used | KrF Excimer laser (wavelength 248 nm, pulse width 25 nanoseconds, 3 Hz) |
| Output energy | 400 mJ (1.1 J/cm$^2$) |
| Forming temperature | 550–600° C. |
| Oxygen concentration | 40–120 Pa |

EXAMPLE 2

Example 2 is a variant of Example 1. In Example 1, the circuit for providing the reference potentials $V_{REFF-1}$ and $V_{REF-2}$ is constituted of the first and second reference capacitors $RC_1$ and $RC_2$ formed of MOS capacitors. In Example 2, the circuit for providing the reference potential $V_{REF-1}$ is constituted of first reference capacitors $RC_{A1}$ and $RC_{B1}$ made of a ferroelectric capacitor each, and the circuit for providing the reference potential $V_{REF-2}$ is constituted of second reference capacitors $RC_{A2}$ and $RC_{B2}$ made of a ferroelectric capacitor each.

Figure 4:
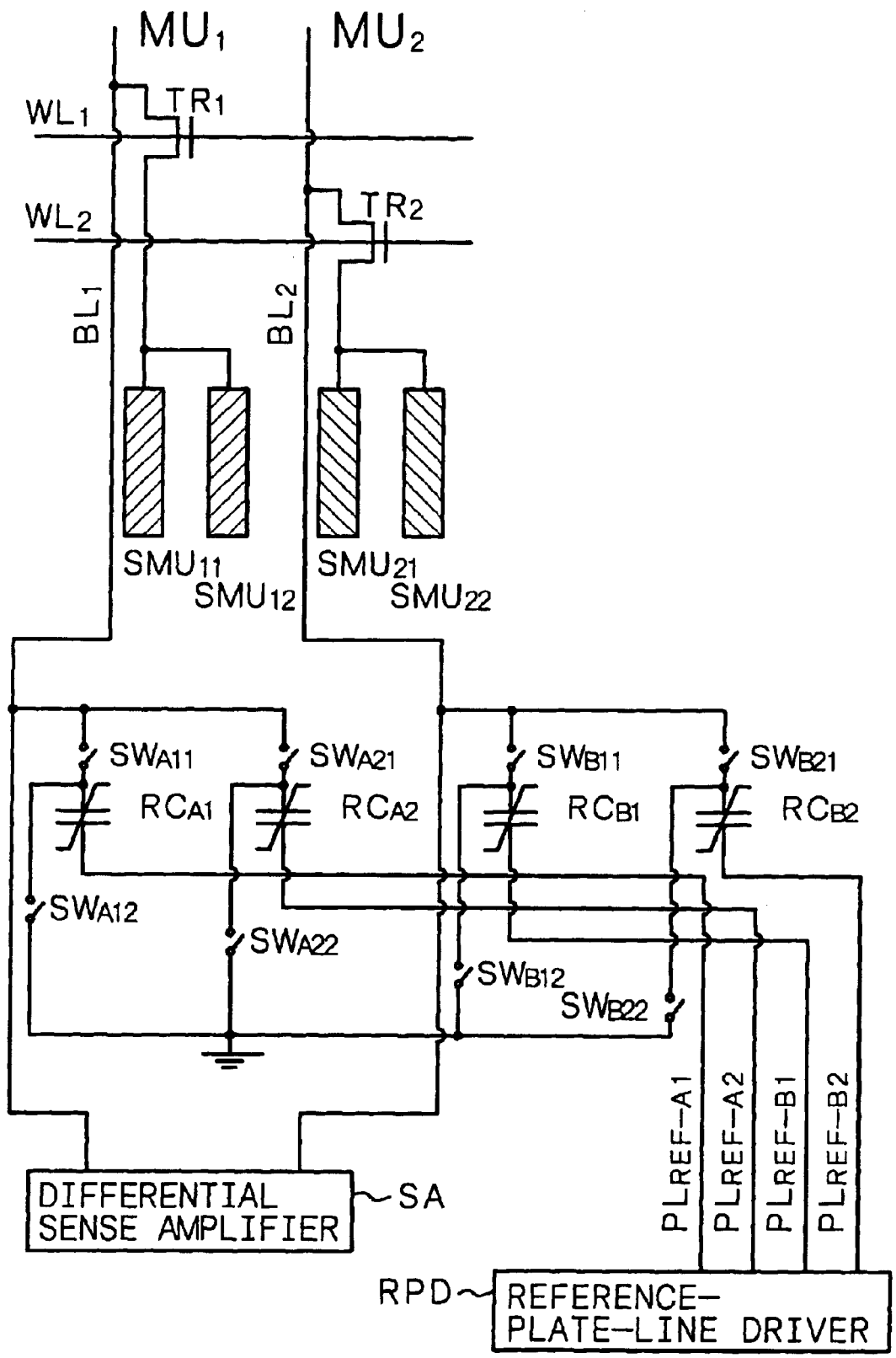
FIG. 4 is a conceptual circuit diagram of a ferroelectric-type nonvolatile semiconductor memory according to the second aspect of the present invention and in Example 2.

FIG. 4 shows a conceptual circuit diagram of the nonvolatile memory in Example 2. A more specific circuit diagram of the conceptual circuit diagram shown in FIG. 4 can be the same as the circuit diagram shown in FIG. 3 except for portions of the reference capacitors $RC_{A1}$, $RC_{B1}$, $RC_{A2}$ and $RC_{B2}$ made of a ferroelectric capacitor each, so that showing thereof is omitted.

The first and second reference capacitors $RC_{A1}$, $RC_{B1}$, $RC_{A2}$ and $RC_{B2}$ have substantially the same structure as that of the memory cells. That is, each of the first reference capacitors $RC_{A1}$ and $RC_{B1}$ comprises a first electrode formed on the insulating layer 16, a ferroelectric layer and a second electrode. Each of the second reference capacitors $RC_{A2}$ and $RC_{B2}$ comprises a first electrode formed on the insulating layer 26, a ferroelectric layer and a second electrode. The nonvolatile memory in Example 2 can be produced in the same manner as in the production of the nonvolatile memory in Example 1 except that no MOS capacitors are formed in [Step-100] in Example 1, that the first reference capacitors $RC_{A1}$ and $RC_{B1}$ are formed concurrently with the memory cells $MC_{1m}$ and $MC_{21m}$, and that the second reference capacitors $RC_{A2}$ and $RC_{B2}$ are formed concurrently with the memory cells $MC_{12m}$ and $MC_{22m}$, so that a detailed explanation thereof is omitted.

The first electrode constituting the first reference capacitor $RC_{A1}$ formed of a ferroelectric capacitor is connected to the first bit line $BL_1$ through a switching circuit $SW_{A11}$ and further is grounded through a switching circuit $SWA_{12}$. Alternatively, the first electrode may be connected to a reference-plate-line driver RPD through a switching circuit. This is also applicable in reference capacitors to be explained below. The first electrode constituting the second reference capacitor $RC_{A2}$ formed of a ferroelectric capacitor is connected to the first bit line $BL_1$ through a switching circuit $SW_{A21}$ and further is grounded through a switching circuit $SW_{A22}$. The first electrode constituting the first reference capacitor $RC_{B1}$ formed of a ferroelectric capacitor is connected to the second bit line $BL_2$ through a switching circuit $SWB_{11}$, and further is grounded through a switching circuit $SW_{B12}$. The first electrode constituting the second reference capacitor $RC_{B2}$ formed of a ferroelectric capacitor is connected to the second bit line $BL_2$ through a switching circuit $SW_{B21}$, and further is grounded through a switching circuit $SW_{B22}$. The second electrodes constituting the reference capacitors $RC_{A1}$, $RC_{B1}$, $RC_{A2}$ and $RC_{B2}$ are connected to reference-plate lines $PL_{REF-A1}$, $PL_{REF-A2}$, $PL_{REF-B1}$ and $PL_{REF-B2}$, respectively, and these reference-plate lines are connected to a reference-plate-line driver RPD. The areas of the first reference capacitors $RC_{A1}$ and $RC_{B1}$ and the second reference capacitors $RC_{A2}$ and $RC_{B2}$ are optimized, whereby optimum reference potentials $V_{REF-1}$ and $V_{REF-2}$ can be outputted from the reference capacitors $RC_{A1}$, $RC_{B1}$, $RC_{A2}$ and $RC_{B2}$.

When data is read out from the memory cell, the switching circuits $SW_{A12}$, $SW_{A22}$, $SW_{B12}$ and $SW_{B22}$ are brought into an ON-state in advance, the first electrodes constituting the reference capacitors $RC_{A1}$, $RC_{A2}$, $RC_{B1}$ and $RC_{B2}$ are grounded, and predetermined potentials are provided to the reference-plate lines $PL_{REF-A1}$, $PL_{REF-A2}$, $PL_{REF-B1}$ and $PL_{REF-B2}$ from the reference-plate-line driver RPD. As a result, charges are accumulated in the ferroelectric layers constituting the reference capacitors $RC_{A1}$, $RC_{A2}$, $RC_{B1}$ and $RC_{B2}$. The accumulated charge amount is defined by the areas of the first reference capacitors $RC_{A1}$, and $RC_{B1}$ and the second reference capacitors $RC_{A2}$ and $RC_{B2}$.

When data stored, for example, in the memory cell $MC_{11p}$ (p is one of 1, 2, 3 and 4) constituting the first sub-memory unit $SMU_{11}$ is read out, the word line $WL_1$ is selected, and in a state where a voltage, for example, of $(1/2)_{Vcc}$ is applied to the plate lines connected to the memory cells other than the memory cell $MC_{11p}$, the plate line to which the memory cell $MC_{11p}$ is connected is driven. By the above operation, a potential corresponding to data of 1 bit stored in the memory cell $MC_{11p}$ appears in the first bit line $BL_1$ as a bit line potential through the first transistor for selection $TR_1$. And, in a state where a proper electric field is applied to the ferroelectric layer of the reference capacitor $RC_{B1}$ from the second electrode thereof, the switching circuit $SW_{B11}$ is brought into an ON-state. By the above operation, the reference potential $V_{REF-1}$ based on the amount of charge accumulated in the first reference capacitor $RC_{B1}$ appears in the second bit line $BL_2$ as a bit line potential. And, the voltages (bit line potentials) in the bit lines $BL_1$ and $BL_2$ forming a pair are detected with the differential sense amplifier SA.

When data stored, for example, in the memory cell $MC_{22p}$ constituting the second sub-memory unit $SMU_{22}$ is read out, the word line $WL_2$ is selected, and in a state where a voltage, for example, of $(1/2)_{Vcc}$ is applied to the plate lines connected to the memory cells other than the memory cell $MC_{22p}$, the plate line to which the memory cell $MC_{22p}$ is connected is driven. By the above operation, a potential corresponding to data of 1 bit stored in the memory cell $MC_{22p}$ appears in the second bit line $BL_2$ as a bit line potential through the second transistor for selection $TR_2$. And, in a state where a proper electric field is applied to the ferroelectric layer of the reference capacitor $RC_{A2}$ from the second electrode thereof, the switching circuit $SW_{A21}$ is brought into an ON-state. By the above operation, a reference potential $V_{REF-2}$ based on the amount of charge accumulated in the second reference capacitor $RC_{A2}$ appears in the first bit line $BL_1$ as a bit line potential. And, the voltages (bit line potentials) in the bit lines $BL_1$ and $BL_2$ forming a pair are detected with the differential sense amplifier SA.

Figure 5:
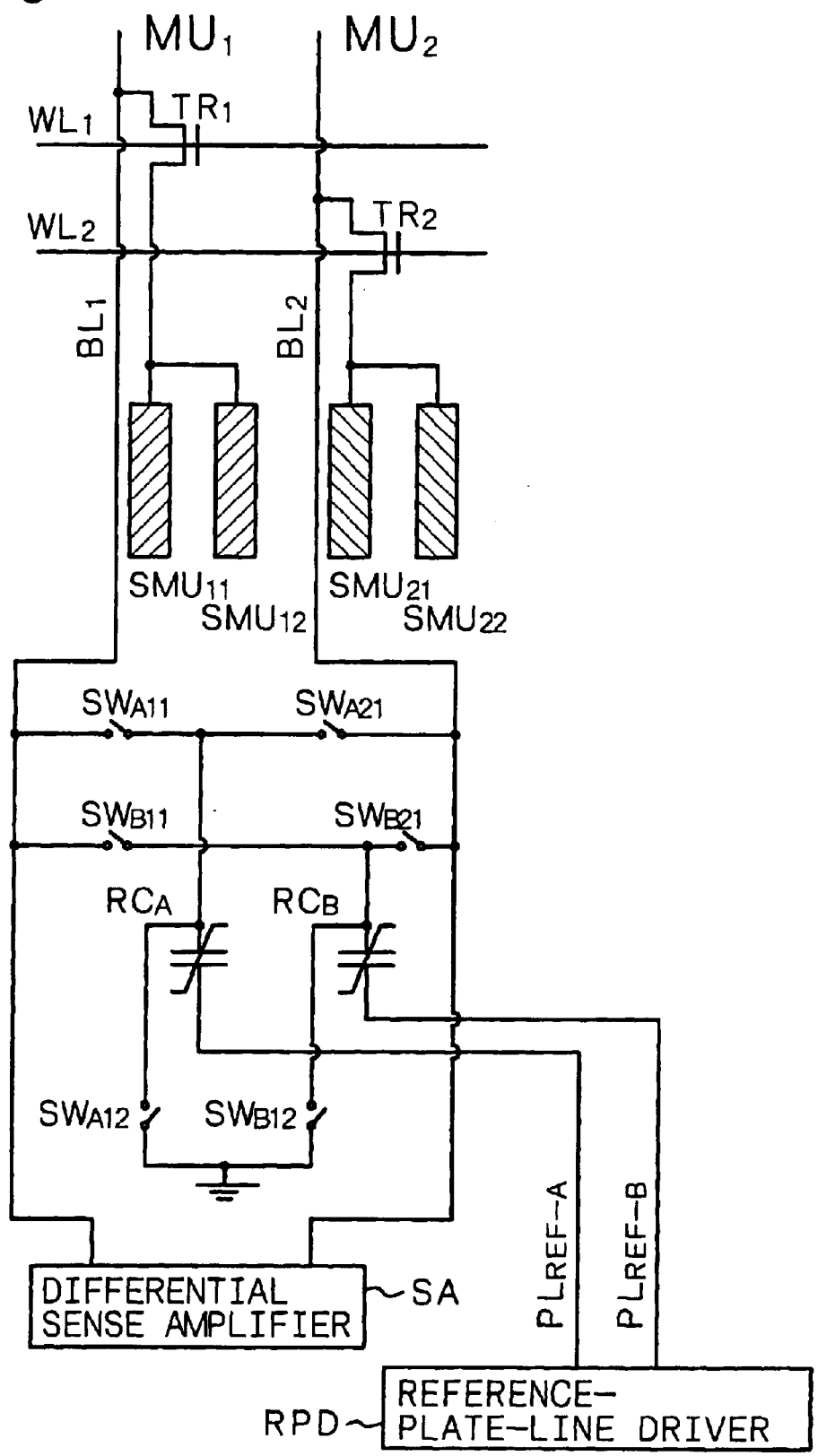
FIG. 5 is a conceptual circuit diagram of a variant of the ferroelectric-type nonvolatile semiconductor memory according to the second aspect of the present invention and in Example 2.

As a circuit diagram is shown in FIG. 5, the circuit for providing the reference potential $V_{REF-1}$ may be constituted of a first reference capacitor $RC_A$ formed of a ferroelectric capacitor, and the circuit for providing the reference potential $V_{REF-2}$ may be constituted of a second reference capacitor $RC_B$ formed of a ferroelectric capacitor. In this case, the first electrode constituting the first reference capacitor $RC_A$ formed of a ferroelectric capacitor is connected to the first bit line $BL_1$ through the switching circuit $SW_{A11}$, is connected to the second bit line $BL_2$ through the switching circuit $SW_{A21}$, and further, is grounded through the switching circuit $SW_{A12}$. The first electrode constituting the second reference capacitor $RC_B$ formed of a ferroelectric capacitor is connected to the first bit line $BL_1$ through the switching circuit $SW_{B11}$, is connected to the second bit line $BL_2$ through the switching circuit $SW_{B21}$, and further, is grounded through the switching circuit $SW_{B12}$. The second electrodes constituting the reference capacitors $RC_A$ and $RC_B$ are connected to the reference-plate lines $PL_{REF-A}$ and $PL_{REF-B}$, respectively, and these reference-plate lines are connected to the reference-plate-line driver RPD. The areas of the reference capacitors $RC_A$ and $RC_B$ are optimized, whereby the optimum reference potentials $V_{REF-1}$ and $V_{REF-2}$ can be outputted from the reference capacitors $RC_A$ and $RC_B$.

EXAMPLE 3

Figure 6:
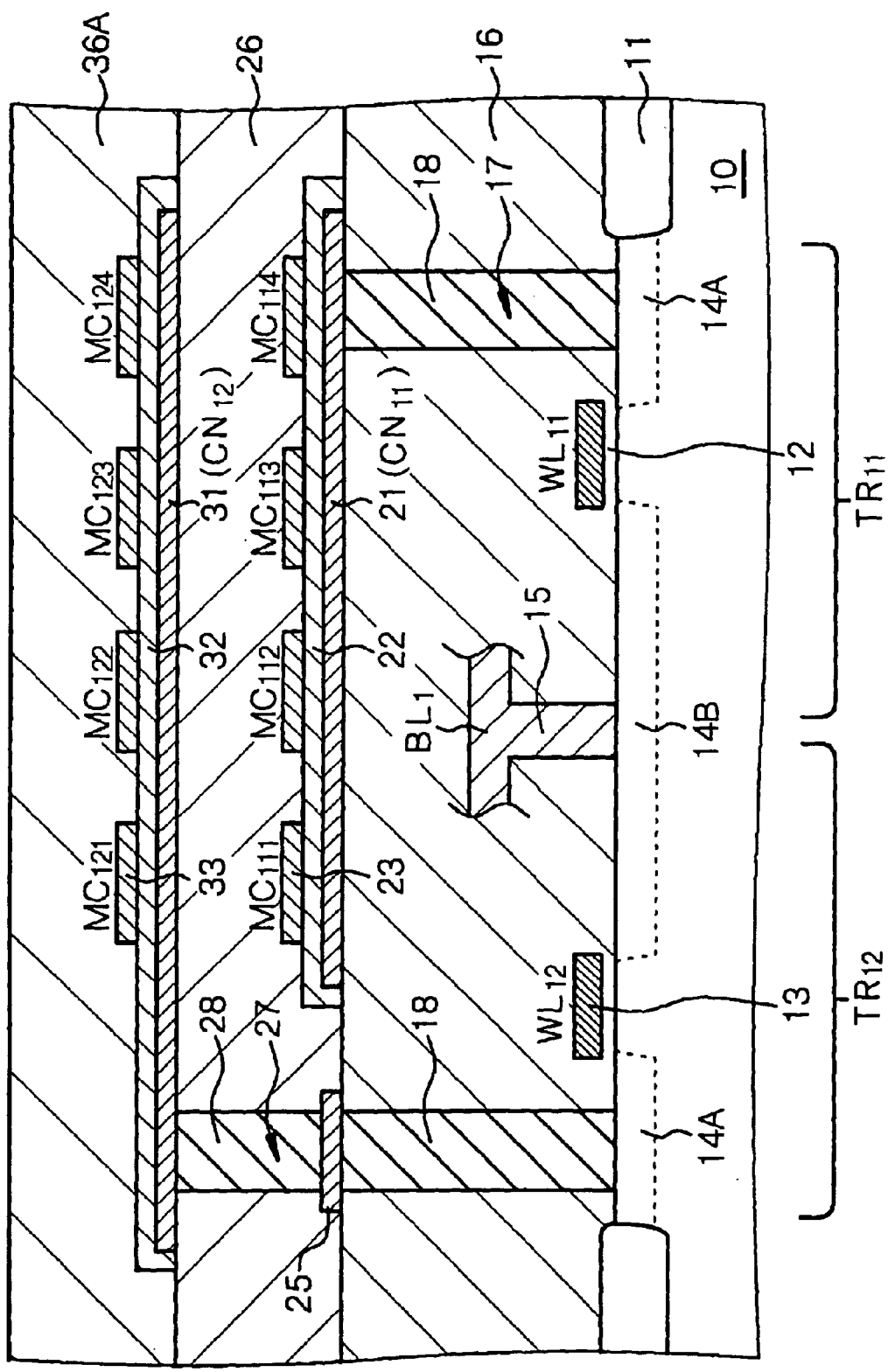
FIG. 6 is a schematic partial cross-sectional view of one memory unit obtained when a ferroelectric-type nonvolatile semiconductor memory in Example 3 is cut through an imaginary vertical plane that is in parallel with the extending direction of a bit line.
Figure 7:
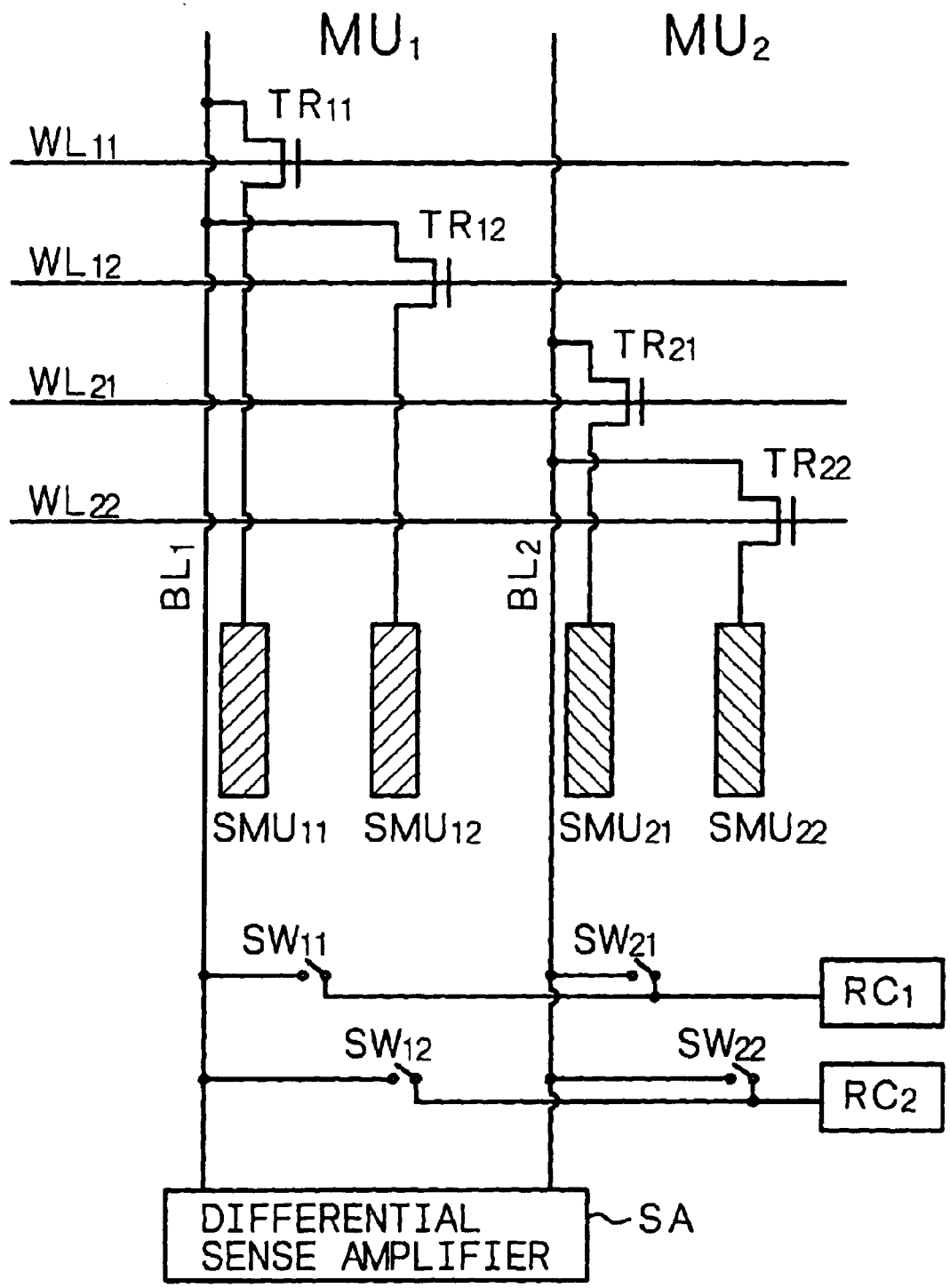
FIG. 7 is a conceptual circuit diagram of a ferroelectric-type nonvolatile semiconductor memory according to the third aspect of the present invention and in Example 3.
Figure 8:
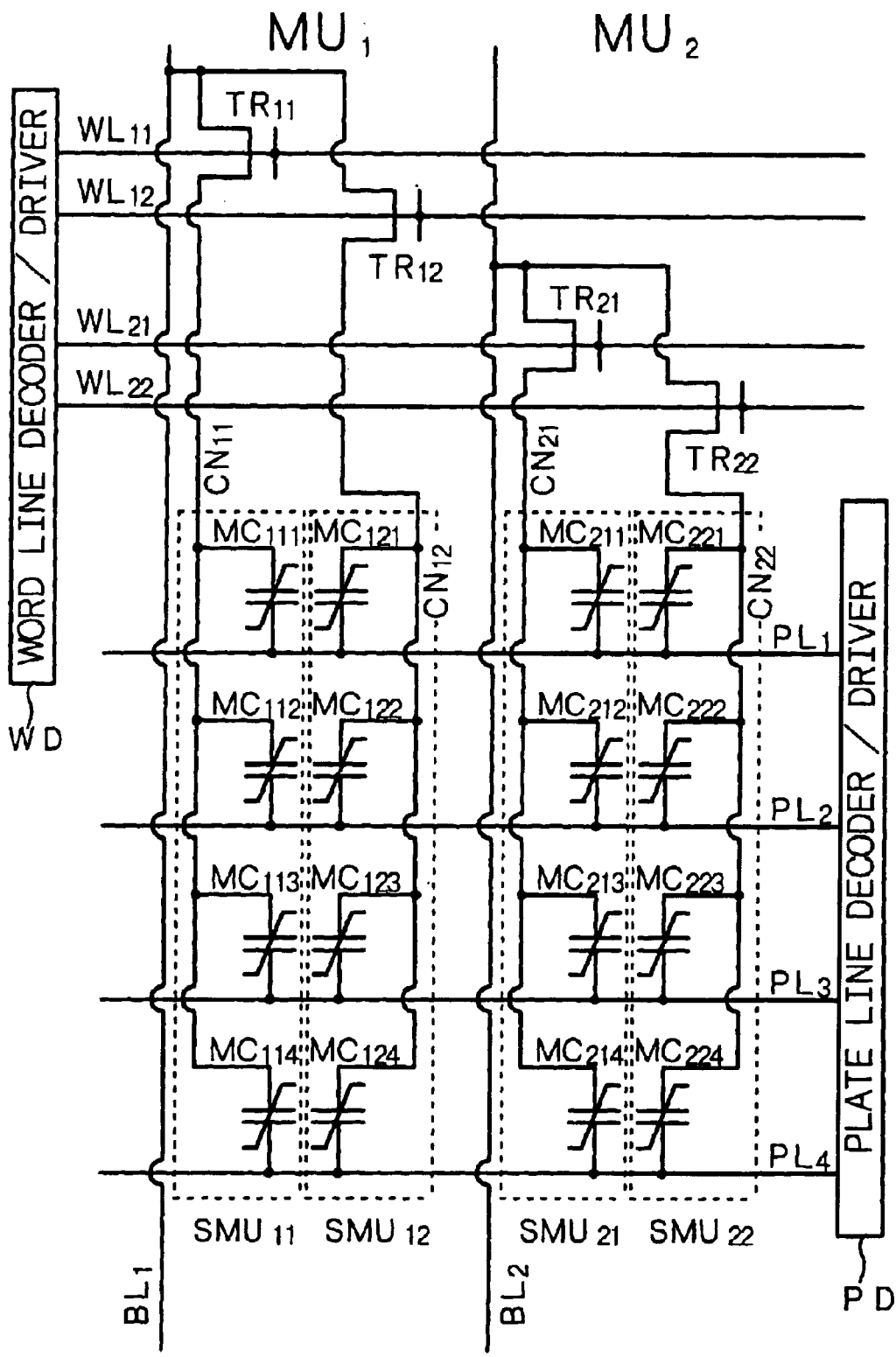
FIG. 8 is a more specific circuit diagram of the conceptual circuit diagram shown in FIG. 7.

Example 3 is concerned with the nonvolatile memory according to the first and third aspects of the present invention. FIG. 6 shows a schematic partial cross-sectional view of the nonvolatile memory of Example 3 taken by cutting part of the nonvolatile memory through an imaginary perpendicular plane in parallel with the extending direction of a bit line. FIG. 7 shows a conceptual circuit diagram of the nonvolatile memory according to the third aspect of the present invention, and FIG. 8 shows a more specific circuit diagram of the conceptual circuit diagram of FIG. 7. While a first sub-memory unit is shown in FIG. 6, a second sub-memory unit also has a similar structure and the second sub-memory unit is formed side by side with the first sub-memory unit in the direction perpendicular to the paper surface of FIG. 6. The following explanation addresses the first sub-memory unit alone in some cases. FIG. 8 omits showing of a circuit for generating a reference potential and a differential sense amplifier.

The nonvolatile memory in Example 3 comprises a first memory unit $MU_1$ and a second memory unit $MU_2$.

The first memory unit $MU_1$ has;

(A-1) a first bit line $BL_1$, (B-1) first transistors for selection $TR_{1N}$ which are N in number ($N \geq 2$; N=2 in Example 3), (C-1) first sub-memory units $SMU_{1N}$ which are N in number and each of which is composed of memory cells $MC_{11M}$ and $MC_{12M}$ which are M in number ($M \geq 2$; M=4 in Example 3), and (D-1) plate lines PLM which are M in number and each of which is shared with each memory cell constituting each of the first sub-memory units $SMU_{1N}$ which are N in number, between or among the first sub-memory units which are N in number.

The second memory unit has;

(A-2) a second bit line $BL_2$, (B-2) second transistors for selection $TR_{2N}$ which are N in number, (C-2) second sub-memory units $SMU_{2N}$ which are N in number and each of which is composed of memory cells $MC_{21M}$ and $MC_{22M}$ which are M in number, and (D-2) the plate lines $PL_M$ which are M in number, each of which is shared with each memory cell constituting each of the second sum-memory units which are N in number, between or among the second sub-memory units which are N in number, and which are shared with the plate lines which are M in number and constitute said first memory unit.

The first sub-memory unit of an n-th layer (n=1, 2 . . . N) $SMU_{1n}$ and the second sub-memory unit of the n-th layer $SMU_{2n}$ are formed on the same insulating layer 16 or 26, and the first sub-memory unit of an n'-th layer (n'=2 . . . N) $SMU_{1n'}$ and the second sub-memory unit of the n'-th layer $SMU_{2nm'}$ are stacked on the first sub-memory unit of the (n'–1)-th layer $SMU_{1(n'-1)}$ and the second sub-memory unit of the (n'–1)-th layer $SMU_{2(n'-1)}$ through the insulating layer 26.

Each of the memory cells $MC_{11m}$ and $MC_{21m}$ and the memory cells $MC_{12m}$ and $MC_{22m}$ comprises a first electrode 21 or 31, a ferroelectric layer 22 or 32 and a second electrode 23 or 33.

In the first memory unit $MU_1$, the first electrodes of the memory cells $MC_{1nm}$ constituting the first sub-memory unit of the n-th layer $SMU_{1n}$ are in common with the first sub-memory unit of the n-th layer $SMU_{1n}$, the common first electrode is connected to the first bit line $BL_1$ through the n-th-place first transistor for selection $TR_{1n}$, and the second electrode of the memory cell $MC_{1nm}$ in the m-th-place (m=1, 2 . . . M) is connected to the common plate line $PL_m$ in the m-th-place. Specifically, the first electrodes 21 (which will be sometimes referred to as "common node $CN_{11}$") of the memory cells $MC_{11m}$ constituting the first sub-memory unit of the first layer $SMU_{11}$ are in common with the first sub-memory unit of the first layer $SMU_{11}$, the common first electrode 21 (common node $CN_{11}$) is connected to the first bit line $BL_1$ through the first-place first transistor for selection $TR_{11}$, and the second electrode 21 of the memory cell $MC_{11m}$ in the m-th-place is connected to the common plate line $PL_m$ in the m-th-place. The first electrodes 31 (which will be sometimes referred to as "common node $CN_{12}$") of the memory cells $MC_{12m}$ constituting the first sub-memory unit of the second layer $SMU_{12}$ are in common with the first sub-memory unit of the second layer $SMU_{12}$, the common first electrode 31 (common node $CN_{12}$) is connected to the first bit line $BL_1$ through the second-place first transistor for selection $TR_{12}$, and the second electrode 33 of the memory cell $MC_{12m}$ in the m-th-place is connected to the common plate line $PL_m$ in the m-th-place. The plate line $PL_m$ is also connected to the second electrodes 23 and 33 of the memory cells constituting the second memory unit $MU_2$. In Example 3, more specifically, the plate lines are extending from the second electrodes 23 and 33. The plate lines $PL_m$ are inter-connected in a region not shown.

In the second memory unit $MU_2$, the first electrodes of the memory cells $MC_{2nm}$ constituting the second sub-memory unit of an n-th layer $SMU_{2n}$ are in common with the second sub-memory unit of the n-th layer $SMU_{2n}$, the common first electrode is connected to the second bit line $BL_2$ through an n-th-place second transistor for selection $TR_{2n}$, and the second electrode of the memory cell $MC_{2nm}$ in the m-th-place is connected to the common plate line $PL_m$ in the m-th-place. Specifically, the first electrodes 21 (which will be sometimes referred to as "common node $CN_{21}$") of the memory cells $MC_{21m}$ constituting the second sub-memory unit of the first layer $SMU_{21}$ are in common with the second sub-memory unit of the first layer $SMU_{21}$, the common first electrode 21 (common node $CN_{21}$) is connected to the second bit line $BL_2$ through the first-place second transistor for selection $TR_{21}$, and the second electrode 23 of the memory cell $MC_{21m}$ in the m-th-place is connected to the common plate line $PL_m$ in the m-th-place. The first electrodes 31 (which will be sometimes referred to as "common node $CN_{22}$") of the memory cells $MC_{22m}$ constituting the second sub-memory unit of the second layer $SMU_{22}$ are in common with the second sub-memory unit of the second layer $SMU_{22}$, the common first electrode 31 (common node $CN_{22}$) is connected to the second bit line $BL_2$ through the second-place second transistor for selection $TR_{22}$, and the second electrode 33 of the memory cell $MC_{22m}$ in the m-th-place is connected to the common plate line in the m-th-place.

The memory cells $MC_{1nm}$ constituting the first sub-memory unit of the n-th layer $SMU_{1n}$ and the memory cells $MC_{2nm}$ constituting the second sub-memory unit of the n-th layer $SMU_{2n}$ have the same thermal history with regard to their production processes. The memory cells cell $MC_{1nm}$ constituting the first sub-memory unit of the n-th layer $SMU_{1n}$ and the memory cells $MC_{2nm}$ constituting the second sub-memory unit of the n-th layer $SMU_{2n}$ have a thermal history different from a thermal history of the memory cell $MC_{1km}$ constituting the first sub-memory unit of a k-th layer (k≠n) $SMU_{1k}$ and the memory cells $MC_{2km}$ constituting the second sub-memory unit of the k-th layer $SMU_{2k}$.

The memory cell $MC_{1nm}$ in the m-th-place constituting the first sub-memory unit of the n-th layer $SMU_{1n}$ in the first memory unit $MU_1$ and the memory cell $MC_{2nm}$ in the m-th-place constituting second sub-memory unit of the n-th layer $SMU_{2n}$ in the second memory unit $MU_2$ form a pair to store data of 1 bit each. When data stored in the memory cell $MC_{1nm}$ constituting the first sub-memory unit of the n-th layer $SMU_{1n}$ in the first memory unit $MU_1$ is read out, a reference potential $V_{REF-n}$ having an n-th potential is provided to the second bit line $BL_2$, and when data stored in the memory cell $MC_{2nm}$ constituting second sub-memory unit of the n-th layer $SMU_{2n}$ in the second memory unit $MU_2$ is read out, a reference potential $V_{REF-n}$ having the n-th potential is provided to the first bit line $BL_1$. The n-th potential differs from the k-th potential (k≠n).

The other source/drain region 14B of each of the first-place and second-place first transistors for selection $TR_{11}$ and $TR_{12}$ is connected to the first bit line $BL_1$ through a contact hole 15. One source/drain region 14A of the first-place first transistor for selection $TR_{11}$ is connected to the common first electrode 21 (first common node $CN_{11}$) in the first sub-memory unit of the first layer $SMU_{11}$ through a contact hole 18 (which will be referred to as "contact hole 18 of the first layer) formed through the insulating layer 16. One source/drain region 14A of the second-place first transistor for selection $TR_{12}$ is connected to the common first electrode 31 (second common node $CN_{12}$) in the first sub-memory unit of the second layer $SMU_{12}$ through a contact hole 18 of the first layer formed through the insulating layer 16, a pad portion 25 and a contact hole 28 (which will be referred to as "contact hole 28 of the second layer") formed in an opening portion 27 made in an insulating layer 26. In the drawing, reference numeral 36A indicates an insulation layer.

The bit lines $BL_1$ and $BL_2$ are connected to the differential sense amplifier SA. The plate line $PL_m$ is connected to the plate line decoder/driver PD. Word lines $WL_{11}$, $WL_{12}$, $WL_{21}$ and $WL_{22}$ are connected to the word line decoder/driver WD. The word lines $WL_{11}$, $WL_{12}$, $WL_{21}$ and $WL_{22}$ are extending in the direction perpendicular to the paper surface of FIG. 6. The second electrode 23 of the memory cell $MC_{11m}$ constituting the first sub-memory unit $SMU_{11}$ is shared with the second electrode of the memory cell $MC_{21m}$ constituting the second sub-memory unit $SMU_{21}$ contiguous thereto in the direction perpendicular to the paper surface of FIG. 6, and the second electrode 23 also works as a plate line $PL_m$. The second electrode 33 of the memory cell $MC_{12m}$ constituting the first sub-memory unit $SMU_{12}$ is shared with the second electrode of the memory cell $MC_{22m}$ constituting the second sub-memory unit $SMU_{22}$ contiguous thereof in the direction perpendicular to the paper surface of FIG. 6, and the second electrode 33 also works as a plate line $PL_m$.

Figure 9:
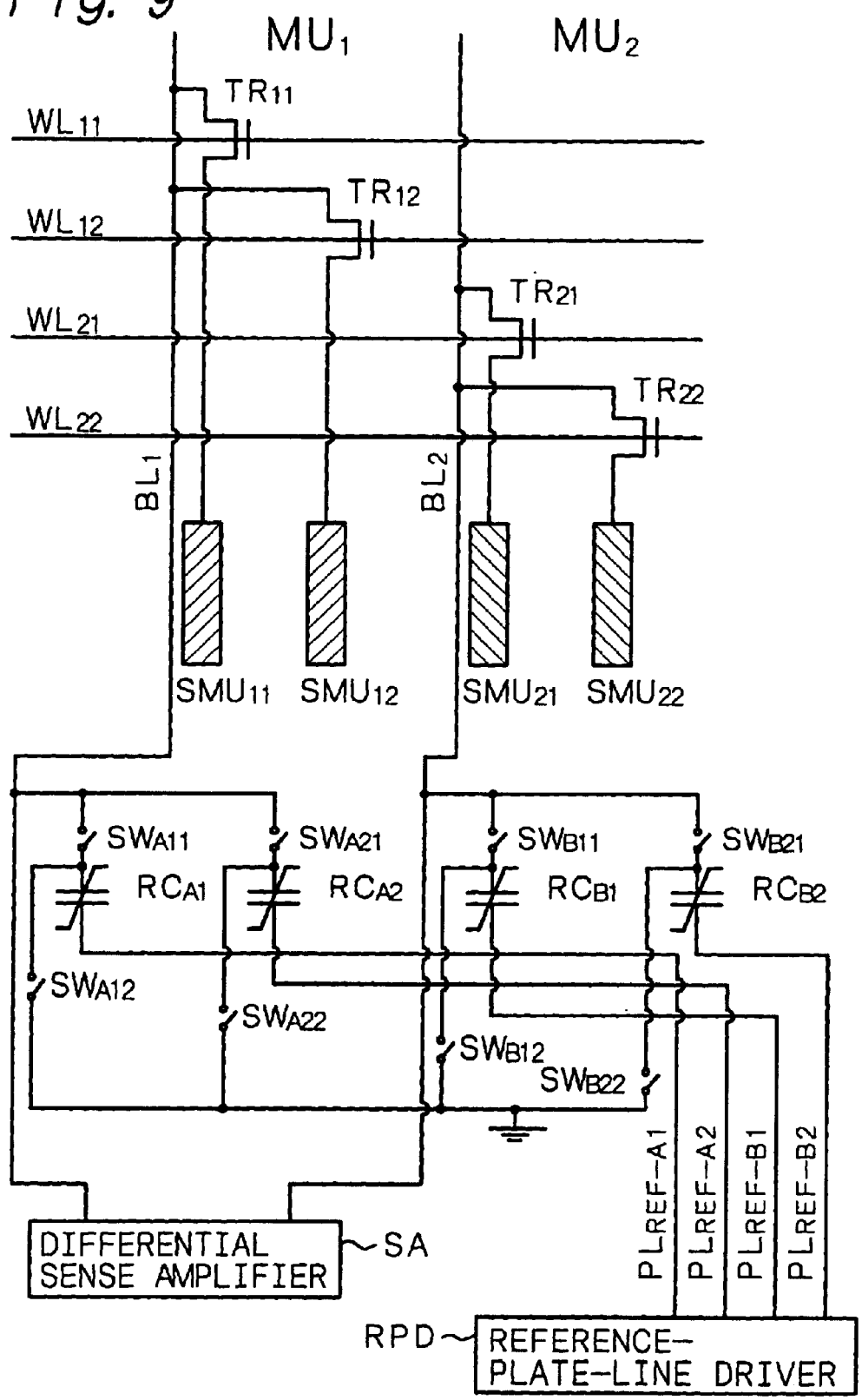
FIG. 9 is a conceptual circuit diagram of a variant of the ferroelectric-type nonvolatile semiconductor memory according to the third aspect of the present invention and in Example 3.
Figure 10:
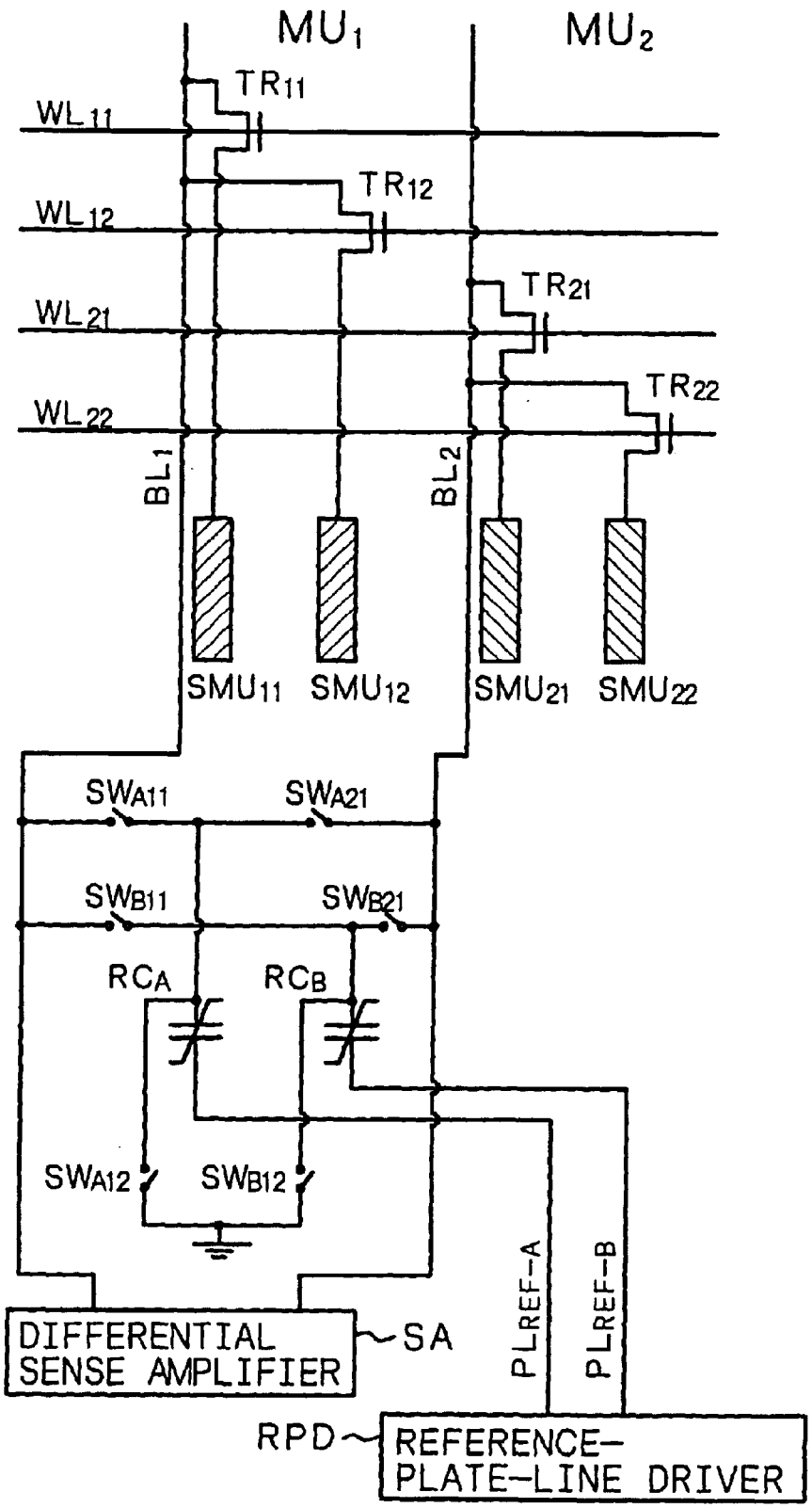
FIG. 10 is a conceptual circuit diagram of another variant of the ferroelectric-type nonvolatile semiconductor memory according to the third aspect of the present invention and in Example 3.

The circuit for providing the reference potentials $V_{REF-1}$ and $V_{REF-2}$ may be constituted of first and second reference capacitors $RC_1$ and $RC_2$ (not shown in FIG. 6) made of MOS capacitors like Example 1 (see the circuit diagram of FIG. 7), may comprise first and second reference capacitors $RC_{A1}$, $RC_{A2}$, $RC_{B1}$ and $RC_{B2}$ made of a ferroelectric capacitor each like Example 2 (see the circuit diagram of FIG. 9), or may be constituted of first and second reference capacitors $RC_A$ and $RC_B$ made of a ferroelectric capacitor each (see the circuit diagram of FIG. 10). Alternatively, the referential potential may be outputted from a known voltage down converter or a structure in which a plurality of PMOS FETs are connected in series.

The first transistors for selection $TR_{11}$ and $TR_{12}$ constituting the first memory unit $MU_1$ are connected to the word line $WL_{11}$ and $WL_{12}$, respectively, the second transistors for selection $TR_{21}$ and $TR_{22}$ constituting the second memory unit $MU_2$ are connected to the word line $WL_{21}$ and $WL_{22}$, respectively, and the memory cells $MC_{1nm}$ and $MC_{2nm}$ are independently controlled. In the nonvolatile memory in an actual embodiment, sets of such memory units for storing 2×N×M bits (specifically, 16 bits) each are arranged in the form of an array as access units. The value of M shall not be limited to 4. It is sufficient to satisfy M≧2, and the actual value of M includes exponents of 2 (2, 4, 8, 16 . . . ). Further, it is sufficient to satisfy N≧2, and the actual value of N includes exponents of 2 (2, 4, 8 . . . ).

When the above circuit is constituted of the first and second reference capacitors $RC_1$ and $RC_2$ made of MOS capacitors, and for example, when data stored in the memory cell $MC_{11p}$ constituting the first sub-memory unit $SMU_{11}$ is read out, the word line $WL_{11}$ is selected, and in a state where a voltage, for example, of (1/2) $V_{cc}$ is applied to the plate line $PL_j$ (j≠p), the plate line $PL_p$ is driven. The above $V_{cc}$ refers, for example, to a power source voltage. By this operation, a potential corresponding to data of 1 bit stored in the memory cell $MC_{11p}$ appears in the first bit line $BL_1$ as a bit line potential through the first-place first transistor for selection $TR_{11}$. And, the switching circuit $SW_{21}$ is brought into an ON-state. By this operation, the reference potential $V_{REF-1}$ appears in the second bit line $BL_2$ as a bit line potential. And, the voltages (bit line potentials) in the above bit lines $BL_1$ and $BL_2$ forming a pair are detected with the differential sense amplifier SA.

When data stored, for example, in the memory cell $MC_{22p}$ constituting the second sub-memory unit $SMU_{22}$ is read out, the word line $WL_{22}$ is selected, and in a state where a voltage, for example, of (1/2) $V_{cc}$ is applied to the plate line $PL_j$ (j≠p), the plate line $PL_p$ is driven. By this operation, a potential corresponding to data of 1 bit stored in the memory cell $MC_{22p}$ appears in the second bit line $BL_2$ as a bit line potential through the second-place second transistor for selection $TR_{22}$. And, the switching circuit $SW_{12}$ is brought into an ON-state. By this operation, the reference potential $V_{REF-2}$ appears in the first bit line $BL_1$ as a bit line potential. And, the voltages (bit line potentials) in the above bit lines $BL_1$ and $BL_2$ forming a pair are detected with the differential sense amplifier SA.

When the above circuit is constituted of the first and second reference capacitors $RC_{A1}$, $RC_{A2}$, $RC_{B1}$ and $RC_{B2}$ formed of a ferroelectric capacitor each, and when data in the memory cell is read out, the switching circuits $SW_{A12}$, $SW_{A22}$, $SW_{B12}$ and $SW_{B22}$ are brought into an ON-state in advance, the second electrode constituting each of the reference capacitors $RC_{A1}$, $RC_{A2}$, $RC_{B1}$ and $RC_{B2}$ is connected to the reference-plate-line driver RPD, and a predetermined potential is applied to each of the reference-plate lines $PL_{REF-A1}$, $PL_{REF-A2}$, $PL_{REF-B1}$ and $PL_{REF-B2}$ from the reference-plate-line driver RPD. As a result, a charge is accumulated in the ferroelectric layer constituting each of the reference capacitors $RC_{A1}$, $RC_{A2}$, $RC_{B1}$ and $RC_{B2}$.

When data stored, for example, in the memory cell $MC_{11p}$ constituting the first sub-memory unit $SMU_{11}$ is read out, the word line $WL_{11}$ is selected, and in a state where a voltage, for example, of $(1/2) V_{cc}$ is applied to the plate line $PL_j$ ($j \neq p$), the plate line $PL_p$ is driven. By this operation, a potential corresponding to data of 1 bit stored in the memory cell $Mc_{11p}$ appears in the first bit line $BL_1$ as a bit line potential through the first-place first transistor for selection $TR_{11}$. And, in a state where a proper electric field is applied to the ferroelectric layer of the reference capacitor $RC_{B1}$ from the second electrode thereof, the switching circuit $SW_{B11}$ is brought into an ON-state. By this operation, the reference potential $V_{REF-1}$ appears in the second bit line $BL_2$ as a bit line potential. And, the voltages (bit line potentials) in the bit lines $BL_1$ and $BL_2$ forming a pair are detected with the differential sense amplifier SA.

When data stored, for example, in the memory cell $MC_{22p}$ constituting the second sub-memory unit $SMU_{22}$ is read out, the word line $WL_{22}$ is selected, and in a state where a voltage, for example, of $(1/2) V_{cc}$ is applied to the plate line $PL_j$ ($j \neq p$), the plate line $PL_p$ is driven. By this operation, a potential corresponding to data of 1 bit stored in the memory cell $MC_{22p}$ appears in the second bit line $BL_2$ as a bit line potential through the second-place second transistor for selection $TR_{22}$. And, in a state where a proper electric field is applied to the ferroelectric layer of the reference capacitor $RC_{A2}$ from the second electrode thereof, the switching circuit $SW_{A21}$ is brought into an ON-state. By this operation, the reference potential $V_{REF-2}$ appears in the first bit line $BL_1$ as a bit line potential. And, the voltages (bit line potentials) in the above bit lines $BL_1$ and $BL_2$ forming a pair are detected with the differential sense amplifier SA.

The nonvolatile memory in Example 3 or those in Examples to be explained hereinafter can be substantially produced according to the method explained in the production of the nonvolatile memory in Example 1 or 2, so that the detailed explanation of production method thereof is omitted.

EXAMPLE 4

Figure 11:
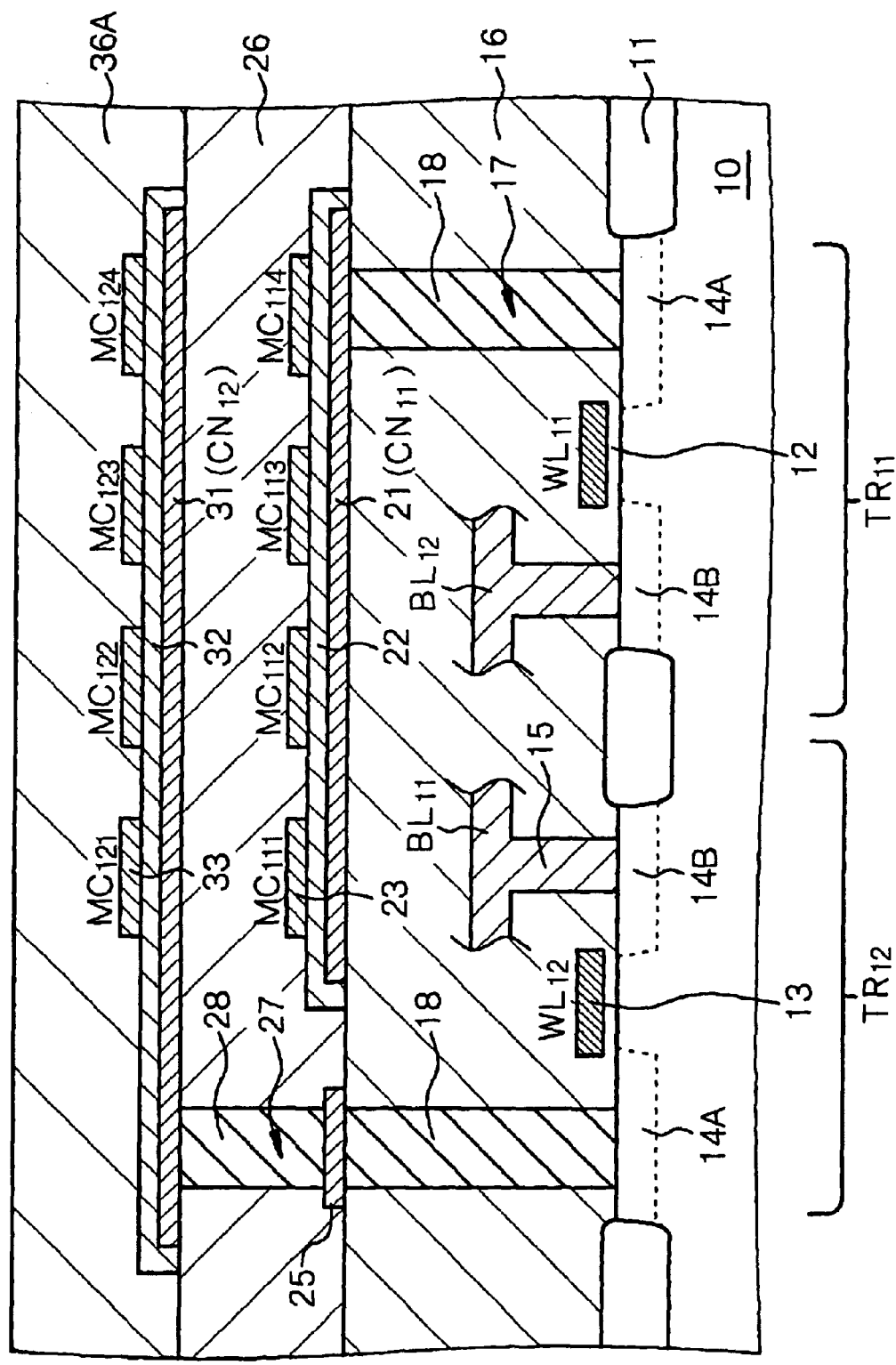
FIG. 11 is a schematic partial cross-sectional view of one memory unit obtained when a ferroelectric-type nonvolatile semiconductor memory in Example 4 is cut through an imaginary vertical plane that is in parallel with the extending direction of a bit line.
Figure 12:
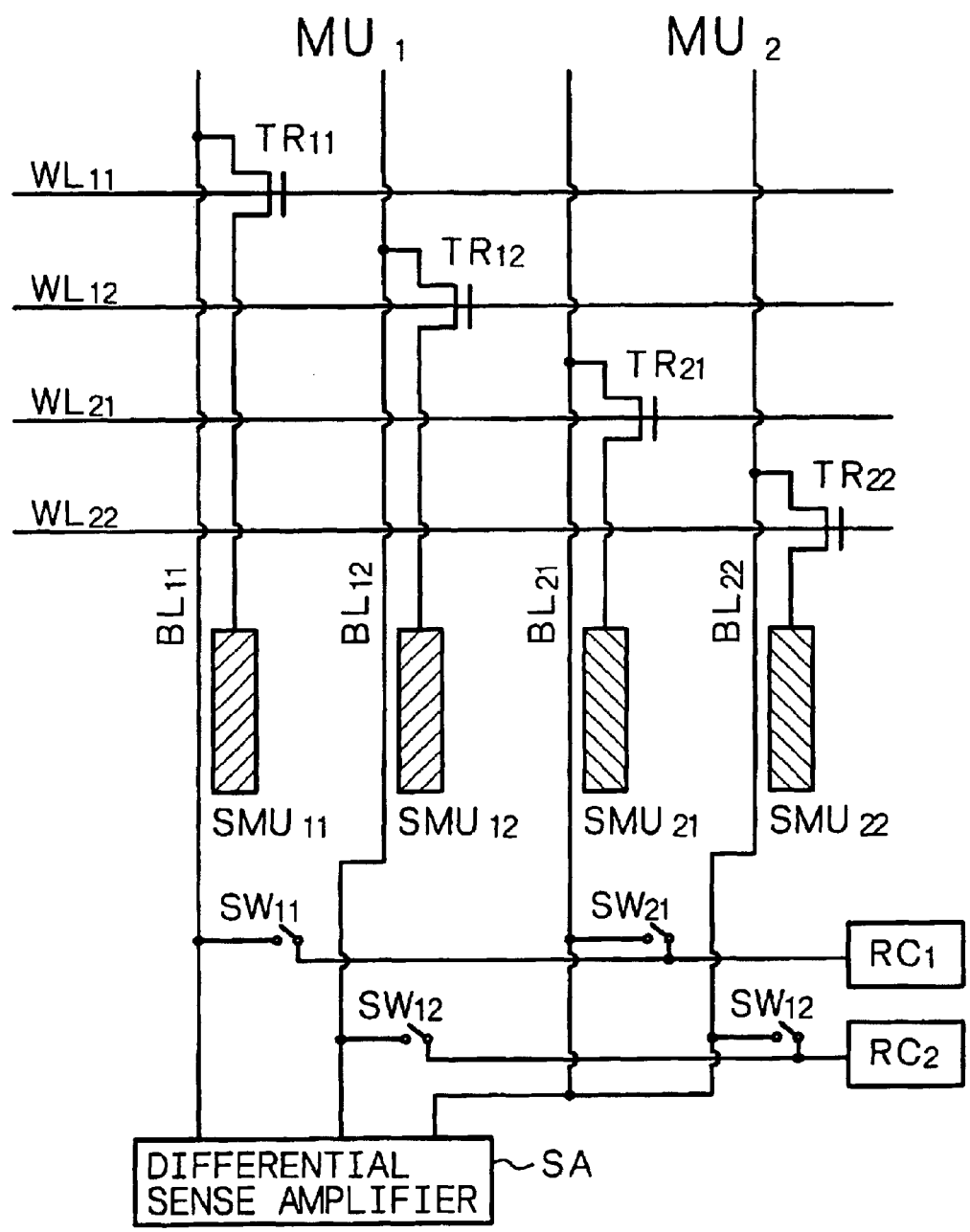
FIG. 12 is a conceptual circuit diagram of another variant of the ferroelectric-type nonvolatile semiconductor memory according to the third aspect of the present invention and in Example 4.
Figure 13:
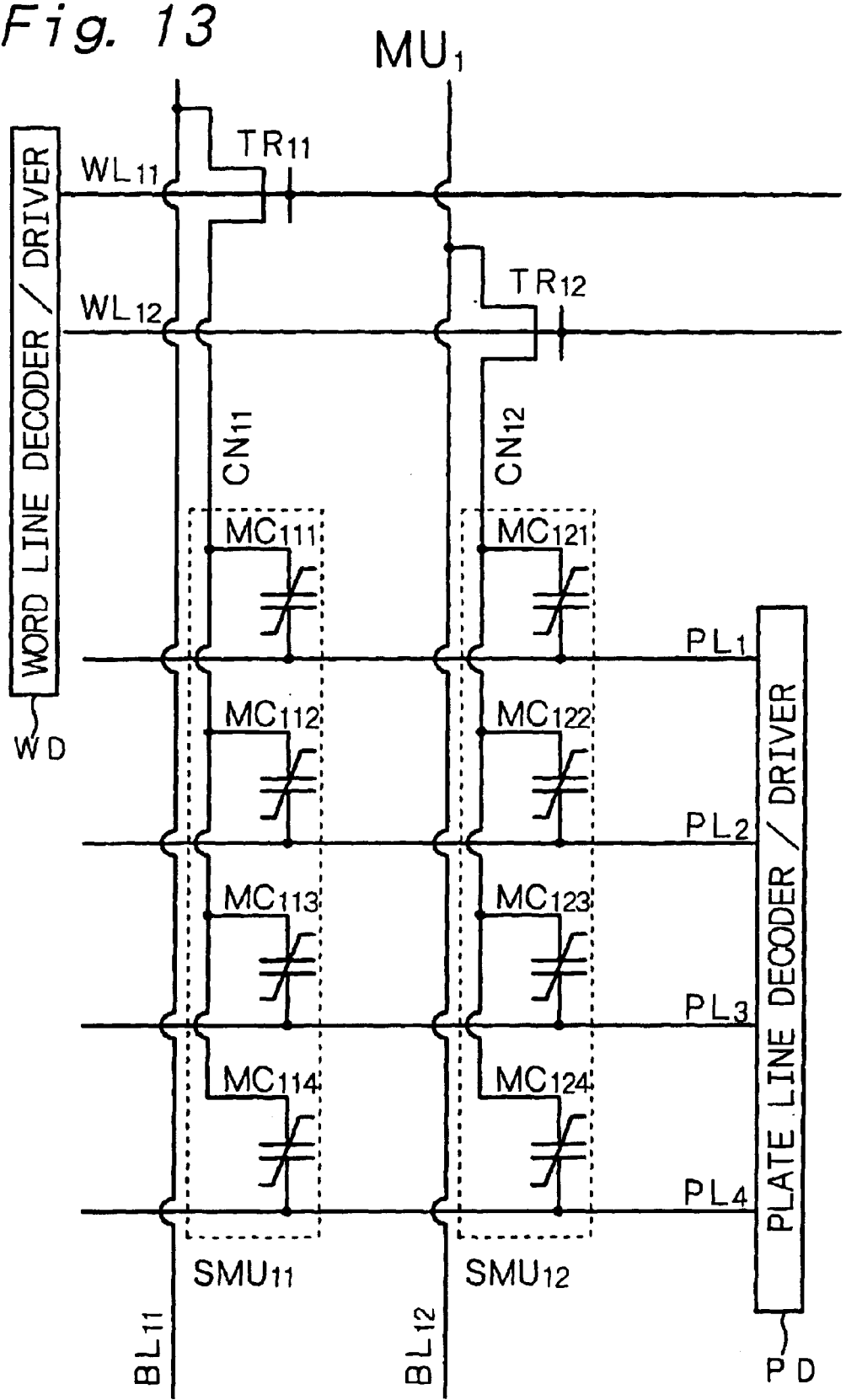
FIG. 13 is a more specific circuit diagram of the conceptual circuit diagram shown in FIG. 12.

Example 4 is a variant of Example 3. FIG. 11 shows a schematic partial cross-sectional view of a nonvolatile memory in Example 4 taken by cutting part of the nonvolatile memory through an imaginary perpendicular plane that is in parallel with the extending direction of the bit line. FIG. 12 shows a conceptual circuit diagram of the nonvolatile memory in Example 4, and FIG. 13 shows a more specific circuit diagram (first sub-memory unit alone) of the conceptual circuit diagram of FIG. 12. While FIG. 11 shows a first sub-memory unit, a second sub-memory unit also has a similar structure, and the second sub-memory unit is formed side by side with the first sub-memory unit in the direction perpendicular to the paper surface of the FIG. 11. The following explanation addresses the first sub-memory unit alone in some cases. FIG. 13 omits showing of a circuit for generating a reference potential and a differential sense amplifier.

The nonvolatile memory in Example 4 has first line $BL_{1N}$ which are N in number and second bit lines $BL_{2N}$ which are N in number. In the first memory unit $MU_1$, the common first electrode in the first sub-memory unit of an n-th layer $SMU_{1n}$ is connected to an n-th-place first bit line $BL_{1n}$ through an n-th-place first transistor for selection $TR_{1n}$, and in the second memory unit $MU_2$, the common first electrode in the second sub-memory unit of an n-th layer $SMU_{2n}$ is connected to an n-th-place second bit line $BL_{2n}$ through an n-th-place second transistor for selection $TR_{2n}$.

Specifically, the other source/drain region 14B of the n-th-place first transistor for selection $TR_{1n}$ is connected to the n-th-place first bit line $BL_{1n}$, and one source/drain region 14A of the first-place first transistor for selection $TR_{11}$ is connected to the common first electrode 21 (first common node $CN_{11}$) in the first sub-memory unit of the first layer $SMU_{11}$ through a contact hole 18 of the first layer formed through an insulating layer 16. One source/drain region 14A of the second-place first transistor for selection $TR_{12}$ is connected to the common first electrode 31 (second common node $CN_{12}$) in the first sub-memory unit of the second layer $SMU_{12}$ through a contact hole 18 of the first layer made in the insulating layer 16, a pad portion 25 and a contact hole 28 of the second layer formed through an insulating layer 26. The other source/drain region 14B of the n-th-place second transistor for selection $TR_{2n}$ is connected to the n-th-place second bit line $BL_{2n}$, and one source/drain region 14A of the first-place second transistor for selection $TR_{21}$ is connected to the common first electrode 21 (first common node $CN_{21}$) in the second sub-memory unit of the first layer $SMU_{21}$ through a contact hole 18 of the first layer formed through the insulating layer 16. One source/drain region 14A of the second-place second transistor for selection $TR_{22}$ is connected to the common first electrode 31 (second common node $CN_{22}$) in the second sub-memory unit of the second layer $SMU_{22}$ through a contact hole 18 of the first layer formed through the insulating layer 16, a pad portion 25 and a contact hole 28 of the second layer formed through the insulating layer 26.

The bit lines $BL_{1n}$ and $BL_{2n}$ are connected to the differential sense amplifier SA.

When date stored in the memory cell $MC_{1nm}$ constituting the first sub-memory unit of the n-th layer $SMU_{1n}$ in the first memory unit $MU_1$ is read out, a reference potential $V_{REF-n}$ having an n-th potential is provided to the n-th-place second bit line $BL_{2n}$. When data stored in the memory cell $MC_{2nm}$ constituting the second sub-memory unit of the n-th layer $SMU_{2n}$ in the second memory unit $MU_2$ is read out, a reference potential $V_{REF-n}$ having an n-th potential is provided to the n-th-place first bit line $BL_{1n}$.

Figure 14:
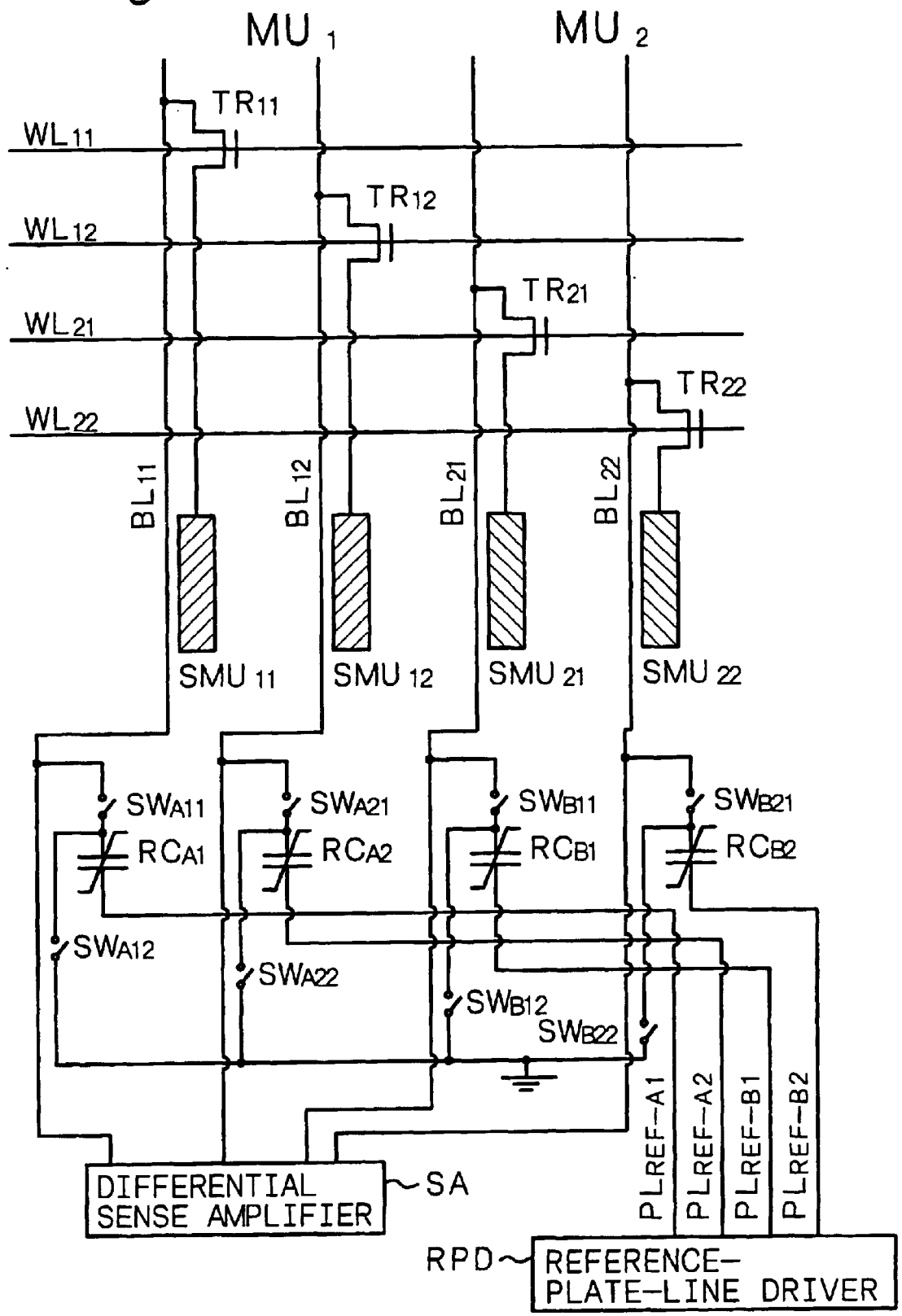
FIG. 14 is a conceptual circuit diagram of a variant of the ferroelectric-type nonvolatile semiconductor memory according to the third aspect of the present invention and a variant of the ferroelectric-type nonvolatile semiconductor memory in Example 4.

The circuit for providing the reference potentials $V_{REF-1}$ and $V_{REF-2}$ may be constituted of the first and second reference capacitors $RC_1$ and $RC_2$ (not shown in FIG. 11) made of MOS capacitors like Example 1 (see the circuit diagram of FIG. 12), or may be constituted of the first and second reference capacitors $RC_{A1}$, $RC_{A2}$, $RC_{B1}$ and $RC_{B2}$ made of a ferroelectric capacitor each like Example 2 (see the circuit diagram of FIG. 14). Alternatively, the referential potential may be outputted from a known voltage down converter or a structure in which a plurality of PMOS FETs are connected in series.

When the above circuit is constituted of the first and second reference capacitors $RC_1$ and $RC_2$ made of MOS capacitors, and for example, when data stored in the memory cell $MC_{11P}$ constituting the first sub-memory unit $SMU_{11}$ is read out, the word line $WL_{11}$ is selected, and in a state where a voltage, for example, of $(1/2) V_{cc}$ is applied to the plate line $PL_j$ ($j \neq p$), the plate line $PL_p$ is driven. The above $V_{cc}$ refers, for example, to a power source voltage. By this operation, a potential corresponding to data of 1 bit stored in the memory cell $MC_{11P}$ appears in the first-place first bit line $BL_{11}$ as a bit line potential through the first-place first transistor for selection $TR_{11}$. And, the switching circuit $SW_{21}$ is brought into an ON-state. By this operation, the reference potential $V_{REF-1}$ appears in the first-place second bit line $BL_{21}$ as a bit line potential. And, the voltages (bit line potentials) in the above bit lines $BL_{11}$ and $BL_{21}$ forming a pair are detected with the differential sense amplifier SA.

When data stored, for example, in the memory cell $MC_{22P}$ constituting the second sub-memory unit $SMU_{22}$ is read out, the word line $WL_{22}$ is selected, and in a state where a voltage, for example, of $(1/2) V_{cc}$ is applied to the plate line $PL_j$ ($j \neq p$), the plate line $PL_p$ is driven. By this operation, a potential corresponding to data of 1 bit stored in the memory cell $MC_{22P}$ appears in the second-place second bit line $BL_{22}$ as a bit line potential through the second-place second transistor for selection $TR_{22}$. And, the switching circuit $SW_{12}$ is brought into an ON-state. By this operation, the reference potential $V_{REF-2}$ appears in the second-place first bit line $BL_{12}$ as a bit line potential. And, the voltages (bit line potentials) in the above bit lines $BL_{12}$ and $BL_{22}$ forming a pair are detected with the differential sense amplifier SA.

When the above circuit is constituted of the first and second reference capacitors $RC_{A1}$, $RC_{A2}$, $RC_{B1}$ and $RC_{B2}$ formed of a ferroelectric capacitor each, and when data in the memory cell is read out, the switching circuits $SW_{A12}$, $SW_{A22}$, $SW_{B12}$ and $SW_{B22}$ are brought into an ON-state in advance, the second electrode constituting each of the reference capacitors $RC_{A1}$, $RC_{A2}$, $RC_{B1}$ and $RC_{B2}$ is connected to the reference-plate-line driver RPD, and a predetermined potential is applied to each of the reference-plate lines $PL_{REF-A1}$, $PL_{REF-A2}$, $PL_{REF-B1}$ and $PL_{REF-B2}$ from the reference-plate-line driver RPD. As a result, a charge is accumulated in the ferroelectric layer constituting each of the reference capacitors $RC_{A1}$, $RC_{A2}$, $RC_{B1}$ and $RC_{B2}$.

When data stored, for example, in the memory cell $Mc_{11P}$ constituting the first sub-memory unit $SMU_{11}$ is read out, the word line $WL_{11}$ is selected, and in a state where a voltage, for example, of $(1/2) V_{cc}$ is applied to the plate line $PL_j$ ($j \neq p$), the plate line $PL_p$ is driven. By this operation, a potential corresponding to data of 1 bit stored in the memory cell $MC_{11P}$ appears in the first-place first bit line $BL_{11}$ as a bit line potential through the first-place first transistor for selection $TR_{11}$. And, in a state where a proper electric field is applied to the ferroelectric layer of the reference capacitor $RC_{B1}$ from the second electrode thereof, the switching circuit $SW_{B11}$ is brought into an ON-state. By this operation, the reference potential $V_{REF-1}$ appears in the first-place second bit line $BL_{21}$ as a bit line potential. And, the voltages (bit line potentials) in the above bit lines $BL_{12}$ and $BL_{22}$ forming a pair are detected with the differential sense amplifier SA.

When data stored, for example, in the memory cell $MC_{22P}$ constituting the second sub-memory unit $SMU_{22}$ is read out, the word line $WL_{22}$ is selected, and in a state where a voltage, for example, of $(1/2) V_{cc}$ is applied to the plate line $PL_j$ ($j \neq p$), the plate line $PL_p$ is driven. By this operation, a potential corresponding to data of 1 bit stored in the memory cell $MC_{22P}$ appears in the second-place second bit line $BL_{22}$ as a bit line potential through the second-place second transistor for selection $TR_{22}$. And, in a state where a proper electric field is applied to the ferroelectric layer of the reference capacitor $RC_{A2}$ from the second electrode thereof, the switching circuit $SW_{A21}$ is brought into an ON-state. By this operation, the reference potential $V_{REF-2}$ appears in the second-place first bit line $BL_{12}$ as a bit line potential. And, the voltages (bit line potentials) in the above bit lines $BL_{12}$ and $BL_{22}$ forming a pair are detected with the differential sense amplifier SA.

EXAMPLE 5

Figure 15:
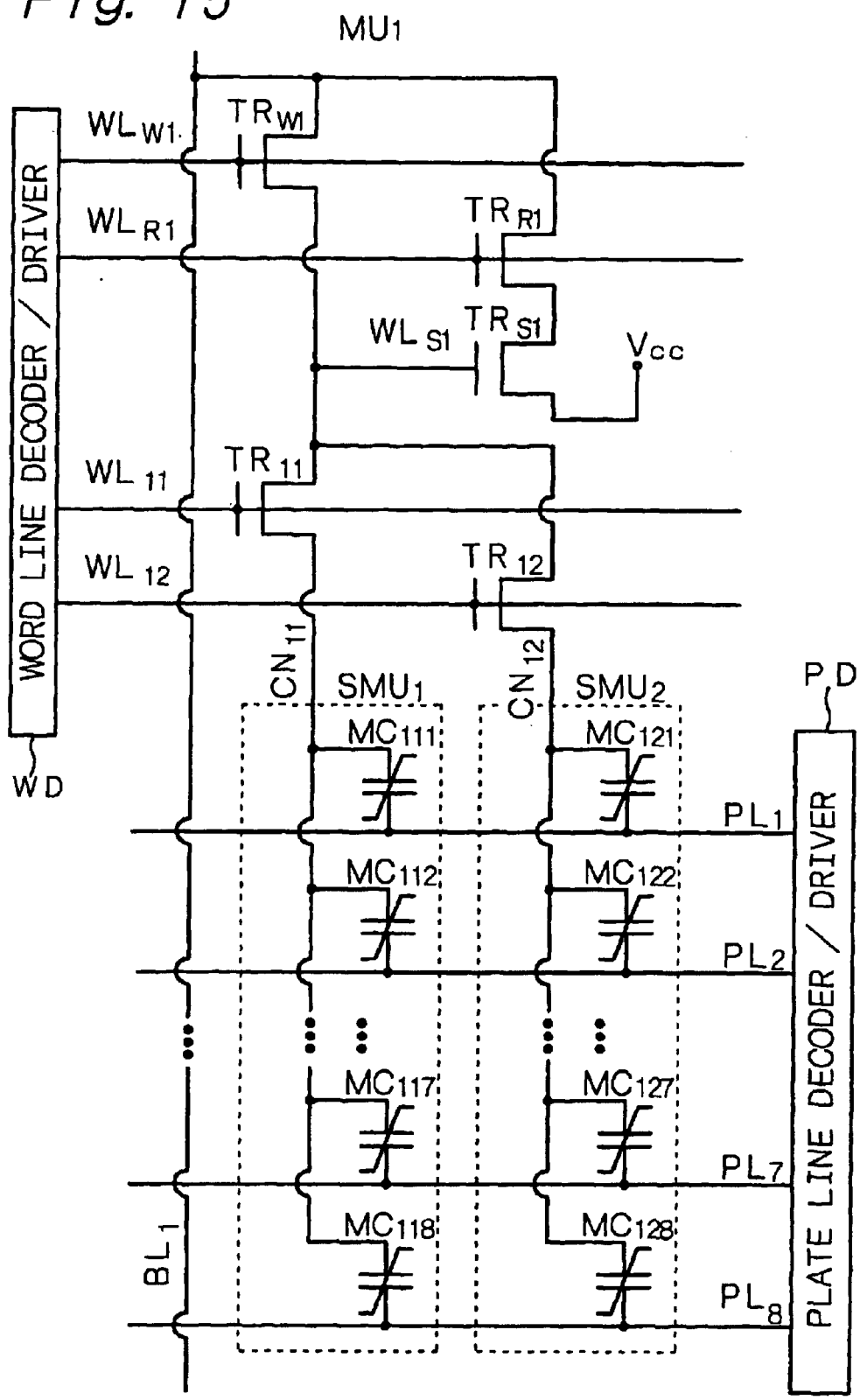
FIG. 15 is a circuit diagram of a gain-cell type ferroelectric-type nonvolatile semiconductor memory in Example 5.
Figure 16:
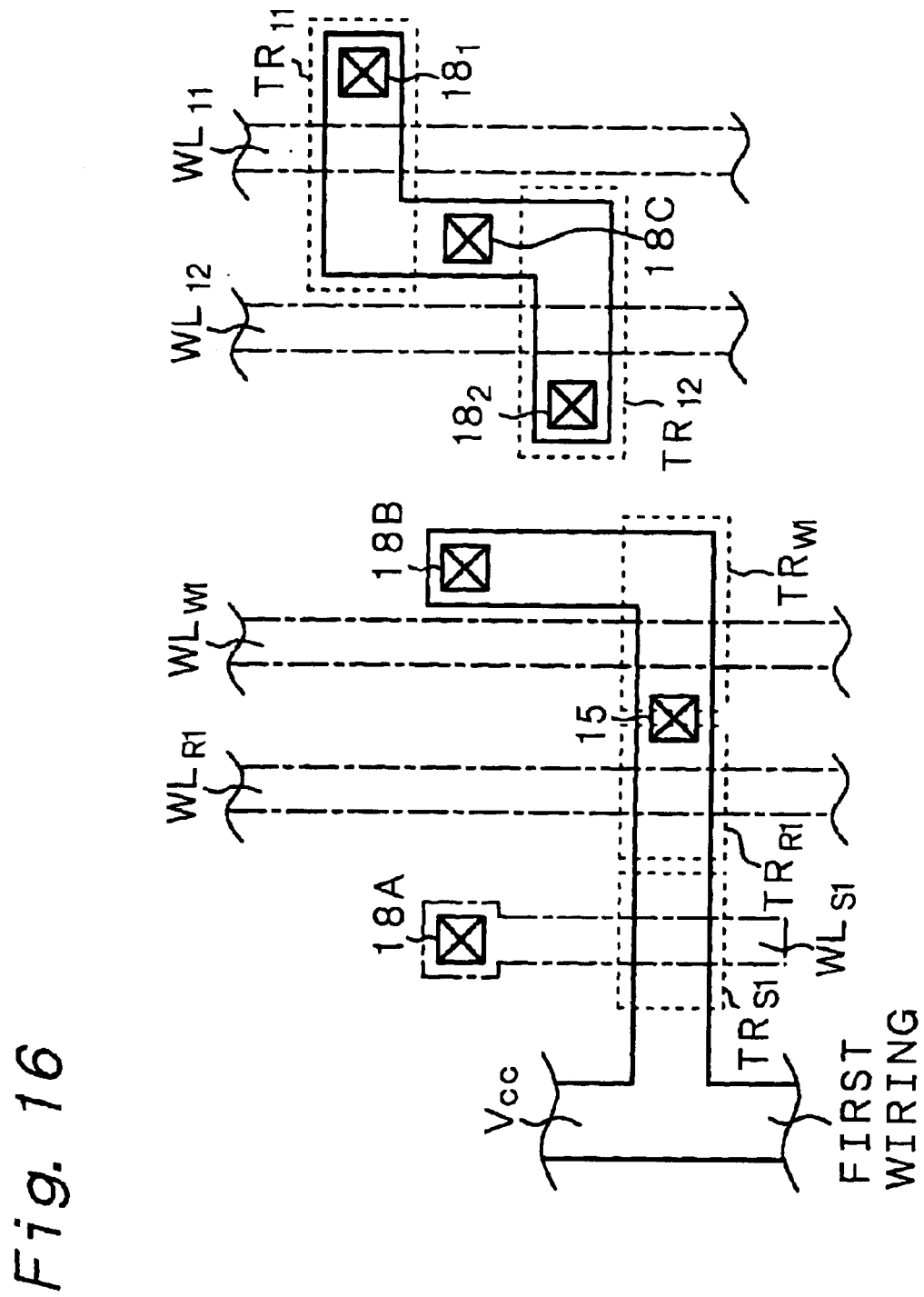
FIG. 16 is a layout of the gain-cell type ferroelectric-type nonvolatile semiconductor memory in Example 5.

Example 5 is concerned with the nonvolatile memory according to the fourth aspect of the present invention. FIG. 15 shows a circuit diagram of the nonvolatile memory in Example 5, and FIG. 16 shows a schematic layout of various transistors constituting the nonvolatile memory. While FIG. 15 shows the first memory unit out of two memory units constituting the nonvolatile memory, the second memory unit has the same constitution as well. FIG. 15 omits showing of the circuit for generating the reference potential and the differential sense amplifier. In FIG. 16, regions of various transistors are surrounded by dotted lines, active fields and wirings are indicated by solid lines, and gate electrodes or word lines are indicated by chain lines. With respect of the first sub-memory units which are N in number and each of which is composed of memory cells which are M in number and the plate lines which are M in number, the nonvolatile memory in Example 5 has a partial cross-sectional view that is substantially the same as the partial cross-sectional view shown in FIG. 6, so that the following explanation also refers to FIG. 6.

The nonvolatile memory in Example 5 is a so-called gain-cell type nonvolatile memory. The nonvolatile memory comprises a first memory unit $MU_1$ and a second memory unit $MU_2$.

The first memory unit $MU_1$ has;

(A-1) a first bit line $BL_1$, (B-1) first transistors for selection $TR_{1N}$ which are N in number (N≧2; N=2 in Example 5), (C-1) first sub-memory units $SMU_{11}$ and $SMU_{12}$ which are N in number and each of which is composed of memory cells $MC_{11M}$ and $MC_{12M}$ which are M in number (M≧2; M=8 in Example 5), (D-1) plate lines $PL_M$ which are M in number and each of which is shared with each memory cell constituting each of the first sub-memory units which are N in number, between or among the first sub-memory units which are N in number, (E-1) a first transistor for writing-in $TR_{W1}$, (F-1) a first transistor for detection $TR_{S1}$, and (G-1) a first transistor for read-out $TR_{R1}$.

The second memory unit has;

(A-2) a second bit line $BL_2$, (B-2) second transistors for selection $TR_{2N}$ which are N in number, (C-2) second sub-memory units $SMU_{21}$ and $SMU_{22}$ which are N in number and each of which is composed of memory cells $MC_{21M}$ and $MC_{22M}$ which are M in number, (D-2) the plate lines $PL_M$ which are M in number, each of which is shared with each memory cell constituting each of the second sub-memory units which are N in number, between or among the second sub-memory units which are N in number, and which are shared with the plate lines which constitute said first memory unit and are M in number, (E-2) a second transistor for writing-in $TR_{W2}$, (F-2) a second transistor for detection $TR_{S2}$, and (G-2) a second transistor for read-out $TR_{R2}$.

The first sub-memory unit of an n-th layer (n=1, 2 ... N) $SMU_{1n}$ and the second sub-memory unit of the n-th layer $SMU_{2n}$ are formed on the same insulating layer 16 or 26. The first sub-memory unit of an n'-th layer (n'=2 ... N) $SMU_{1n'}$ and the second sub-memory unit of the n'-th layer $SMU_{2n'}$ are stacked on the first sub-memory unit of the (n'−1)-th layer $SMU_{1(n'-1)}$ and the second sub-memory unit of the (n'−1)-th layer $SMU_{2(n'-1)}$ through the insulating layer 26.

Each of the memory cells $MC_{11m}$, $MC_{21m}$, $MC_{12m}$ and $MC_{22m}$ comprises a first electrode 21 or 31, a ferroelectric layer 22 or 32 and a second electrode 23 or 33.

In the first memory unit $MU_1$, the first electrodes of the memory cells $MC_{1nm}$ constituting the first sub-memory unit of the n-th layer $SMU_{1n}$ are in common with the first sub-memory unit of the n-th layer $SMU_{1n}$, the common first electrode is connected to the first bit line $BL_1$ through the n-th-place first transistor for selection $TR_{1n}$ and the first transistor for writing-in $TR_{W1}$, and the second electrode of the memory cell in an m-th-place (m=1, 2 ... M) is connected to the common plate line $PL_m$ in the m-th-place. Specifically, the first electrodes 21 of the memory cells $MC_{11m}$ constituting the first sub-memory unit of the first layer $SMU_{11}$ are in common with the first sub-memory unit of the first layer $SMU_{11}$, the common first electrode (common node $CN_{11}$) is connected to the first bit line $BL_1$ through the first-place first transistor for selection $TR_{11}$ and the first transistor for writing-in $TR_{W1}$, and the second electrode 23 of the memory cell $MC_{11m}$ in the m-th-place is connected to the common plate line $PL_m$ in the m-th-place. The first electrodes 31 of the memory cells $MC_{12m}$ constituting the first sub-memory unit of the second layer $SMU_{12}$ are in common with the first sub-memory unit of the second layer $SMU_{12}$, the common first electrode (common node $CN_{12}$) is connected to the first bit line $BL_1$ through the second-place first transistor for selection $TR_{12}$ and the first transistor for writing-in $TR_{W1}$, and the second electrode 33 of the memory cell $MC_{12m}$ in the m-th-place is connected to the common plate line $PL_m$ in the m-th-place.

In the second memory unit $MU_2$, the first electrodes of the memory cells $MC_{2nm}$ constituting the second sub-memory unit of the n-th layer $SMU_{2n}$ are in common with the second sub-memory unit of the n-th layer $SMU_{2n}$, the common first electrode is connected to the second bit line $BL_2$ through the n-th-place second transistor for selection $TR_{2n}$ and the second transistor for writing-in $TR_{W2}$, and the second electrode of the memory cell $MC_{2nm}$ in the m-th-place is connected to the common plate line $PL_m$ in the m-th-place. Specifically, the first electrodes 21 of the memory cells $MC_{21m}$ constituting the second sub-memory unit of the first layer $SMU_{21}$ are in common with the second sub-memory unit of the first layer $SMU_{21}$, the common first electrode (common node $CN_{21}$) is connected to the second bit line $BL_2$ through the first-place second transistor for selection $TR_{21}$ and the second transistor for writing-in $TR_{W2}$, and the second electrode 23 of the memory cell $MC_{21m}$ in the m-th-place is connected to the common plate line $PL_m$ in the m-th-place. The first electrodes 31 of the memory cells $MC_{22m}$ constituting the second sub-memory unit of the second layer $SMU_{22}$ are in common with the second sub-memory unit of the second layer $SMU_{22}$, the common first electrode (common node $CN_{22}$) is connected to the second bit line $BL_2$ through the second-place second transistor for selection $TR_{22}$ and the second transistor for writing-in $TR_{W2}$, and the second electrode 33 of the memory cell $MC_{22m}$ in the m-th-place is connected to the common plate line $PL_m$ in the m-th-place.

The memory cells $MC_{1nm}$ constituting the first sub-memory unit of the n-th layer $SMU_{1n}$ and the memory cells $MC_{2nm}$ constituting the second sub-memory unit of the n-th layer $SMU_{2n}$ have the same thermal history with regard to their production processes, and the memory cells $MC_{1nm}$ constituting the first sub-memory unit of the n-th layer $SMU_{1n}$ and the memory cells $MC_{2nm}$ constituting the second sub-memory unit of the n-th layer $SMU_{2n}$ have the thermal history different from the thermal history of the memory cells $MC_{1km}$ constituting the first sub-memory unit of a k-th layer (k≠n) $SMU_{1k}$ and the memory cells $MC_{2km}$ constituting the second sub-memory unit of the k-th layer $SMU_{2k}$.

The memory cell $MC_{1nm}$ in the m-th-place constituting the first sub-memory unit of the n-th layer $SMU_{1n}$ in the first memory unit $MU_1$ and the memory cell $MC_{2nm}$ in the m-th-place constituting the second sub-memory unit of the n-th layer $SMU_{2n}$ form a pair to store data of 1 bit each.

One end of the first transistor for detection $TR_{S1}$ is connected to a first wiring (power source line made of an impurity-doped layer) having a predetermined potential $V_{cc}$, and the other end thereof is connected to the first bit line $BL_1$ through the first transistor for read-out $TR_{R1}$. One end of the second transistor for detection $TR_{S2}$ is connected to a second wiring (power source line made of an impurity-doped layer) having a predetermined potential $V_{cc}$ and the other end thereof is connected to the second bit line $BL_2$ through the second transistor for read-out $TR_{R2}$.

Specifically, those various transistors are formed of MOS type FETs. One source/drain region of the first transistor for writing-in $TR_{W1}$ is connected to the first bit line $BL_1$ through a contact hole, and the other source/drain region thereof is connected to one source/drain region of each of the first transistors for selection $TR_{11}$ and $TR_{12}$ through a contact hole 18B formed through an insulating layer 16, a secondary bit line (not shown) and a contact hole 18C formed through the insulating layer 16. The other source/drain region of the first-place first transistor for selection $TR_{11}$ is connected to the common first electrode (common node $CN_{11}$) constituting the sub-memory unit $SMU_{11}$ through a contact hole $18_1$ formed through the insulating layer 16. The other source/drain region of the second-place first transistor for selection $TR_{12}$ is connected to the common first electrode (common node $CN_{12}$) through a contact hole $18_2$ formed through the insulating layer 16 and a contact hole 28 formed through the insulating layer 26. One source/drain region of the first transistor for detection $TR_{S1}$ is connected to the first wiring having a predetermined potential $V_{cc}$, and the other source/drain region thereof is connected to one source/drain region of the first transistor for read-out $TR_{R1}$. The other source/drain region of the first transistor for read-out $TR_{R1}$ is connected to the first bit line $BL_1$ through a contact hole 15. One source/drain region of each of the first transistors for selection $TR_{11}$ and $TR_{12}$ or the other source/drain region of the first transistor for writing-in $TR_{W1}$ is connected to the gate electrode of the first transistor for detection $TR_{S1}$ through the secondary bit line (not shown) and a contact hole 18A. The extending portion of the gate electrode of the first transistor for detection $TR_{S1}$ is indicated by a symbol $WL_{S1}$. The other source/drain region of the first transistor for detection $TR_{S1}$ and one source/drain region of the first transistor for read-out $TR_{R1}$ occupy one source/drain region. The word line $WL_{W1}$ connected to the gate electrode of the first transistor for writing-in $TR_{W1}$, the word line $WL_{R1}$ connected to the gate electrode of the first transistor for read-out $TR_{R1}$ and the word lines $WL_{11}$ and $WL_{12}$ connected to the gate electrodes of the first transistors for selection $TR_{11}$ and $TR_{12}$ are connected to the word line decoder/driver. Each plate line $PL_m$ is connected to the plate line decoder/driver PD. The bit lines $BL_1$ and $BL_2$ are connected to the differential sense amplifier SA. The above secondary bit line is extending on a lower insulating layer and is connected to the first bit line $BL_1$.

When data stored in each memory cell $MC_{1nm}$ constituting the first sub-memory unit of the n-th layer $SMU_{1n}$ in the first memory unit $MU_1$ is read out, the n-th-place first transistor for selection $TR_{1n}$ and the first transistor for read-out $TR_{R1}$ are brought into a conducting state, the operation of the first transistor for detection $TR_{S1}$ is controlled by a potential that occurs in the common first electrode (common node $CN_{11}$ or $CN_{12}$) on the basis of the data stored in the memory cell $MC_{nm1}$, and a reference potential $V_{REF-n}$ having an n-th potential is provided to the second bit line $BL_2$. When data stored in each memory cell $MC_{2nm}$ constituting the second sub-memory unit of the n-th layer $SMU_{2n}$ in the second memory unit $MU_2$ is read out, the n-th-place second transistor for selection $TR_{2n}$ and the second transistor for read-out $TR_{R2}$ are brought into a conductive state, the operation of the second transistor for detection $TR_{S2}$ is controlled by a potential that occurs in the common first electrode (common node $CN_{21}$ or $CN_{22}$) on the basis of the data stored in the memory cell $MC_{2nm}$, and a reference potential $V_{REF-n}$ having an n-th potential is provided to the first bit line $BL_1$. The n-th potential differs from the k-th potential (k≠n).

The first transistors for selection $TR_{11}$ and $TR_{12}$ constituting the first memory unit $MU_1$ are connected to the word lines $WL_{11}$ and $WL_{12}$, respectively, the second transistors for selection $TR_{21}$ and $TR_{22}$ constituting the second memory unit $MU_2$ are connected to the word lines $WL_{21}$ and $WL_{22}$ respectively, and the memory cells $MC_{1nm}$ and $MC_{2nm}$ are independently controlled. In the nonvolatile memory in an actual embodiment, sets of such memory units for storing 2×N×M bits (specifically, 16 bits) each are arranged in the form of an array as access units. The value of M shall not be limited to 4. It is sufficient to satisfy M≧2, and the actual value of M includes exponents of 2 (2, 4, 8, 16 . . . ). Further, it is sufficient to satisfy N≧2, and the actual value of N includes exponents of 2 (2, 4, 8 . . . ).

The structure of the sub-memory units $SMU_{1N}$ and $SMU_{2N}$ can be substantially the same as the structure of the sub-memory units $SMU_{1N}$ and $SMU_{2N}$ explained in Example 3, so that a detailed explanation thereof is omitted.

The size (occupation area) of the nonvolatile memory in Example 5 is, in principle, determined by the pitch and number (value of M) of the plate lines $PL_M$ in one direction, and, further, the size thereof in the direction at right angles in the above direction is determined by the pitch and number (value of N) of the common nodes. The area (size) of the region that the nonvolatile memory occupies in a semiconductor substrate is mainly determined depending upon the area (size) that the transistors for selection $TR_{11}$, $TR_{12}$, $TR_{21}$ and $TR_{22}$ occupy. The transistors for writing-in $TR_{W1}$ and $TR_{W2}$, the transistors for read-out $TR_{R1}$ and $TR_{R2}$ and the transistors for detection $TR_{S1}$ and $TR_{S2}$ can be formed in an empty region of the semiconductor substrate, and the area of the empty region increases with an increase in each of the number (N) of the sub-memory units and the number (M) of the memory cells constituting the sub-memory units. When the transistors for writing-in $TR_{W1}$ and $TR_{W2}$, the transistors for read-out $TR_{R2}$ and $TR_{R2}$ and the transistors for detection $TR_{S1}$ and $TR_{S2}$ are formed in the empty region of the semiconductor substrate, the semiconductor substrate can be remarkably effectively utilized.

When data is read out from the memory cell $MC_{11p}$ constituting the first sub-memory unit $SMU_{11}$ in the first memory unit $MU_1$, $V_{cc}$, is applied to the selected plate line $PL_p$. In this case, when data "1" is stored in the selected memory cell $MC_{11p}$, polarization inversion takes place in the ferroelectric layer, the accumulated charge amount increases, and the potential of the common node $CN_{11}$ increases. When data "0" is stored in the selected memory cell $MC_{11p}$, the polarization inversion does not take place in the ferroelectric layer, and the potential of the common node $CN_{11}$ hardly increases. That is, the common node $CN_{11}$ is coupled with a plurality of non-selected plate lines $PL_j$ through the ferroelectric layer of the non-selected memory cells, so that the potential of the common node $CN_{11}$ is maintained at a level relatively close to 0 volt. In this manner, a change is caused on the potential of the common node $CN_{11}$ depending upon the data stored in the selected memory cell $MC_{11p}$. Therefore, the ferroelectric layer of the selected memory cell $MC_{11p}$ can be provided with an electric field sufficient for polarization inversion. Then, the first bit line $BL_1$ is brought into a floating state, and the first transistor for read-out $TR_{R1}$ is brought into an ON-state. And, the operation of the first transistor for detection $TR_{S1}$ is controlled on the basis of the potential that is caused in the common first electrode (common node $CN_{11}$) due to the data stored in the selected memory cell $MC_{11p}$. Specifically, when a high potential occurs in the common first electrode (common node $CN_{11}$) on the basis of the data stored in the selected memory cell $MC_{11p}$, the first transistor for detection $TR_{S1}$ comes into a conducting state. And, since one source/drain region of the first transistor for detection $TR_{S1}$ is connected to the first wiring having a predetermined potential $V_{cc}$, electric current flows into the first bit line $BL_1$ from the above first wiring through the first transistor for detection $TR_{S1}$ and the first transistor for read-out $TR_{R1}$, so that the potential of the first bit line $BL_1$ increases. That is, a change in the potential of the common first electrode (common node $CN_{11}$) is detected with a signal detective circuit, and the detection result is transmitted to the first bit line $BL_1$ as a voltage (potential). In this case, the potential of the first bit line $BL_1$ comes to be approximately $(V_g - V_{th})$, in which $V_{th}$ is a threshold value of the first transistor for detection $TR_{S1}$ and $V_g$ is a potential of the gate portion of the first transistor for detection $TR_{S1}$ (i.e., potential of the common node $CN_{11}$). When the first transistor for detection $TR_{S1}$ is formed of a depression type NMOSFET, the threshold value $V_{th}$ is a negative value, so that stabilized sense signal amount can be secured regardless of a load on the first bit line $BL_1$. The transistor for detection $TR_{S1}$ may be formed of PMOSFET. To the second bit line $BL_2$ is applied the first reference potential $V_{REF-1}$ as is explained in Example 1 or 2.

The number (M) of the memory cells constituting the sub-memory unit is required to be a number that serves to provide the ferroelectric layer of the selected memory cell with a sufficiently large electric field so that the ferroelectric layer reliably undergoes polarization inversion. That is, when the value of M is too small, and when $V_{cc}$ is applied to the selected plate line $PL_p$, the potential of the common first electrode in a floating state greatly increases on the basis of the coupling of the second electrode and the first electrode. As a result, no sufficient electric field is formed between the second electrode and the first electrode, so that the ferroelectric layer is caused to have no polarization inversion. Since the value of the potential (which will be referred to as "signal potential") that appears in the first electrode is obtained by dividing an accumulated charge amount with a load capacity, the potential that appears in the first electrode comes to be too low when the value of M is too large. When $V_{cc}$ is applied to the selected plate line $PL_p$, and when data "1" is stored in the selected memory cell, an electric field is caused between the first electrode and the second electrode in the direction in which the polarization of the ferroelectric layer is inverted. Therefore, the signal potential from the above selected memory cell (the potential that appears in the common first electrode in a floating state and that is a potential $V_g$ to be applied to the gate electrode of the first transistor for detection $TR_{S1}$) is higher than that when data "0" is stored. With an increase in the difference between the signal potential when data "1" is stored and the signal potential when data "0" is stored, the reliability in reading-out of data increases. When the value of M is 1, the load capacity in the common node $CN_{11}$ is too small, and as a result, the signal potential when data "1" is stored and the signal potential when data "0" is stored increase to excess, so that the potential difference between the signal potential and $V_{cc}$ applied to the plate line $PL_p$ comes to be too small. The polarization inversion in the ferroelectric layer is therefore insufficient, and it is difficult to read out the data stored in the selected memory cell. When the value of M is 2 or greater, the potential difference between the signal potential and the $V_{cc}$ applied to the plate line $PL_p$ is sufficiently large in the selected memory cell, so that the data can be reliably read out from the selected memory cell. As the value of M increases, the load capacity of the common node $CN_{11}$ increases, and when the value of M exceeds a certain level, the value of signal amount, which is a potential difference between the signal potential and the $V_{cc}$ applied to the plate line $PL_p$, begins to decrease. The value of M therefore includes optimum values, and the optimum value of M is in the range of $2 \leq M \leq 128$, preferably $2 \leq M \leq 32$.

Figure 17:
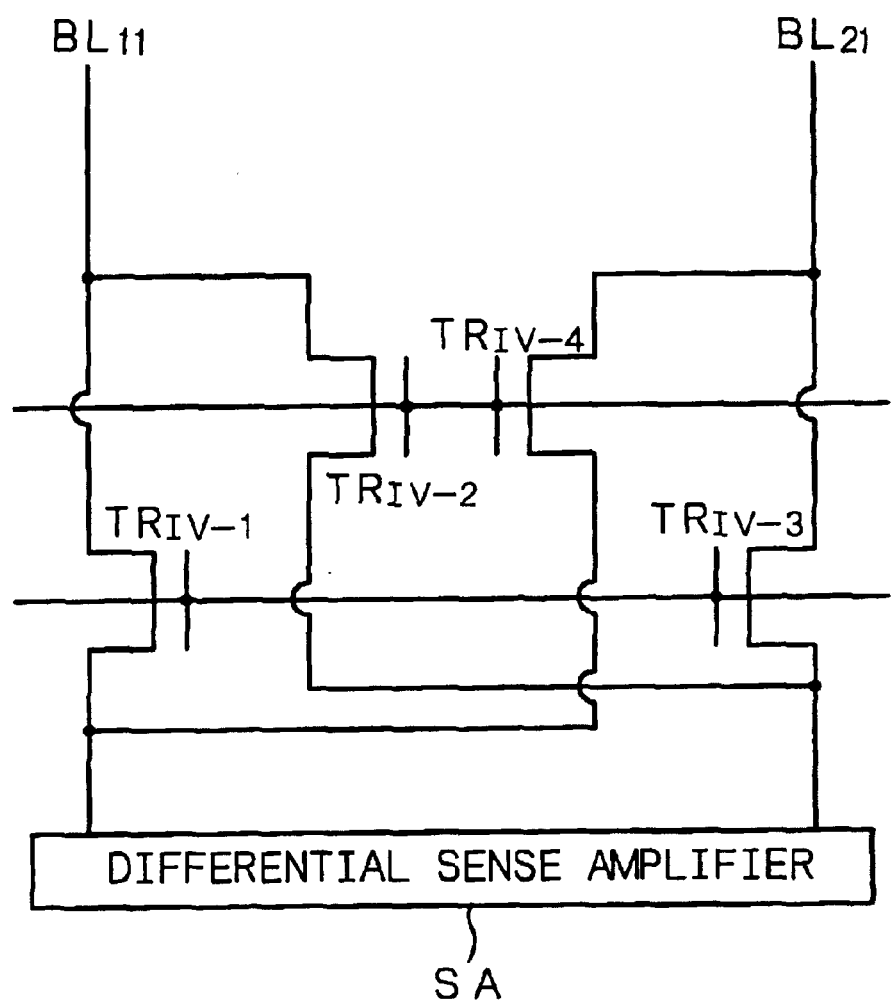
FIG. 17 is a circuit diagram showing a kind of switching circuit provided between bit lines when the predetermined potential of a wiring to which one end of a transistor for detection is connected in the gain-cell type ferroelectric-type nonvolatile semiconductor memory in Example 5.

In Example 5, the predetermined potential of the first and second wirings to which one end of the first transistor for detection and one end of the second transistor for detection are connected shall not be limited to $V_{cc}$, and one end of each of them may be grounded. That is, the potential of the first and second wirings to which one end of the first transistor for detection and one end of the second transistor for detection are connected may be 0 volt. In this case, if a potential ($V_{cc}$) appears in the bit line when data is read out from a selected memory cell, it is required to adjust the bit line voltage to 0 volt when data is re-written, and if 0 volts appears in the bit line when data is read out from a selected memory cell, it is required to adjust the bit line voltage to $V_{cc}$ when data is re-written. For this purpose, a kind of switching circuit (inversion circuit) composed of transistors $TR_{IV-1}$, $TR_{IV-2}$, $TR_{IV-3}$ and $TR_{IV-4}$ as shown in FIG. 17 is provided between the bit lines, and there can be employed a constitution in which the transistors $TR_{IV-2}$ and $TR_{IV-4}$ are brought into an ON-state when data is read out and the transistors $TR_{IV-1}$ and $TR_{IV-3}$ are brought into an ON-state when data is re-written.

EXAMPLE 6

Figure 18A:
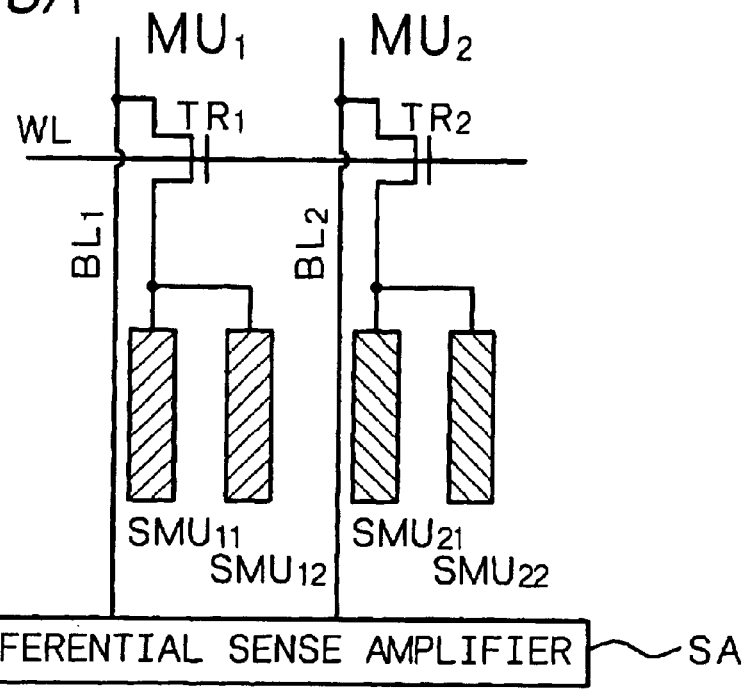
FIGS. 18A and 18B are conceptual circuit diagrams of ferroelectric-type nonvolatile semiconductor memories in Example 6.
Figure 19:
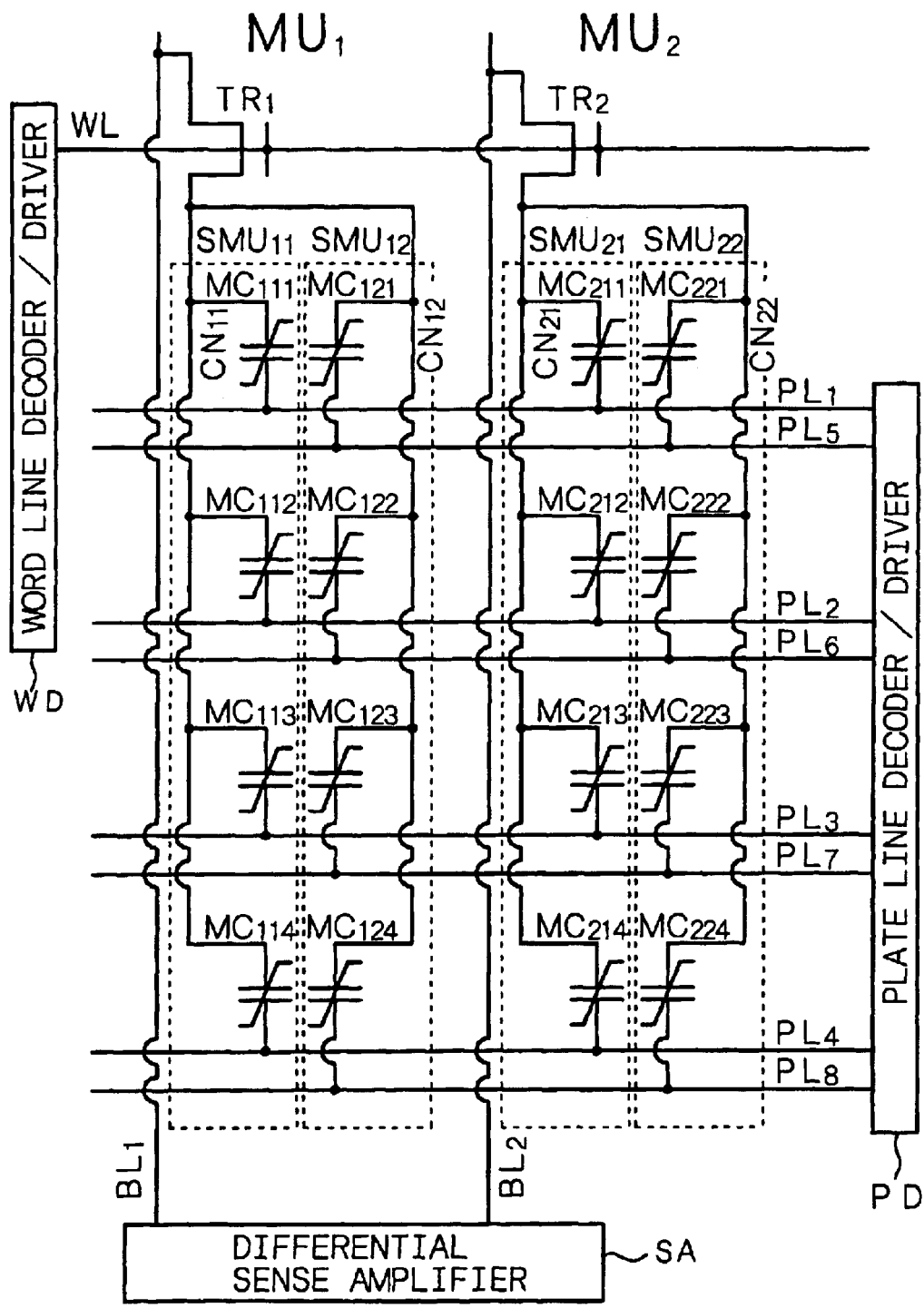
FIG. 19 is a more specific circuit diagram of the conceptual circuit diagram shown in FIG. 18.

Example 6 is concerned with the nonvolatile memory according to the fifth and sixth aspects of the present invention. The schematic partial cross-sectional view of the nonvolatile memory in Example 6, taken by cutting part of the nonvolatile memory through an imaginary perpendicular plane in parallel with the extending direction of the bit line, is as shown in FIG. 1. FIG. 18A shows a conceptual circuit diagram of the nonvolatile memory according to the sixth aspect of the present invention, and FIG. 19 shows a more specific circuit diagram of the conceptual circuit diagram shown in FIG. 18A. While FIG. 1 shows a first sub-memory unit, a second sub-memory unit also has a similar structure, and the second sub-memory unit is formed side by side with the first sub-memory unit in the direction perpendicular to the paper surface of the FIG. 1. The following explanation addresses the first sub-memory unit alone in some cases.

The nonvolatile memory in Example 6 has a plurality of memory cells $MC_{11M}$, $MC_{12M}$, $MC_{21M}$ and $MC_{22M}$ comprising a first electrode 21 or 31, a ferroelectric layer 22 or 32 formed at least on the above first electrode 21 or 31 and a second electrode 23 or 33 formed on the above ferroelectric layer 22 or 32. A plurality of the memory cells belong to one of two or more different thermal histories with regard to their production processes (specifically, in Example 6, the memory cells $MC_{11M}$ and the memory cells $MC_{21M}$ belong to one and the same thermal history group, and the memory cells $MC_{12M}$ and the memory cells $MC_{22M}$ belong to another and the same thermal history group), a pair of memory cells ($MC_{1nm}$ and $MC_{2nm}$) store complement data of 1 bit, and the pair of the memory cells ($MC_{1nm}$ and $MC_{2nm}$) belong to the same thermal history group.

In the nonvolatile memory of Example 6, the memory cells have a structure in which they are stacked through an insulating layer 26, the memory cells $MC_{11M}$ and $MC_{21M}$ formed on a certain insulating layer 16 belong to a thermal history group different from a thermal history group to which the memory cell $MC_{12M}$ and $MC_{22M}$ formed on other insulating layer 26 belong. The memory cells $MC_{11M}$ and $MC_{21M}$ formed on the same insulating layer 16 belong to the same thermal history group and the memory cells $MC_{12M}$ and $MC_{22M}$ formed on the same insulating layer 26 belong to the same thermal history group.

The nonvolatile memory in Example 6 comprises a first memory unit $MU_1$ and a second memory unit $MU_2$.

The first memory unit $MU_1$ has;

(A-1) a first bit line $BL_1$, (B-1) a first transistor for selection $TR_1$, (C-1) first sub-memory units $SMU_{1N}$ which are N in number ($N \geq 2$; N=2 in Example 6) and each of which is composed of memory cells $MC_{1NM}$ which are M in number ($M \geq 4$; M=4 in Example 6), and (D-1) plate lines which are M×N in number.

The second memory unit has;

(A-2) a second bit line $BL_2$, (B-2) a second transistor for selection $TR_2$, (C-2) second sub-memory units $SMU_{2N}$ which are N in number and each of which is composed of memory cells $MC_{2NM}$ which are M in number, and (D-2) the plate lines which are M×N in number and are shared with the plate lines which are M×N in number and constitute the above first memory unit.

The first sub-memory unit of an n-th layer (n=1, 2 . . . N) $SMU_{1n}$ and the second sub-memory unit of the n-th layer $SMU_{2n}$ are formed on the same insulating layer 16 or 26, and the first sub-memory unit of an n'-th layer (n'=2 . . . N) $SMU_{1n'}$ and the second sub-memory unit of the n'-th layer $SMU_{2n'}$ are stacked on the first sub-memory unit of the (n'−1)-th layer $SMU_{1(n'-1)}$ and the second sub-memory unit of the (n'−1)-th layer $SMU_{2(n'-1)}$ through the insulating layer 26.

Each of the memory cells $MC_{11m}$ and $MC_{21m}$ and the memory cells $MC_{12m}$ and $MC_{22m}$ comprises the first electrode 21 or 31, a ferroelectric layer 22 or 32 and a second electrode 23 or 33.

In the first memory unit $MU_1$, the first electrodes of the memory cells $MC_{1nm}$ constituting the first sub-memory unit of the n-th layer $SMU_{1n}$ are in common with the first sub-memory unit of the n-th layer $SMU_{1n}$, the common first electrode is connected to the first bit line $BL_1$ through the first transistor for selection $TR_1$, and the second electrode of the memory cell $MC_{1nm}$ in the m-th-place (m=1, 2 ... M) is connected to the common plate line in the [(n−1)M+m]-th-place. Specifically, the first electrodes 21 of the memory cells $MC_{11m}$ constituting the first sub-memory unit of the first layer $SMU_{11}$ are in common with the first sub-memory unit of the first layer $SMU_{11}$, the common first electrode (common node $CN_{11}$) is connected to the first bit line $BL_1$ through the first transistor for selection $TR_1$, and the second electrode 23 of the memory cell $MC_{11m}$ in the m-th-place (m=1, 2 ... M) is connected to the common plate line in the [(n−1)M+m]-th-place. The first electrodes 31 of the memory cells $MC_{12m}$ constituting the first sub-memory unit of the second layer $SMU_{12}$ are in common with the first sub-memory unit of the second layer $SMU_{12}$, the common first electrode (common node $CN_{12}$) is connected to the first bit line $BL_1$ through the first transistor for selection $TR_1$, and the second electrode 33 of the memory cell $MC_{12m}$ in the m-th-place (m=1, 2 ... M) is connected to the common plate line in the [(n−1)M+m]-th-place.

In the second memory unit $MU_2$, the first electrodes of the memory cells $MC_{2nm}$ constituting the second sub-memory unit of the n-th layer $SMU_{2n}$ are in common with the second sub-memory unit of the n-th layer $SMU_{2n}$, the common first electrode is connected to the second bit line $BL_2$ through the second transistor for selection $TR_2$, and the second electrode of the memory cell $MC_{2nm}$ in the m-th-place is connected to the common plate line in the [(n−1)M+m]-th-place. Specifically, the first electrodes 21 of the memory cells $MC_{21m}$ constituting the second sub-memory unit of the first layer $SMU_{21}$ are in common with the second sub-memory unit of the first layer $SMU_{21}$, the common first electrode (common node $CN_{21}$) is connected to the second bit line $BL_2$ through the second transistor for selection $TR_2$, and the second electrode 23 of the memory cell $MC_{21m}$ in the m-th-place is connected to the common plate line in the [(n−1)M+m]-th-place. The first electrodes 31 of the memory cells $MC_{22m}$ constituting the second sub-memory unit of the second layer $SMU_{22}$ are in common with the second sub-memory unit of the second layer $SMU_{22}$, the common first electrode (common node $CN_{22}$) is connected to the second bit line $BL_2$ through the second transistor for selection $TR_2$, and the second electrode 33 of the memory cell $MC_{21m}$ in the m-th-place is connected to the common plate line in the [(n−1)M+m]-th-place.

The memory cells $MC_{1nm}$ constituting the first sub-memory unit of the n-th layer $SMU_{1n}$ and the memory cells $MC_{2nm}$ constituting the second sub-memory unit of the n-th layer $SMU_{2n}$ have the same thermal history with regard to their production processes, and the memory cells $MC_{1nm}$ constituting the first sub-memory unit of the n-th layer $SMU_{1n}$ and the memory cells $MC_{2nm}$ constituting the second sub-memory unit of the n-th layer $SMU_{2n}$ have a thermal history different from a thermal history of the memory cells $MC_{1km}$ constituting the first sub-memory unit of a k-th layer (k≠n) and the memory cells $MC_{2km}$ constituting the second sub-memory unit of the k-th layer $SMU_{2k}$.

The memory cell $MC_{1nm}$ in the m-th-place constituting the first sub-memory unit of the n-th layer $SMU_{1n}$ in the first memory unit $MU_1$ and the memory cell $MC_{2nm}$ in the m-th-place constituting the second sub-memory unit of the n-th layer $SMU_{2n}$ in the second memory unit $MU_2$ form a pair to store complement data.

The first and second memory units $MU_1$ and $MU_2$ in Example 6 specifically has the same structure as that of the first and second memory units $MU_1$ and $MU_2$ in Example 1, so that their detailed explanation is omitted.

The first transistor for selection $TR_1$ constituting the first memory unit $MU_1$ and the second transistor for selection $TR_2$ constituting the second memory unit $MU_2$ are connected to the same word line WL, and the memory cells $MC_{1nm}$ and $MC_{2nm}$ are simultaneously controlled. In the nonvolatile memory in an actual embodiment, sets of such memory units for storing N×M bits (specifically, 8 bits) each are arranged in the form of an array as access units. The value of M shall not be limited to 4. It is sufficient to satisfy M≧2, and the actual value of M includes exponents of 2 (2, 4, 8, 16 ... ). Further, it is sufficient to satisfy N≧2, and the actual value of N includes exponents of 2 (2, 4, 8 ... ).

When complement data stored, for example, in the memory cell $MC_{11p}$ (p=one of 1, 2, 3 and 4) constituting the first sub-memory unit $SMU_{11}$ and the memory cell $MC_{21p}$ constituting the second sub-memory unit $SMU_{21}$ is read out, the word line WL is selected, and in a state where a voltage, for example, of (1/2) $V_{cc}$ is applied to the plate line connected to those memory cells other than the memory cells $MC_{11p}$ and $MC_{21p}$, the plate line to which the memory cells $MC_{11p}$ and $MC_{21p}$ are connected is driven. The above $V_{cc}$ refers, for example, a power source voltage. By the above operation, the potentials corresponding to data of 1 bit stored in the memory cells $MC_{11p}$ and $MC_{21p}$ appear in the first bit line $BL_1$ and the second bit line $BL_2$ as bit line potentials through the first transistor for selection $TR_1$ and the second transistor for selection $TR_2$. And, the voltages (bit line potentials) in the above bit lines $BL_{12}$ and $BL_{22}$ forming a pair are detected with the differential sense amplifier SA.

In the nonvolatile memory in Example 6, complement data of 1 bit is stored in a pair of memory cells. It is ensured that a pair of such memory cells belong to the same thermal history group with regard to their production processes, so that there is hardly caused a difference in the bit line potentials that appear in the bit lines.

Figure 18B:
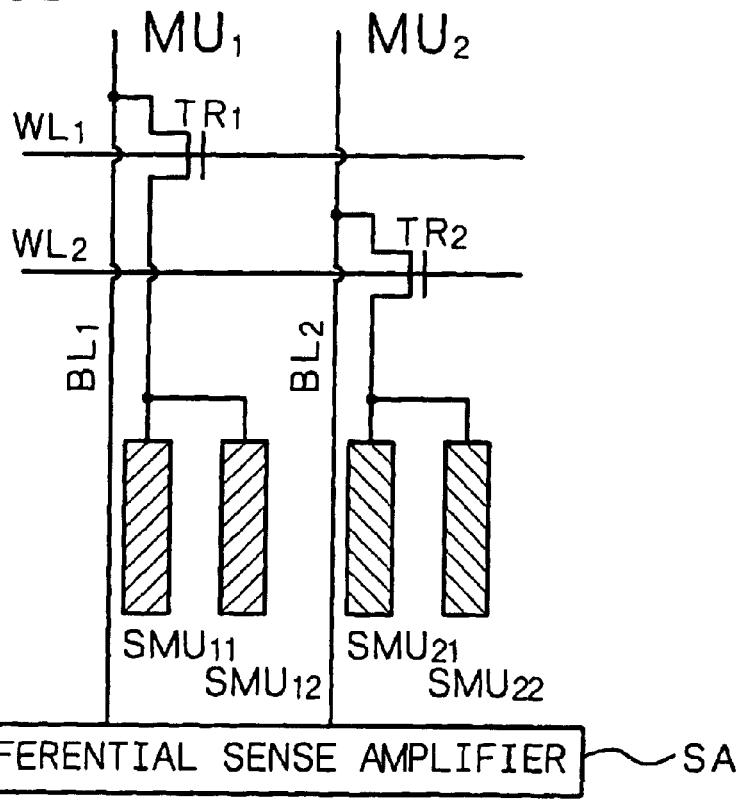

Alternatively, as shown in FIG. 18B, there may be employed a constitution in which the first transistor for selection $TR_1$ constituting the first memory unit $MU_1$ is connected to the word line $WL_1$, the second transistor for selection $TR_2$ constituting the second memory unit $MU_2$ is connected to the word line $WL_2$, and the word line $WL_1$ and the word line $WL_2$ are simultaneously driven so that the memory cells $MC_{1nm}$ and $MC_{2nm}$ are simultaneously controlled.

EXAMPLE 7

Figure 20:
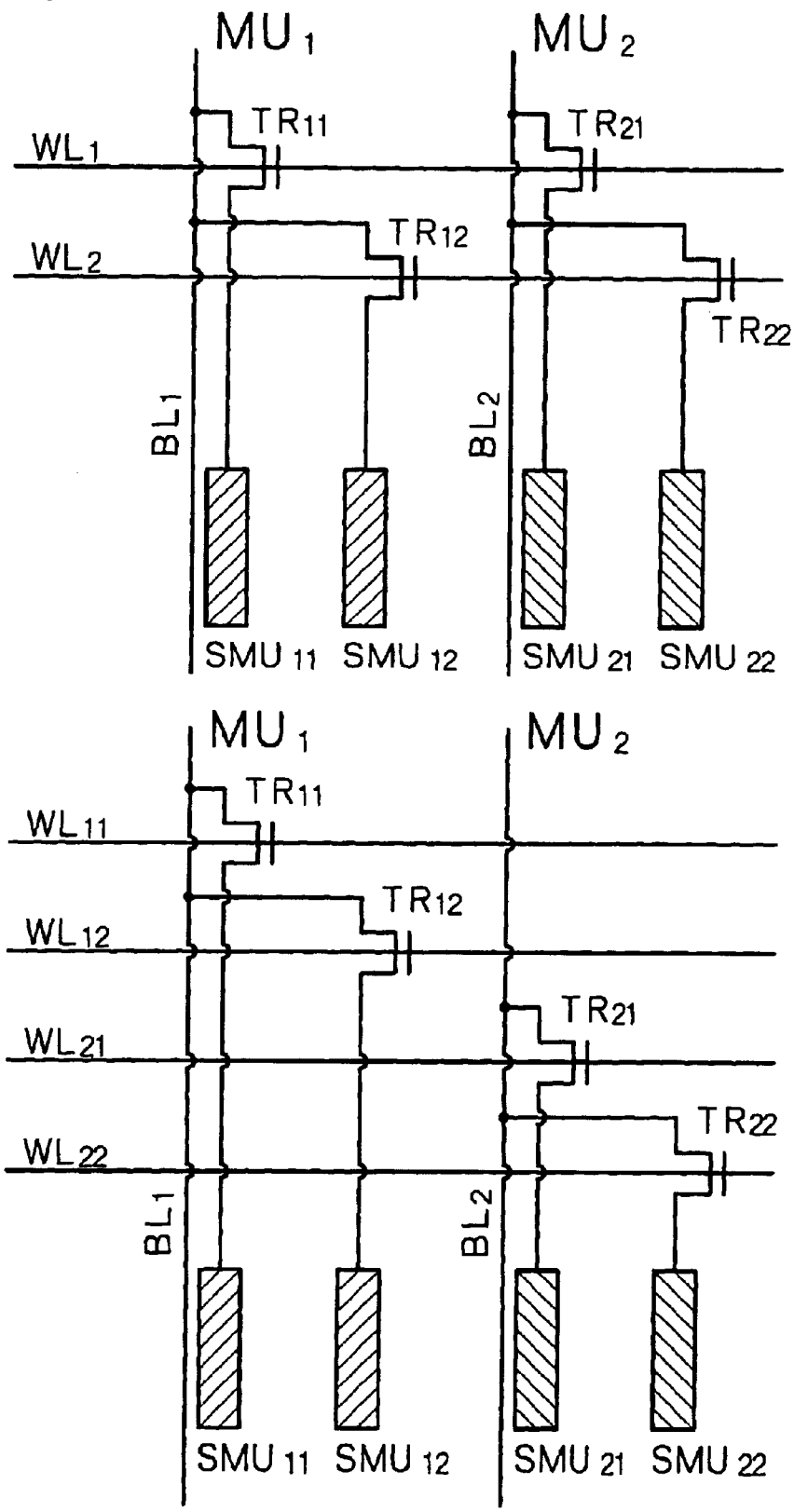
FIG. 20 is a conceptual circuit diagram of a ferroelectric-type nonvolatile semiconductor memory in Example 7.
Figure 21:
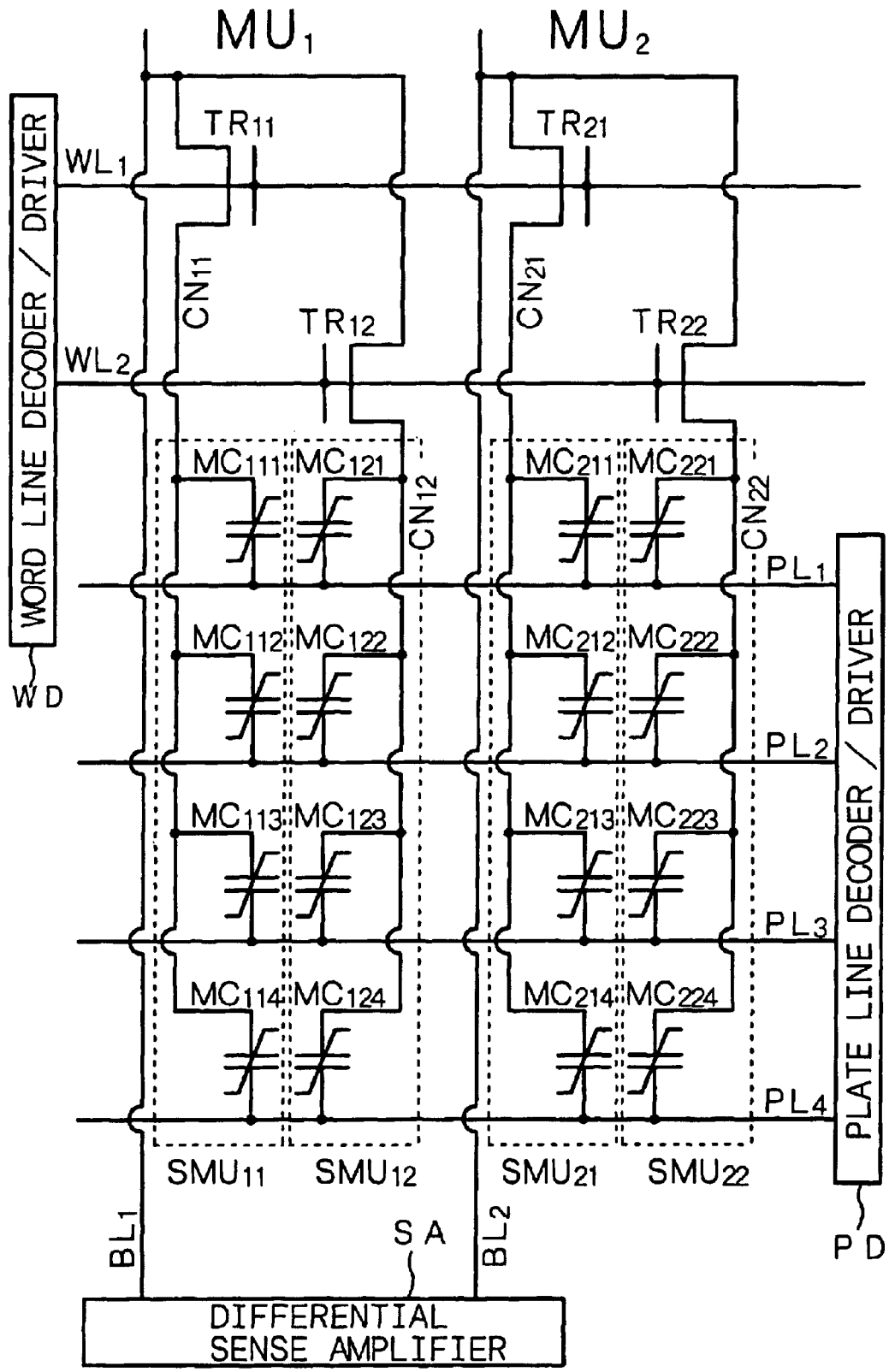
FIG. 21 is a more specific circuit diagram of the conceptual circuit diagram shown in FIG. 20.

Example 7 is concerned with the nonvolatile memory according to the fifth and seventh aspects of the present invention. The schematic partial cross-sectional view of the nonvolatile memory in Example 7, taken by cutting part of the nonvolatile memory through an imaginary perpendicular plane in parallel with the extending direction of the bit line, is as shown in FIG. 6. FIG. 20A shows a conceptual circuit diagram of the nonvolatile memory according to the seventh aspect of the present invention, and FIG. 21 shows a more specific circuit diagram of the conceptual circuit diagram shown in FIG. 20A. While FIG. 6 shows a first sub-memory unit, a second sub-memory unit also has a similar structure, and the second sub-memory unit is formed side by side with the first sub-memory unit in the direction perpendicular to the paper surface of the FIG. 6. The following explanation addresses the first sub-memory unit alone in some cases.

The nonvolatile memory in Example 7 comprises a first memory unit $MU_1$ and a second memory unit $MU_2$.

The first memory unit $MU_1$ has;

(A-1) a first bit line $BL_1$, (B-1) first transistors for selection $TR_{1N}$ which are N in number (N≧2; N=2 in Example 7), (C-1) first sub-memory units $SMU_{1N}$ which are N in number and each of which is composed of memory cells $MC_{1NM}$ which are M in number (M24; M=4 in Example 7), and (D-1) plate lines $PL_M$ which are M in number and each of which is shared with each memory cell constituting the first sub-memory units which are N in number, between or among the first sub-memory units which are N in number.

The second memory unit has;

(A-2) a second bit line $BL_2$, (B-2) second transistors for selection $TR_{2N}$ which are N in number, (C-2) second sub-memory units $SMU_{2N}$ which are N in number and each of which is composed of memory cells $MC_{2NM}$ which are M in number, and (D-2) the plate lines $PL_M$ which are M in number, each of which is shared with each memory cell constituting the second sub-memory units which are N in number, between or among the second sub-memory units which are N in number, and which are shared with the plate lines which are M in number and constitute said first memory unit.

The first sub-memory unit of an n-th layer (n=1, 2 . . . N) $SMU_{1n}$ and the second sub-memory unit of the n-th layer $SMU_{2n}$ are formed on the same insulating layer 16 or 26, and the first sub-memory unit of an n'-th layer (n'=2 . . . N) $SMU_{1n'}$ and the second sub-memory unit of the n'-th layer $SMU_{2n'}$' are stacked on the first sub-memory unit of the (n'−1)-th layer $SMU_{1(n'-1)}$ and the second sub-memory unit of the (n'−1)-th layer $SMU_{2(n'-1)}$ through the insulating layer 26.

Each of the memory cells $MC_{11m}$ and $MC_{21m}$ and the memory cells $MC_{12m}$ and $MC_{22m}$ comprises a first electrode 21 or 31, a ferroelectric layer 22 or 32 and a second electrode 23 or 33.

In the first memory unit $MU_1$, the first electrodes of the memory cells $MC_{1nm}$ constituting the first sub-memory unit of the n-th layer $SMU_{1n}$ are in common with the first sub-memory unit of the n-th layer $SMU_{1n}$, the common first electrode is connected to the first bit line $BL_1$ through the n-th-place first transistor for selection $TR_{1n}$, and the second electrode of the memory cell $MC_{1nm}$ in the m-th-place (m=1, 2 . . . M) is connected to the common plate line $PL_m$ in the m-th-place. Specifically, the first electrodes 21 (which will be referred to as "common node $CN_{11}$" in some cases) of the memory cells $MC_{11m}$ constituting the first sub-memory unit of the first layer $SMU_{11}$ are in common with the first sub-memory unit of the first layer $SMU_{11}$, the common first electrode 21 (common node $CN_{11}$) is connected to the first bit line $BL_1$ through the first-place first transistor for selection $TR_{11}$, and the second electrode 23 of the memory cell $MC_{11m}$ in the m-th-place is connected to the common plate line $PL_m$ in the m-th-place. The first electrodes 31 (which will be referred to as "common node $CN_{12}$" in some cases) of the memory cells $MC_{12m}$ constituting the first sub-memory unit of the second layer $SMU_{12}$ are in common with the first sub-memory unit of the second layer $SMU_{12}$, the common first electrode 31 (common node $CN_{12}$) is connected to the first bit line $BL_1$ through the second-place first transistor for selection $TR_{12}$, and the second electrode of the memory cell $MC_{12m}$ in the m-th-place is connected to the common plate line $PL_m$ in the m-th-place. The plate line $PL_m$ is also connected to the second electrode 23 or 33 of the memory cell constituting the second memory unit $MU_2$. In Example 7, more specifically, the plate lines are extending from the second electrodes 23 and 33. The plate lines $PL_m$ are inter-connected in a region that is not shown.

In the second memory unit $MU_2$, the first electrodes of the memory cells $MC_{2nm}$ constituting the second sub-memory unit of the n-th layer $SMU_{2n}$ are in common with the second sub-memory unit of the n-th layer $SMU_{2n}$, the common first electrode is connected to the second bit line $BL_2$ through the n-th-place second transistor for selection $TR_{2n}$, and the second electrode of the memory cell $MC_{2nm}$ in the m-th-place is connected to the common plate line $PL_m$ in the m-th-place. Specifically, the first electrodes 21 (which will be sometimes referred to as "common node $CN_{21}$" in some cases) of the memory cells $MC_{21m}$ constituting the second sub-memory unit of the first layer $SMU_{21}$ are in common with the second sub-memory unit of the first layer $SMU_{21}$, the common first electrode 21 (common node $CN_{21}$) is connected to the second bit line $BL_2$ through the first-place second transistor for selection $TR_{21}$, and the second electrode 23 of the memory cell $MC_{21m}$ in the m-th-place is connected to the common plate line $PL_m$ in the m-th-place. The first electrodes 31 (which will be sometimes referred to as "common node $CN_{22}$" in some cases) of the memory cells $MC_{22m}$ constituting the second sub-memory unit of the second layer $SMU_{22}$ are in common with the second sub-memory unit of the second layer $SMU_{22}$, the common first electrode 31 (common node $CN_{22}$) is connected to the second bit line $BL_2$ through the second-place second transistor for selection $TR_{22}$, and the second electrode 33 of the memory cell $MC_{22m}$ in the m-th-place is connected to the common plate line in the m-th-place.

The memory cells $MC_{1nm}$ constituting the first sub-memory unit of the n-th layer $SMU_{1n}$ and the memory cells $MC_{2nm}$ constituting the second sub-memory unit of the n-th layer $SMU_{2n}$ have the same thermal history with regard to their production processes, and the memory cells $MC_{1nm}$ constituting the first sub-memory unit of the n-th layer $SMU_{1n}$ and the memory cells $MC_{2nm}$ constituting the second sub-memory unit of the n-th layer $SMU_{2n}$ have a thermal history different from a thermal history of the memory cells $MC_{1km}$ constituting the first sub-memory unit of a k-th layer (k≠n) $SMU_{1k}$ and the memory cells $MC_{2km}$ constituting the second sub-memory unit of the k-th layer $SMU_{2k}$.

The memory cell $MC_{1nm}$ in the m-th-place constituting the first sub-memory unit of the n-th layer $SMU_{1n}$ in the first memory unit $MU_1$ and the memory cell $MC_{2nm}$ in the m-th-place constituting the second sub-memory unit of the n-th layer $SMU_{2n}$ in the second memory unit $MU_2$ form a pair to store complement data.

The specific structure of the first and second memory units $MU_1$ and $MU_2$ in Example 7 can be the same as the structure of the first and second memory units $MU_1$ and $MU_2$ explained in Example 3 with reference to FIG. 6, so that a detailed explanation thereof is omitted.

The first-place first transistor for selection $TR_{11}$ constituting the first memory unit $MU_1$ and the first-place second transistor for selection $TR_{21}$ constituting the second memory unit $MU_2$ are connected to the same word line $WL_1$, and the memory cells $MC_{11m}$ and $MC_{21m}$ are simultaneously controlled. The second-place first transistor for selection $TR_{12}$ constituting the first memory unit $MU_1$ and the second-place second transistor for selection $TR_{22}$ constituting the second memory unit $MU_2$ are connected to the same word line $WL_2$, and the memory cells $MC_{12m}$ and $MC_{22m}$ are simultaneously controlled. In the nonvolatile memory in an actual embodiment, sets of such memory units for storing N×M bits (specifically, 8 bits) each are arranged in the form of an array as access units. The value of M shall not be limited to 4. It is sufficient to satisfy $M \geq 2$, and the actual value of M includes exponents of 2 (2, 4, 8, 16 . . . ). Further, it is sufficient to satisfy $N \geq 2$, and the actual value of N includes exponents of 2 (2, 4, 8 . . . ).

When complement data stored, for example, in the memory cell $MC_{11p}$ (p=one of 1, 2, 3 and 4) constituting the first sub-memory unit $SMU_{11}$ and the memory cell $MC_{21p}$ constituting the second sub-memory unit $SMU_{21}$ is read out, the word line $WL_1$ is selected, and in a state where a voltage, for example, of $(1/2) V_{cc}$ is applied to the plate line $PL_j$ (j≠p) connected to those memory cells other than the memory cells $MC_{11p}$ and $MC_{21p}$, the plate line $PL_p$ to which the memory cells $MC_{11p}$ and $MC_{21p}$ are connected is driven. The above $V_{cc}$ refers, for example, a power source voltage. By the above operation, the potentials corresponding to complement data of 1 bit stored in the memory cells $MC_{11p}$ and $MC_{21p}$ appear in the first bit line $BL_1$ and the second bit line $BL_2$ as bit line potentials through the first-place first transistor for selection $TR_{11}$ and the first-place second transistor for selection $TR_{21}$. And, the voltages (bit line potentials) in the above bit lines $BL_{12}$ and $BL_{22}$ forming a pair are detected with the differential sense amplifier SA.

Alternatively, as shown in FIG. 20B, there may be employed a constitution in which the first-place first transistor for selection $TR_{11}$ is connected to the word line $WL_{11}$, the second-place first transistor for selection $TR_{12}$ is connected to the word line $WL_{12}$, the first-place second transistor for selection $TR_{21}$ is connected to the word line $WL_{21}$, the second-place second transistor for selection $TR_{22}$ is connected to the word line $WL_{22}$, the word line $WL_{11}$ and the word line $WL_{21}$ are simultaneously driven, and, the word line $WL_{12}$ and the word line $WL_{22}$ are simultaneously driven so that the memory cells $MC_{1nm}$ and $MC_{2nm}$ are simultaneously controlled.

EXAMPLE 8

Figure 22A:
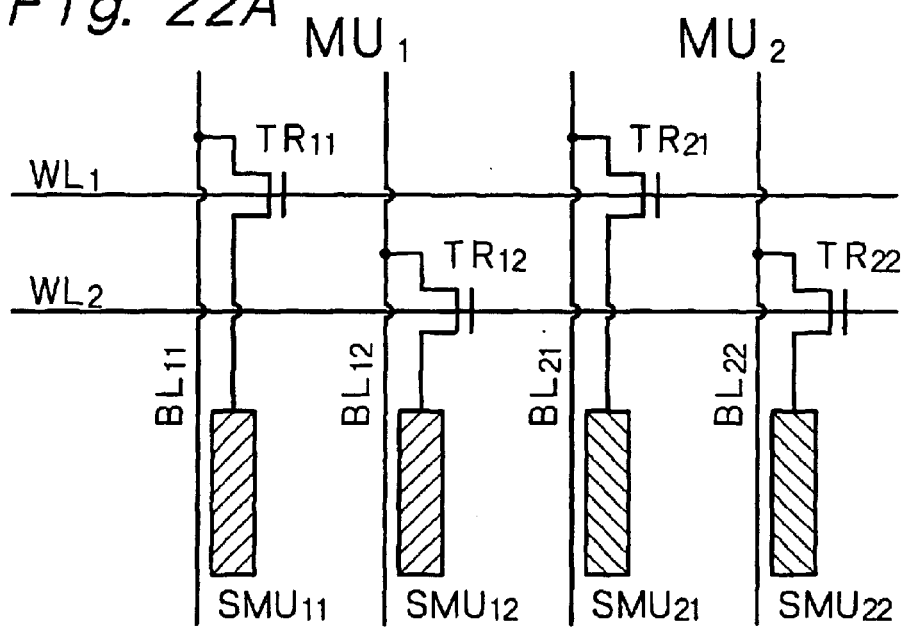
FIGS. 22A and 22B are circuit diagrams of ferroelectric-type nonvolatile semiconductor memories in Example 8.

Example 8 is a variant of Example 7. The schematic partial cross-sectional view of the nonvolatile memory in Example 8, taken by cutting part of the nonvolatile memory through an imaginary perpendicular plane in parallel with the extending direction of the bit line, is as shown in FIG. 11. FIG. 22A shows a conceptual circuit diagram of the nonvolatile memory in Example 8. While FIG. 11 shows a first sub-memory unit, a second sub-memory unit also has a similar structure, and the second sub-memory unit is formed side by side with the first sub-memory unit in the direction perpendicular to the paper surface of the FIG. 11. The following explanation addresses the first sub-memory unit alone in some cases.

The nonvolatile memory in Example 8 has first bit lines $BL_{1N}$ which are N in number and second bit lines $BL_{2N}$ which are N in number. In the first memory unit $MU_1$, the common first electrode in the first sub-memory unit of the n-th layer $SMU_{1n}$ is connected to the n-th-place first bit line $BL_{1n}$ through the n-th-place first transistor for selection $TR_{1n}$, and in the second memory unit $MU_2$, the common first electrode in the second sub-memory unit of the n-th layer $SMU_{2n}$ is connected to the n-th-place second bit line $BL_{2n}$ through the n-th-place second transistor for selection $TR_{2n}$.

The specific structure of the first and second memory units $MU_1$ and $MU_2$ in Example 8 can be the same as the structure of the first and second memory units $MU_1$ and $MU_2$ explained in Example 4 with reference to FIG. 11, so that a detailed explanation thereof is omitted.

The first-place first transistor for selection $TR_{11}$ constituting the first memory unit $MU_1$ and the first-place second transistor for selection $TR_{21}$ constituting the second memory unit $MU_2$ are connected to the same word line $WL_1$, and the memory cells $MC_{11m}$ and $MC_{21m}$ are simultaneously controlled. The second-place first transistor for selection $TR_{12}$ constituting the first memory unit $MU_1$ and the second-place second transistor for selection $TR_{22}$ constituting the second memory unit $MU_2$ are connected to the same word line $WL_2$, and the memory cells $MC_{12m}$ and $MC_{22m}$ are simultaneously controlled. In the nonvolatile memory in an actual embodiment, sets of such memory units for storing N×M bits (specifically, 8 bits) each are arranged in the form of an array as access units. The value of M shall not be limited to 4. It is sufficient to satisfy $M \geq 2$, and the actual value of M includes exponents of 2 (2, 4, 8, 16 . . . ). Further, it is sufficient to satisfy $N \geq 2$, and the actual value of N includes exponents of 2 (2, 4, 8 . . . ).

When complement data stored, for example, in the memory cell $MC_{11p}$ (p is one of 1, 2, 3 and 4) constituting the first sub-memory unit $SMU_{11}$ and the memory cell $MC_{21}$ constituting the second sub-memory unit $SMU_{21}$ is read out, the word line $WL_1$ is selected, and in a state where a voltage, for example, of $(1/2) V_{cc}$ is applied to the plate line $PL_j$ (j≠p) connected to those memory cells other than the memory cells $MC_{11p}$ and $MC_{21p}$, the plate line $PL_p$ to which the memory cells $MC_{11p}$ and $MC_{21p}$ are connected is driven. The above $V_{cc}$ refers, for example, a power source voltage. By the above operation, the potentials corresponding to complement data of 1 bit stored in the memory cells $MC_{11p}$ and $MC_{21p}$ appear in the first-place first bit line $BL_{11}$ and the first-place second bit line $BL_{21}$ as bit line potentials through the first-place first transistor for selection $TR_{11}$ and the first-place second transistor for selection $TR_{21}$. And, the voltages (bit line potentials) in the above bit lines $BL_{12}$ and $BL_{22}$ forming a pair are detected with the differential sense amplifier SA.

Figure 22B:
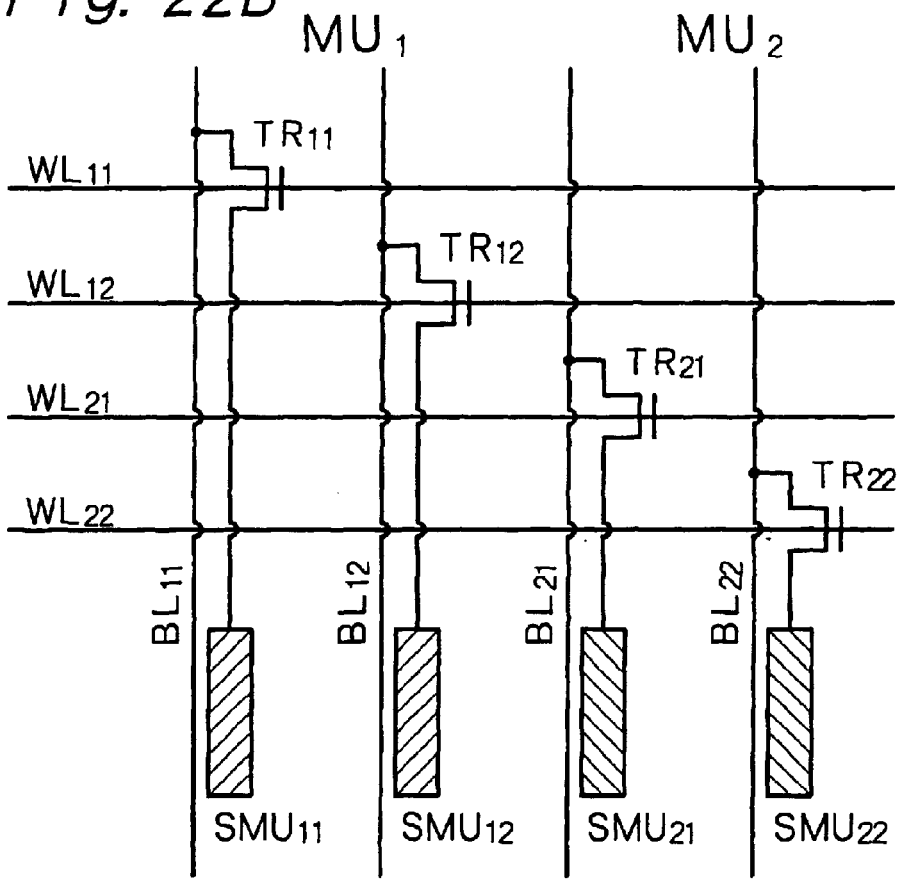

Alternatively, as shown in FIG. 22B, there may be employed a constitution in which the first-place first transistor for selection $TR_{11}$ is connected to the word line $WL_{11}$, the second-place first transistor for selection $TR_{12}$ is connected to the word line $WL_{12}$, the first-place second transistor for selection $TR_{21}$ is connected to the word line $WL_{21}$, the second-place second transistor for selection $TR_{22}$ is connected to the word line $WL_{22}$, the word line $WL_{11}$ and the word line $WL_{21}$ are simultaneously driven, and, the word line $WL_{12}$ and the word line $WL_{22}$ are simultaneously driven so that the memory cells $MC_{1nm}$ and $MC_{2nm}$ are simultaneously controlled.

While the present invention has been explained hereinabove with reference to Examples, the present invention shall not be limited thereto. The structures of the nonvolatile memories, the materials for use, the various forming conditions, the circuit constitutions, the operation methods, etc., which are explained in Examples, are give for an illustrative purpose, and may be changed or altered as required.

Generally, when the total number of signal lines per unit for unit driving is "A", and if the number of word lines among the signal lines is "B" and if the number of plate lines among the signal lines is "C", A=B+C is satisfied. When the total number "A" is constant, it is sufficient to satisfy B=C for obtaining a maximum total address number (=B×C) per unit. For arranging peripheral circuits most efficiently, therefore, the number "B" of the word lines and the number "C" of the plate lines per unit can be equal to each other. The number of the word lines per unit in the access unit of a row address is equal to the number (N) of stacks of memory cells, and the number of the plate lines is equal to the number (M) of the memory cells constituting the sub-memory unit. With an increase in the numbers of these word lines and these plate lines, the substantial integration degree of the nonvolatile memory improves. A product of the number of the word lines and the number of the plate lines is the number of addresses that can be accessed. When collective and continuous access is a precondition, a value obtained by deducting "1" from the above product is the number of times of disturbances. The product of the number of the word lines and the number of the plate lines is therefore determined on the basis of the durability of memory cells against disturbance and process factors. The above disturbance refers to a phenomenon in which an electric field is exerted on the ferroelectric layer constituting a non-selected memory cell in the direction in which the polarization is inverted, that is, in the direction in which stored data is deteriorated or destroyed.

Figure 23:
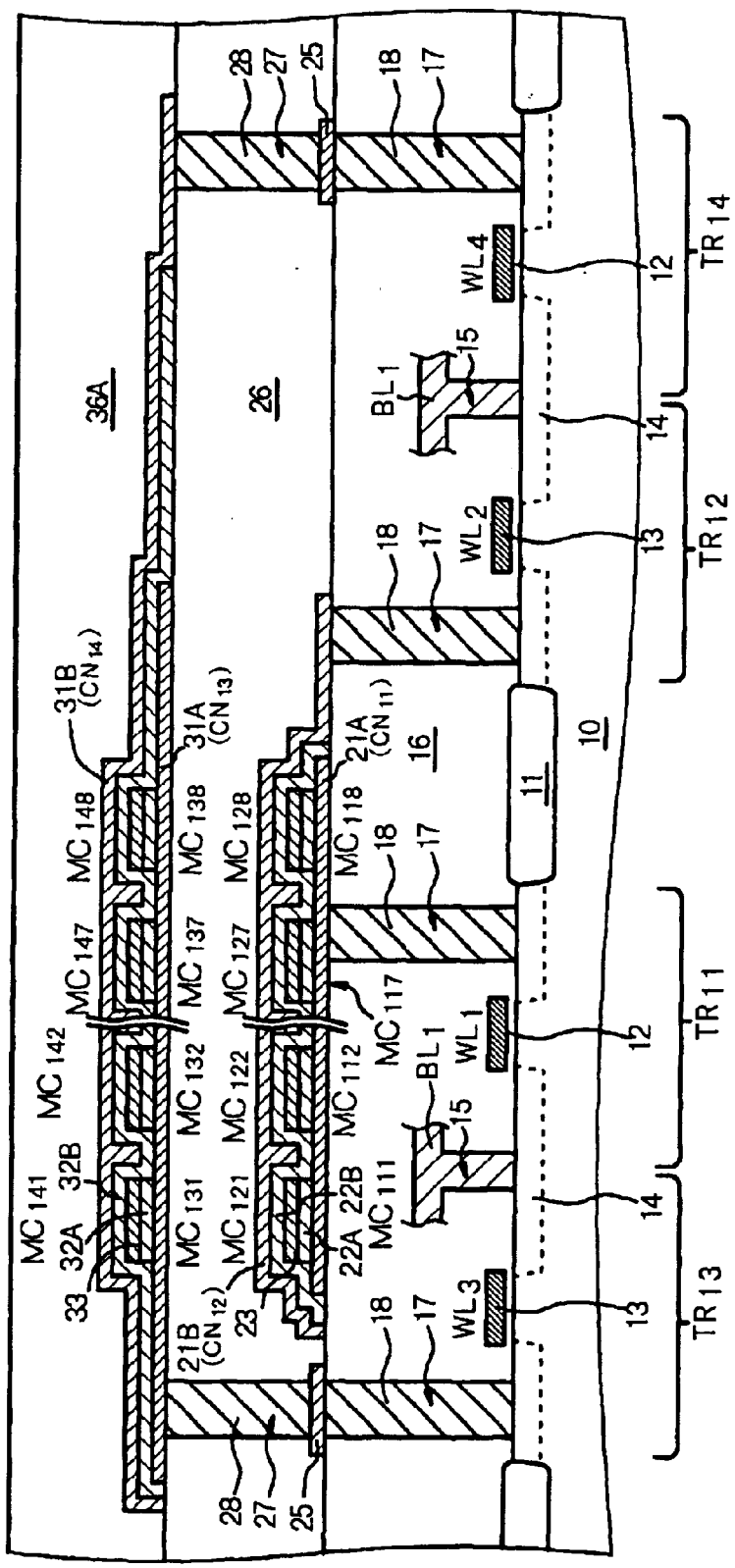
FIG. 23 is a schematic partial cross-sectional view of one memory unit, obtained when a variant of the ferroelectric-type nonvolatile semiconductor memory in Example 3 or 7 is cut through an imaginary vertical plane that is in parallel with the extending direction of a bit line.
Figure 24:
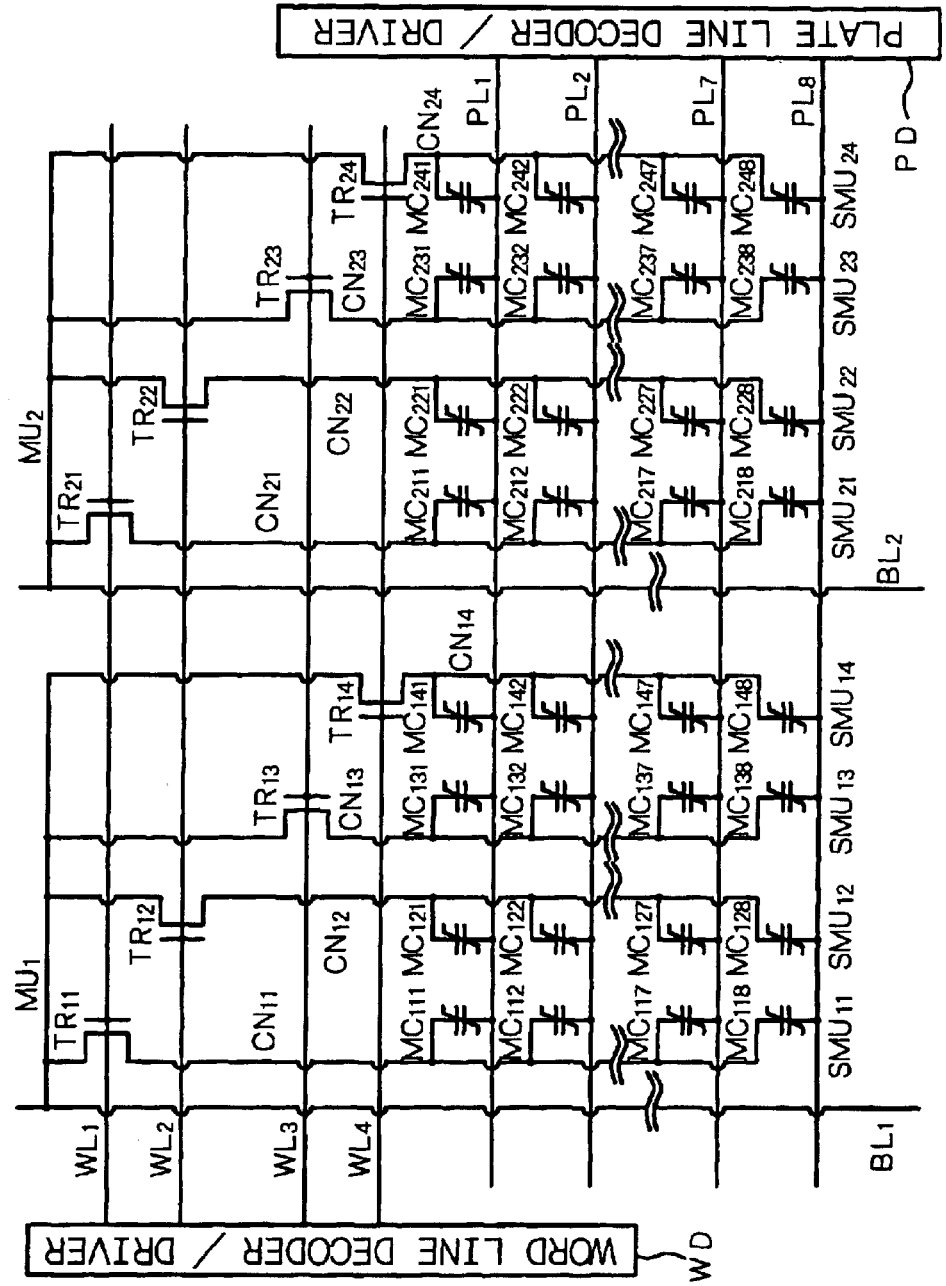
FIG. 24 is a circuit diagram of a variant of the ferroelectric-type nonvolatile semiconductor memory of Example 7 shown in FIG. 23.

The nonvolatile memory in Example 3 or 7 may be modified into a structure as shown in FIG. 23. FIG. 24 shows a circuit diagram thereof. The first memory unit $MU_1$ and the second memory unit $MU_2$ have the same structure. The first memory unit $MU_1$ will be explained below. The circuit diagram shown in FIG. 24 is concerned with a nonvolatile memory obtained by modification of the nonvolatile memory in Example 7, and when the transistor for selection $TR_{1n}$ and the transistor for selection $TR_{2n}$ are connected to different word lines, the modified nonvolatile memory is a variant of the nonvolatile memory in Example 3.

The first memory unit $MU_1$ in the above nonvolatile memory comprises a first bit line $BL_1$ connected to a differential sense amplifier SA, first transistors for selection $TR_{11}$, $TR_{12}$, $TR_{13}$ and $TR_{14}$ which are N in number (N≧2; N=4 in this embodiment) and formed of MOS type FETs, sub-memory units $SMU_{11}$, $SMU_{12}$, $SMU_{13}$ and $SMU_{14}$ which are N in number, and plate lines. The sub-memory unit of the first layer $SMU_{11}$ is composed of memory cells $MC_{11m}$ (m=1, 2 . . . 8) which are M in number (M≧2; M=8 in this embodiment). The sub-memory unit of the second layer $SMU_{12}$ is also composed of memory cell $MC_{12m}$ (m=1, 2 . . . 8) which are M (M=8) in number. The sub-memory unit of the third layer $SMU_{13}$ is also composed of memory cell $MC_{13m}$ (m=1, 2 . . . 8) which are M (M=8) in number, and the sub-memory unit of the fourth layer $SMU_{14}$ is also composed of memory cell $MC_{14m}$ (m=1, 2 . . . 8) which are M (M=8) in number. The number of the plate lines is M (M=8 in this embodiment) and is represented by $PL_m$ (m=1, 2 . . . 8). The word line $WL_{1n}$ connected to the gate electrode of the first transistor for selection $TR_{1n}$ is connected to a word line decoder/driver WD. Each plate line $PL_m$ is connected to a plate line decoder/driver PD.

Each memory cell $MC_{11m}$ constituting the sub-memory unit of the first layer $SMU_{11}$ comprises a first electrode 21A, a ferroelectric layer 22A and a second electrode 23, each memory cell $MC_{12m}$ constituting the sub-memory unit of the second layer $SMU_{12}$ comprises a first electrode 21B, a ferroelectric layer 22B and a second electrode 23, each memory cell $MC_{13m}$ constituting the sub-memory unit of the third layer $SMU_{13}$ comprises a first electrode 31A, a ferroelectric layer 32A and a second electrode 33, and each memory cell $MC_{14m}$ constituting the sub-memory unit of the fourth layer $SMU_{14}$ comprises a first electrode 31B, a ferroelectric layer 32B and a second electrode 33. The first electrodes 21A, 21B, 31A and 31B of the memory cells are in common with the sub-memory units $SMU_{11}$, $SMU_{12}$, $SMU_{13}$ and $SMU_{14}$, respectively. These common first electrodes 21A, 21B, 31A and 31B will be referred to as common nodes $CN_{11}$, $CN_{12}$, $CN_{13}$ and $CN_{14}$, respectively.

The common first electrode 21A (first common node $CN_{11}$) in the sub-memory unit of the first layer $SMU_{11}$ is connected to the first bit line $BL_1$ through the first-place first transistor for selection $TR_{11}$. The common first electrode 21B (second common node $CN_{12}$) in the sub-memory unit of the second layer $SMU_{12}$ is connected to the first bit line $BL_1$ through the second-place first transistor for selection $TR_{12}$. The common first electrode 31A (third common node $CN_{13}$) in the sub-memory unit of the third layer $SMU_{13}$ is connected to the first bit line $BL_1$ through the third-place first transistor for selection $TR_{13}$. The common first electrode 31B (fourth common node $CN_{14}$) in the sub-memory unit of the fourth layer $SMU_{14}$ is connected to the first bit line $BL_1$ through the fourth-place first transistor for selection $TR_{14}$.

The memory cell $MC_{11m}$ constituting the sub-memory unit of the first layer $SMU_{11}$ and the memory cell $MC_{12m}$ constituting the sub-memory unit of the second layer $SMU_{12}$ have the second electrode 23 in common, and the common second electrode 23 in the m-th-place is connected to the common plate line $PL_m$. The memory cell $MC_{13m}$ constituting the sub-memory unit of the third layer $SMU_{13}$ and the memory cell $MC_{14m}$ constituting the sub-memory unit of the fourth layer $SMU_{14}$ have the second electrode 33 in common, and the common second electrode 33 in the m-th-place is connected to the common plate line $PL_m$. Specifically, the common plate line $PL_m$ is formed of an extending portion of the common second electrode 23 in the m-th-place, the common plate line $PL_m$ is formed of an extending portion of the common second electrode 33 in the m-th-place, and these common plate lines $PL_m$ are interconnected in a region that is not shown.

In the nonvolatile memory in this embodiment, the sub-memory units $SMU_{11}$ and $SMU_{12}$ and sub-memory units $SMU_{13}$ and $SMU_{14}$ are stacked through an insulating layer 26. The sub-memory unit $SMU_{14}$ is covered with an insulation layer 36A. The sub-memory unit of the first layer $SMU_{11}$ is formed above a semiconductor substrate 10 and on the insulating layer 16. On the semiconductor substrate 10 is formed a device isolation region 11. Each of the transistors for selection $TR_{11}$, $TR_{12}$, $TR_{13}$ and $TR_{14}$ comprises a gate insulating layer 12, a gate electrode 13 and source/drain regions 14A and 14B. The other source/drain region 14B of each of the first-place first transistor for selection $TR_{11}$, the second-place first transistor for selection $TR_{12}$, the third-place first transistor for selection $TR_{13}$ and the fourth-place first transistor for selection $TR_{14}$ is connected to the first bit line $BL_1$ through contact holes 15. One source/drain region 14A of the first-place first transistor for selection $TR_{11}$ is connected to the first common node $CN_{11}$ through a contact hole 18 formed in an opening portion formed through the insulating layer 16. One source/drain region 14A of the second-place first transistor for selection $TR_{12}$ is connected to the second common node $CN_{12}$ through a contact hole 18. One source/drain region 14A of the third-place first transistor for selection $TR_{13}$ is connected to the third common node $CN_{13}$ through a contact hole 18, a pad portion 25 and a contact hole 28 formed in an opening portion formed through the insulating layer 26. One source/drain region of the fourth-place first transistor for selection $TR_{14}$ is connected to the fourth common node $CN_{14}$ through a contact hole 18, a pad portion 25 and a contact hole 28. The above structure can be applied to the nonvolatile memories in other Examples.

Figure 25:
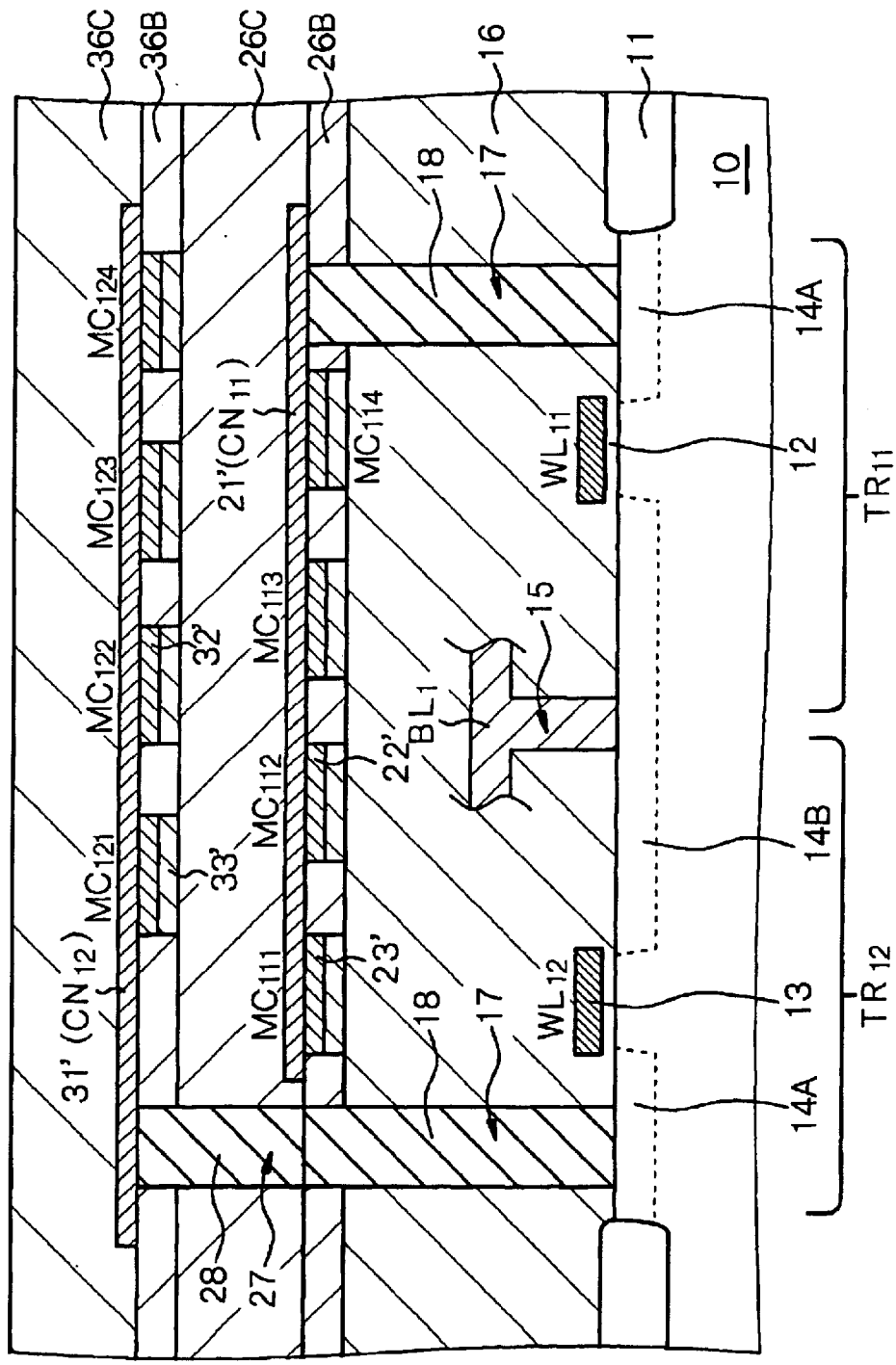
FIG. 25 is a schematic partial cross-sectional view of one memory unit, obtained when another variant of the ferroelectric-type nonvolatile semiconductor memory in Example 3 or 7 is cut through an imaginary vertical plane that is in parallel with the extending direction of a bit line.
Figure 26:
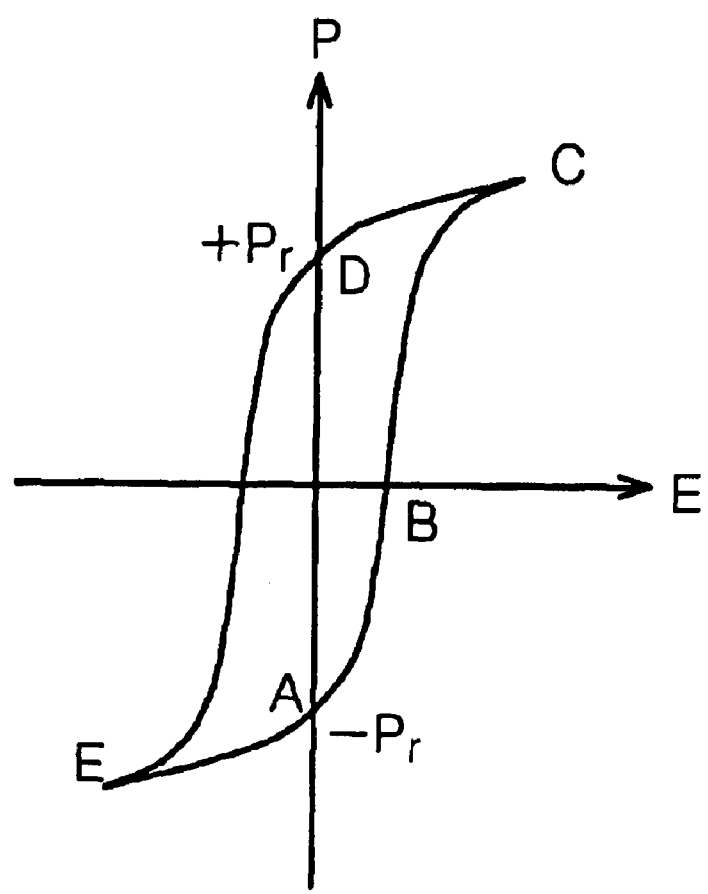
FIG. 26 is a diagram of P-E hysteresis loop of a ferroelectric material.
Figure 27:
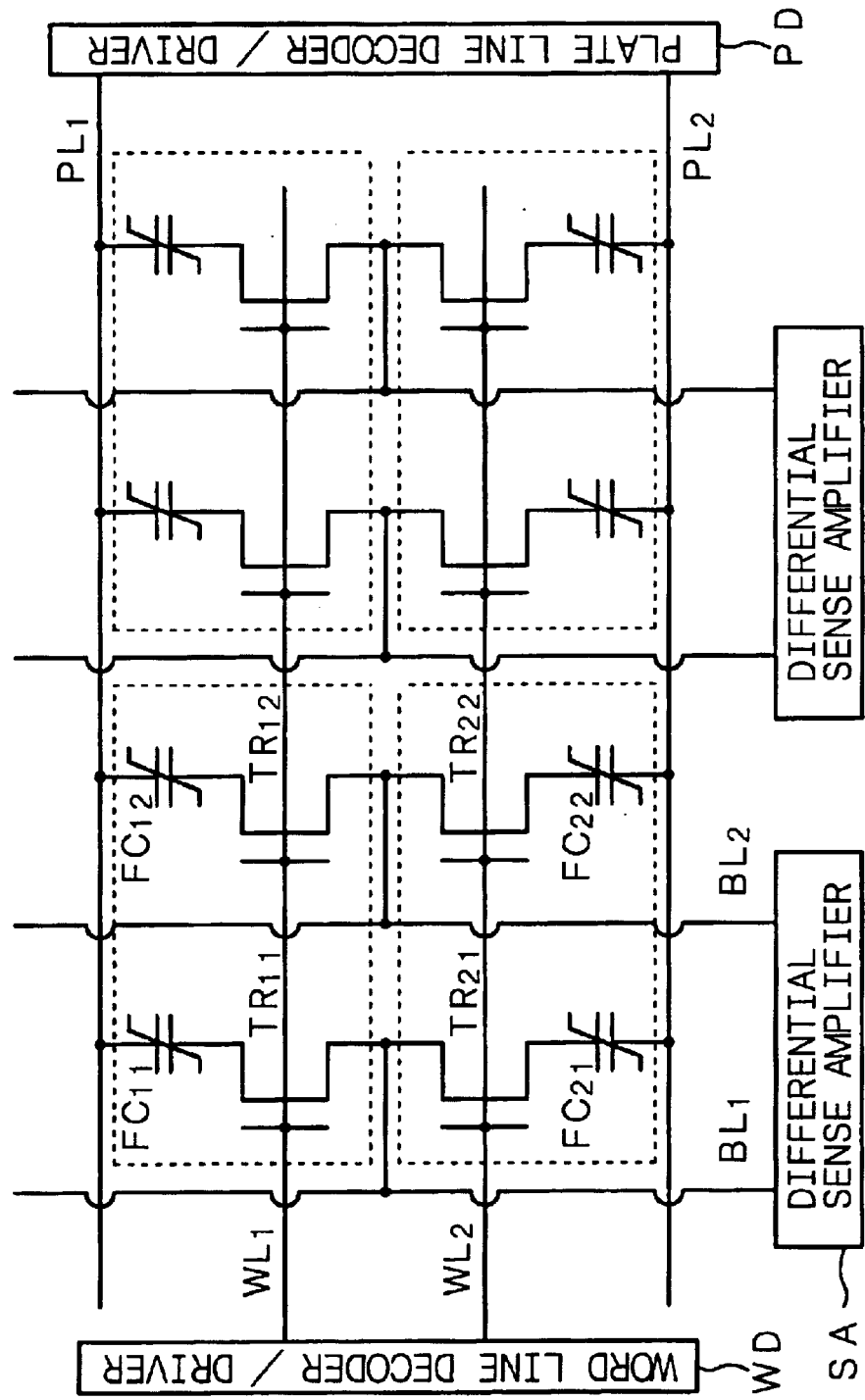
FIG. 27 is a circuit diagram of a ferroelectric-type nonvolatile semiconductor memory disclosed in U.S. Pat. No. 4,873,664.
Figure 28:
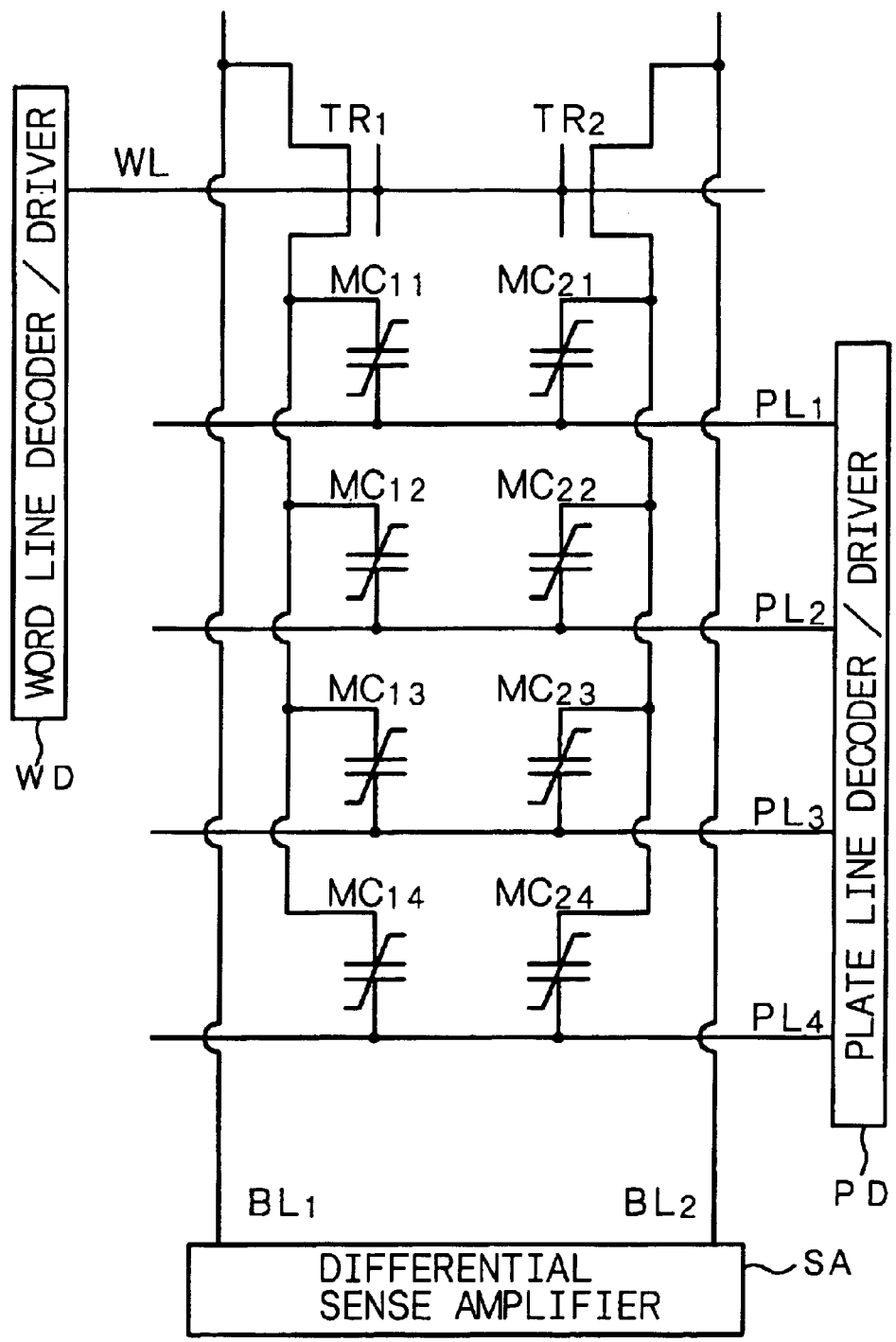
FIG. 28 is a circuit diagram of a ferroelectric-type nonvolatile semiconductor memory disclosed in JP-A-9-121032.

For example, as a variant of the nonvolatile memory in Example 3 or 7, there may be employed a structure in which first electrodes 21' and 31' are formed as upper electrodes, and second electrodes 23' and 33' are formed as lower electrodes as shown in FIG. 25. The above structure can be also applied to the nonvolatile memories in other Examples. In FIG. 25, reference numerals 26B and 26C indicate a lower layer and an upper layer of an insulating layer, and reference numerals 36B and 36C indicate a lower layer and an upper layer of an insulation layer.

In the nonvolatile memory explained in Example 4 with reference to the schematic partial cross-sectional view of FIG. 11 and the circuit diagrams of FIGS. 12 to 14, there may be employed a constitution in which the memory cell $MC_{11m}$ in the m-th-place constituting the first sub-memory unit of the first layer $SMU_{11}$ in the first memory unit and the memory cell $MC_{12m}$ in the m-th-place constituting the first sub-memory unit of the second layer $SMU_{12}$ in the first memory unit form a pair and share the plate line $PL_m$ to store data of 1 bit each. In this case, when the first and second reference capacitors $RC_1$ and $RC_2$ are constituted of MOS capacitors as shown in the circuit diagram of FIG. 12, and when data stored in the memory cell $MC_{11p}$ constituting the first sub-memory unit $SMU_{11}$ is read out, the word line $WL_{11}$ is selected, and in a state where a voltage, for example, of (1/2) $V_{cc}$ is applied to the plate line $PL_j$ (j≠p), the plate line $PL_p$ is driven. By this operation, a potential corresponding to data of 1 bit stored in the memory cell $MC_{11p}$ appears in the first-place first bit line $BL_{11}$, as a bit line potential through the first-place first transistor for selection $TR_{11}$. And, a switching circuit $SW_{12}$ is brought into an ON-state. As a result, a reference potential $V_{REF-2}$ appears in the second-place first bit line $BL_{12}$ as a bit line potential. The voltages (bit line potentials) in the bit lines $BL_{11}$ and $BL_{12}$ forming a pair are detected with the differential sense amplifier SA.

When the first and second reference capacitors $RC_{A1}$, $RC_{A2}$, $RC_{B1}$ and $RC_{B2}$ are constituted of the ferroelectric capacitors each, and when data is read out from a memory cell, the switching circuits $SW_{A12}$, $SW_{A22}$, $SW_{B12}$ and $SW_{B22}$ are brought into an ON-state in advance, the second electrodes constituting the reference capacitors $RC_{A1}$, $RC_{A2}$, $RC_{B1}$ and $RC_{B2}$ are connected to a reference-plate-line driver RPD, and a predetermined potential is applied to reference-plate lines $PL_{REF-A1}$, $PL_{REF-A2}$, $PL_{REF-B1}$ and $PL_{REF-B2}$ from the reference-plate-line driver RPD. As a result, a charge is accumulated in the ferroelectric layer constituting each of the reference capacitors $RC_{A1}$, $RC_{A2}$, $RC_{B1}$ and $RC_{B2}$. And, when data stored, for example, in the memory cell $MC_{11p}$ constituting the first sub-memory unit $SMU_{11}$ is read out, the word line $WL_{11}$ is selected, and in a state where a voltage, for example, of (1/2) $V_{cc}$ is applied to the plate line $PL_j$ (j≠p), the plate line $PL_p$ is driven. By the above operation, a potential corresponding to data of 1 bit stored in the memory cell $MC_{11p}$ appears in the first-place first bit line $BL_{11}$ as a bit line potential through the first-place first transistor for selection $TR_{11}$. And, in a state where a proper electric field is applied to the ferroelectric layer of the reference capacitor $RC_{A2}$, the switching circuit $SW_{A21}$ is brought into an ON-state. As a result, the reference potential $V_{REF-2}$ appears in the second-place first bit line $BL_{12}$ as a bit line potential. And, the voltages (bit line potentials) in the above bit lines $BL_{11}$ and $BL_{12}$ forming a pair are detected with the differential sense amplifier SA.

When data stored, for example, in the memory cell $MC_{22p}$ constituting the second sub-memory unit $SMU_{22}$ is read out, the word line $WL_{22}$ is selected, and in a state where a voltage, for example, of (1/2) $V_{cc}$ is applied to the plate line $PL_j$ (j≠p), the plate line $PL_p$ is driven. By the above operation, a potential corresponding to data of 1 bit stored in the memory cell $MC_{22p}$ appears in the second-place second bit line $BL_{22}$ as a bit line potential through the second-place second transistor for selection $TR_{22}$. And, in a state where a proper electric field is applied to the ferroelectric layer of the reference capacitor $RC_{A2}$, the switching circuit $SW_{A21}$ is brought into an ON-state. As a result, the reference potential $V_{REF-2}$ appears in the second-place first bit line $BL_{12}$ as a bit line potential. And, the voltages (bit line potentials) in the above bit lines $BL_{12}$ and $BL_{22}$ forming a pair are detected with the differential sense amplifier SA.

In the ferroelectric-type nonvolatile semiconductor memory according to any one of the first to fourth aspects of the present invention, the reference potentials having different potential levels are provided to the bit lines connected to the memory cells belonging to different thermal history groups, or one reference potential is provided to the memory cells constituting the first and second sub-memory units of the n-th layer, and other different potential is provided to the memory cells constituting the first and second sub-memory units of the k-th layer (k≠n), so that proper reference potentials can be provided to the bit lines even if there are included memory cells having different thermal histories with regard to their production processes, and that almost no difference is caused between those bit line potentials that appear in the bit lines. In the ferroelectric-type nonvolatile semiconductor memory according to any one of the fifth to seventh aspects of the present invention, a complement data of 1 bit is stored in a pair of the memory cells. It is ensured that these memory cells forming a pair belong to the same thermal history group with regard to their production processes, so that almost no change is caused between those bit line potentials that appear in the bit lines. As a consequence, finer memory cells can be formed, and stacking of the memory cells is accomplished, so that there can be provided a ferroelectric-type nonvolatile semiconductor memory that permits a high operation margin, has high reliably and has a high integration degree.

In the ferroelectric-type nonvolatile semiconductor memory according to the fourth aspect of the present invention, one transistor for writing-in, one transistor for detection, one transistor for read-out and transistors for selection which are N in number are sufficient for memory cells which are M×N in number, so that the cell area per bit can be further decreased. Further, the operation of the transistor for detection is controlled by the potential that occurs in the common first electrode on the basis of data stored in the memory cell, and the first electrode is in common with the memory cells which are M in number, so that there is caused a state where a kind of additional load capacity is added to the first electrode. As a result, when a voltage is applied to the plate line for reading-out of data, an increase in the potential of the first electrode can be suppressed, and a sufficient potential difference is generated between the first electrode and the second electrode, so that the ferroelectric layer reliably undergoes polarization inversion.

What is claimed is:

1. A ferroelectric-type nonvolatile semiconductor memory comprising a plurality of bit lines and a plurality of memory cells, each memory cell comprising a first electrode, a first side of a ferroelectric layer connected to said first electrode and a second side of the ferroelectric layer connected to a second electrode, each of said memory cells belonging to one of two or more thermal history groups having different thermal histories with regard to their production processes, each member of a pair of said memory cells being selectively connected to a corresponding one of first and second bit lines, and wherein each member of the pair of memory cells belongs to a different thermal history group, said pair of bit lines being connected to a differential sense amplifier, wherein, when data stored in a first one of said memory cells forming the pair is read out, a first reference potential is provided to the second bit line which is isolated from the second one of the memory cells of the pair, when data stored in the second one of said memory cells forming the pair is read out, a second reference potential is provided to the first bit line, and the first reference potential is provided to the second bit line when reading data from all other memory cells belonging to the same thermal history group as the first one of said memory cells and the second reference potential is applied to the first bit line when reading data from all other memory cells belonging to the same thermal history group as the second memory cell.

2. The ferroelectric-type nonvolatile semiconductor memory according to claim 1, in which the memory cells have a structure in which the memory cells are stacked through an insulating layer, wherein each of the memory cells formed on one insulating layer belong to a thermal history group different from the thermal history group to which the memory cells formed on a different insulating layer belong, and the memory cells formed on the same insulating layer belong to the same thermal history group.

3. The ferroelectric-type nonvolatile semiconductor memory according to claims 1 or 2, in which a number of reference capacitors equal to the number of thermal history groups are further provided.

4. A ferroelectric non-volatile memory comprising:

a first bit line and a second bit line respectively connected to first and second inputs of a differential amplifier;

a plurality of first memory cells belonging to a first thermal history group which are selectively connected to the first bit line and a second plurality of memory cells belonging to a second thermal history group selectively connected to the second bit line;

wherein when reading data from the memory cells of the first thermal history group, the second bit line is isolated from the second memory cells and a first reference level is applied to the second bit line and further wherein when reading memory cells of the second group, the first bit line is isolated from the first group of memory cells and a second reference potential is applied to the first bit line.

5. A method of reading data from a non-volatile memory comprising:

providing first and second groups of memory cells wherein the first group of memory cells has a first thermal history and wherein the second group of memory cells has a second thermal history different from the first group;

reading memory cells of the first group with a differential amplifier having a first reference input and reading the cells of the second group with a second reference level.

* * * * *